(12) United States Patent
Benson et al.

(10) Patent No.: US 11,974,412 B2
(45) Date of Patent: Apr. 30, 2024

(54) SYSTEM AND METHOD FOR USING WASTE HEAT GENERATED BY DIGITAL PROCESSING COMPONENTS

(71) Applicant: Hunt Energy, L.L.C., Dallas, TX (US)

(72) Inventors: Todd W. Benson, Dallas, TX (US); Lovis Kauf, Eisenberg (DE); John-Paul Adams, Carrollton, TX (US); James A. Hancock, Dallas, TX (US); John S. Burkhart, Dallas, TX (US); James D. Franks, Louisville, KY (US); Hunter L. Hunt, Dallas, TX (US)

(73) Assignee: Hunt Energy, L.L.C., Dallas, TX (US)

( * ) Notice: Subject to any disclaimer, the term of this patent is extended or adjusted under 35 U.S.C. 154(b) by 0 days.

(21) Appl. No.: 18/233,797

(22) Filed: Aug. 14, 2023

(65) Prior Publication Data
US 2024/0057289 A1    Feb. 15, 2024

Related U.S. Application Data

(60) Provisional application No. 63/471,927, filed on Jun. 8, 2023, provisional application No. 63/459,408, filed
(Continued)

(51) Int. Cl.
*H05K 7/20* (2006.01)
*F24D 17/00* (2022.01)

(52) U.S. Cl.
CPC ..... *H05K 7/20281* (2013.01); *F24D 17/0005* (2013.01); *H05K 7/20236* (2013.01); *H05K 7/2039* (2013.01)

(58) Field of Classification Search
CPC ............. H05K 7/2039; H05K 7/20236; H05K 7/20281; F24D 17/0005
See application file for complete search history.

(56) References Cited

U.S. PATENT DOCUMENTS 9,605,872 B2    3/2017   Buescher et al.
10,001,326 B2   6/2018   Fu et al.
(Continued)

FOREIGN PATENT DOCUMENTS

CN      211258739 U    8/2020
GB        2576035 B    3/2021
(Continued)

OTHER PUBLICATIONS

Jamie Redman; The Wisemining Sator Boiler—A Product That Aims to Heat Your Home and Offset Costs by Mining Bitcoin; Mar. 19, 2021.
(Continued)

*Primary Examiner* — Vincent H Tran
(74) *Attorney, Agent, or Firm* — Law Office of Bill Naifeh; Timothy F. Bliss

(57) ABSTRACT

Provided are systems and methods for managing a processing load of a processing module and thermal energy produced by the processing load. In one example, a method includes identifying a hot water profile that contains usage information of hot water from a hot water tank that serves as a heat sink for the thermal energy. A determination may be made as to whether it is economically desirable to increase or decrease the processing load based on factors such as an economic value generated by the processing load, a cost of energy needed to support the processing load, and an economic value of the thermal energy transferred to the hot water tank based on the hot water profile. The processing load may be dynamically modulated by a local or remote controller in response to the economic desirability of increasing or decreasing the processing load as well as other possible parameters.

17 Claims, 43 Drawing Sheets

US 11,974,412 B2

Page 2

Related U.S. Application Data on Apr. 14, 2023, provisional application No. 63/398,199, filed on Aug. 15, 2022.

(56) References Cited

U.S. PATENT DOCUMENTS

| | | | |
|---|---|---|---|
| 10,485,144 B2 | 11/2019 | Orsini et al. | |
| 10,571,135 B2 | 2/2020 | Kreutzman | |
| 2004/0225648 A1* | 11/2004 | Ransom | G06Q 10/10 |
| 2011/0082601 A1* | 4/2011 | Pulley | F24D 19/1009 |
| | | | 237/2 A |
| 2011/0096503 A1* | 4/2011 | Avery | F25B 27/02 |
| | | | 62/476 |
| 2014/0303787 A1* | 10/2014 | Struckmeier | F24D 11/005 |
| | | | 700/276 |
| 2015/0043165 A1* | 2/2015 | Best | H05K 7/20836 |
| | | | 361/699 |
| 2016/0011618 A1* | 1/2016 | Janous | G05B 15/02 |
| | | | 700/291 |
| 2016/0123620 A1* | 5/2016 | Orsini | G05B 15/02 |
| | | | 700/276 |
| 2016/0204607 A1* | 7/2016 | Rogers, Jr. | H02J 3/28 |
| | | | 307/31 |
| 2017/0042068 A1* | 2/2017 | Orsini | G06F 1/20 |
| 2017/0276406 A1* | 9/2017 | Giusti | F24H 15/238 |
| 2019/0310691 A1 | 10/2019 | Ahn | |
| 2019/0338962 A1 | 11/2019 | Minnoy | |
| 2020/0015383 A1* | 1/2020 | Gao | H05K 7/20763 |
| 2021/0063024 A1* | 3/2021 | Humphrey | F24H 1/10 |
| 2021/0075252 A1* | 3/2021 | Caamano | H02J 3/04 |
| 2021/0192619 A1* | 6/2021 | Wu | G06F 1/20 |
| 2021/0287309 A1* | 9/2021 | Gebhardt | G05B 13/027 |
| 2022/0101456 A1* | 3/2022 | Schönfeld | F17D 5/06 |
| 2022/0149625 A1* | 5/2022 | Thyagaturu | H02J 3/008 |
| 2022/0214727 A1 | 7/2022 | Duchesne et al. | |
| 2022/0394880 A1* | 12/2022 | van Wijk | G05D 23/1931 |

FOREIGN PATENT DOCUMENTS

| | | |
|---|---|---|
| IT | 201800009370 A1 | 1/2019 |
| WO | 2019068916 A2 | 4/2019 |
| WO | 2022047576 A1 | 3/2022 |

OTHER PUBLICATIONS

International Search Report and Written Opinion, dated Oct. 31, 2023, by the ISA/US, in PCT Application No. PCT/US2023/030110.

Pădurean et al., "Heat Reuse Models for Liquid Cooled Data Centers integrated with District Heating"; BuildSys '21: Proceedings of the 8th ACM International Conference on Systems for Energy-Efficient Buildings, Cities, and Transportation; Nov. 2021; pp. 188-191; https://doi.org/10.1145/3486611.3486661; Published: Nov. 17, 2021.

* cited by examiner

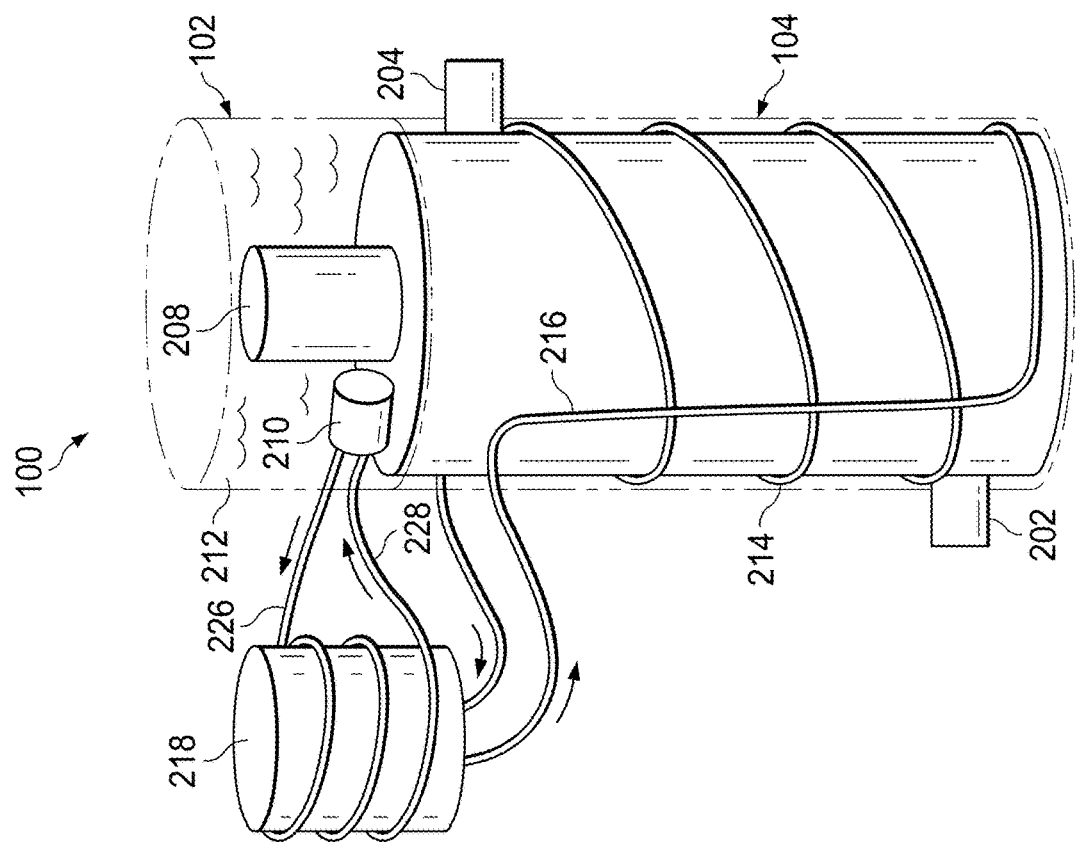
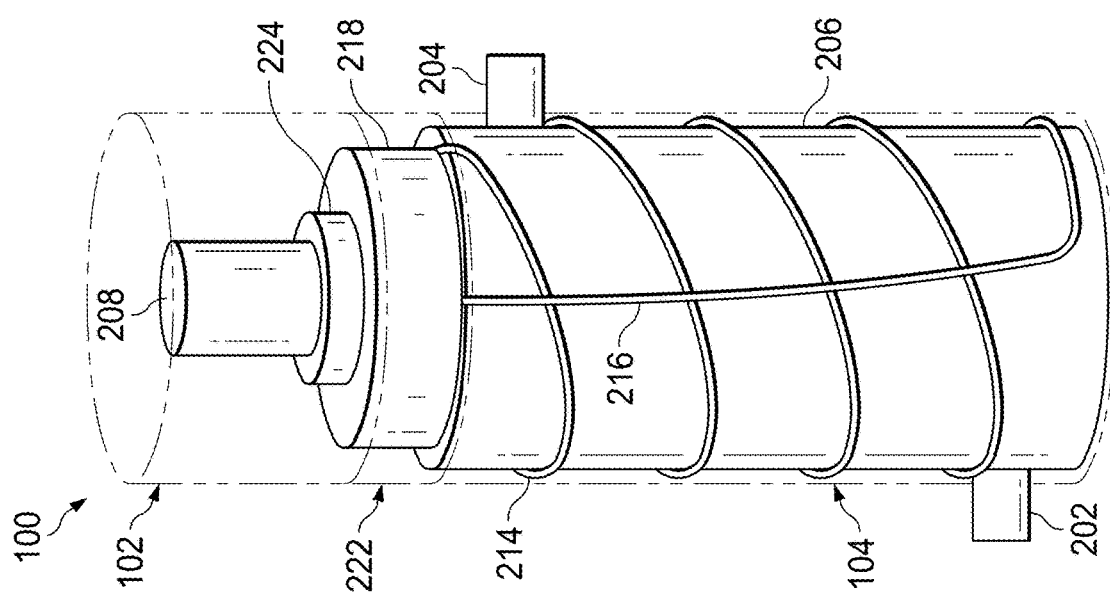
FIG. 2F
FIG. 2E

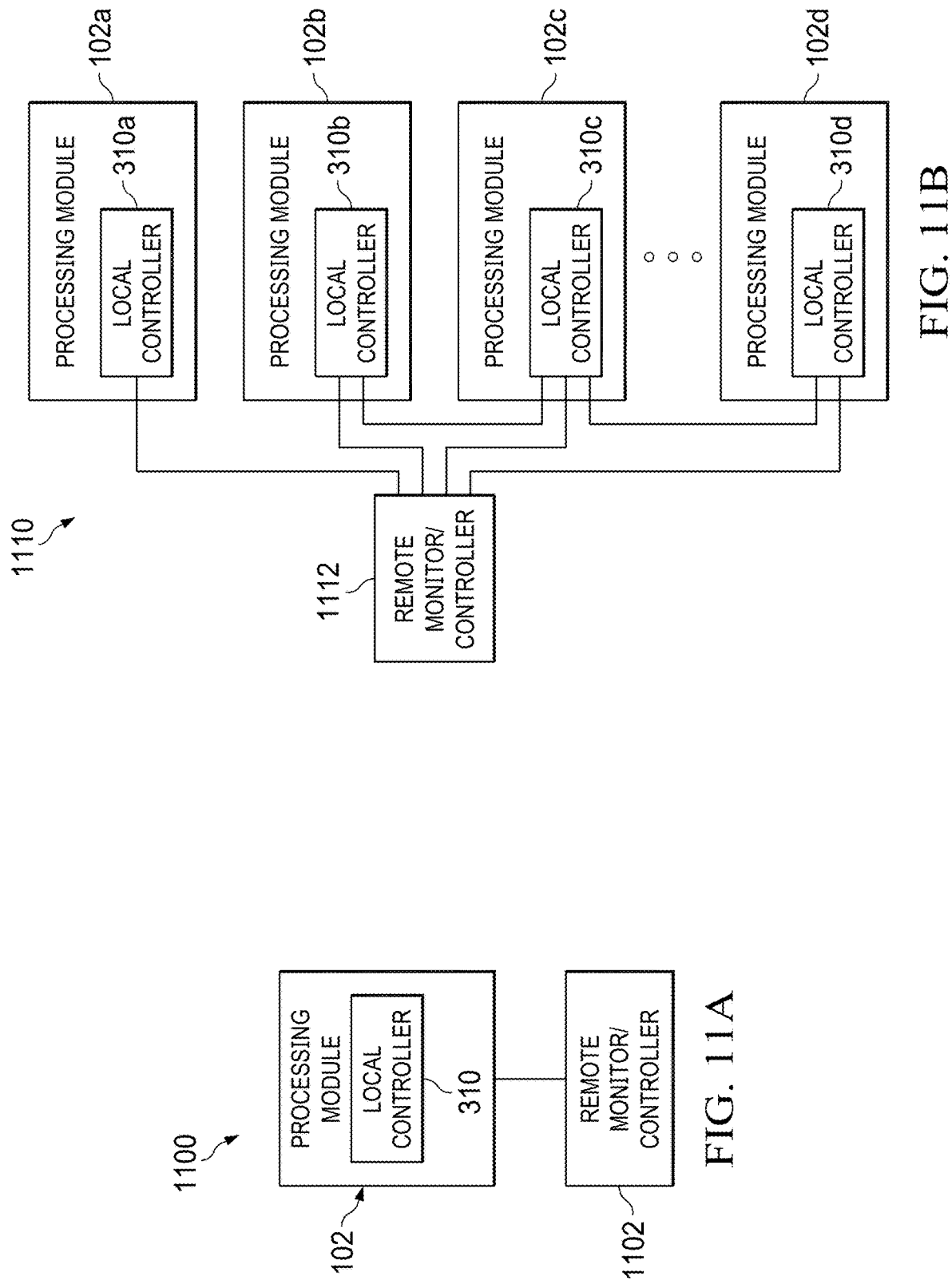

SYSTEM AND METHOD FOR USING WASTE HEAT GENERATED BY DIGITAL PROCESSING COMPONENTS

CLAIM OF PRIORITY AND CROSS-REFERENCE

This application claims the benefit of U.S. Provisional Patent Application No. 63/398,199, filed on Aug. 15, 2022, and entitled "SYSTEM AND METHOD FOR USING WASTE HEAT GENERATED BY DIGITAL PROCESSING COMPONENTS"; U.S. Provisional Patent Application No. 63/459,408, filed on Apr. 14, 2023, and entitled "SYSTEM AND METHOD FOR USING WASTE HEAT GENERATED BY DIGITAL PROCESSING COMPONENTS"; and U.S. Provisional Patent Application No. 63/471,927, filed on Jun. 8, 2023, and entitled "SYSTEM AND METHOD FOR USING WASTE HEAT GENERATED BY DIGITAL PROCESSING COMPONENTS," all of which are hereby incorporated by reference in their entirety.

This application is related to PCT Application No. PCT/US2023/030110, filed Aug. 11, 2023, and entitled "SYSTEM AND METHOD FOR USING WASTE HEAT GENERATED BY DIGITAL PROCESSING COMPONENTS."

TECHNICAL FIELD

This application is directed to the use of waste heat produced by digital processors.

BACKGROUND

The manner in which waste heat produced by digital components is frequently allowed to dissipate without use in domestic and commercial environments lacks efficiency. Accordingly, what is needed are a system and method that addresses these issues.

BRIEF DESCRIPTION OF THE DRAWINGS

For a more complete understanding, reference is now made to the following description taken in conjunction with the accompanying Drawings in which:

FIG. 11A illustrates one embodiment of an environment with a processing module and a remote monitor/controller;

FIG. 11B illustrates one embodiment of an environment with multiple processing modules and a remote monitor/controller;

DETAILED DESCRIPTION

Figure 1A:
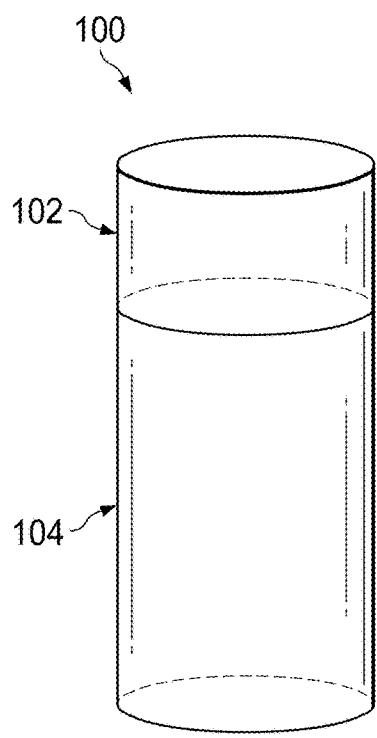
FIGS. 1A-1C illustrate embodiments of different configurations of a processing module relative to a hot water tank.

Referring now to the drawings, wherein like reference numbers are used herein to designate like elements throughout, the various views and embodiments of a system and method are illustrated and described, and other possible embodiments are described. The figures are not necessarily drawn to scale, and in some instances, the drawings have been exaggerated and/or simplified in places for illustrative purposes only. One of ordinary skill in the art will appreciate the many possible applications and variations based on the following examples of possible embodiments.

Hot water is used widely in domestic and commercial environments. For example, many residential, commercial, and public structures, including homes, apartment buildings, businesses, office complexes, schools, and industrial facilities, as well as large vehicles such as motorhomes, buses, trains, airplanes, boats, and ships, have hot water tanks that use heating elements to produce heated water and maintain that water at a set temperature for on demand use. While some hot water heaters maintain a relatively constant water temperature, temperature regulation may be available using, for example, timers that allow for scheduled time periods when the water's temperature is increased or allowed to decrease. However, even with time management, the hot water available from such hot water tanks is generally heated using only the tank's heating elements and so is based solely on converting power (e.g., electricity or gas) to hot water without providing further benefits or using excess heat from other systems. One possible additional source of heat is waste heat from other systems, such as systems using digital processors.

Digital processors, such as central processing units (CPUs), graphics processing units (GPUs), field-programmable gate arrays (FPGAs), and processors on ASICs (application-specific integrated circuits), may produce relatively large amounts of heat. The amount of heat produced by a given number of processors generally increases as the processing load increases, with heavier loads producing more heat than lighter loads. This heat is typically managed using heat sinks, cooling fans, liquid cooling systems, and/or other methods, with the heat dissipated into the environment. While some systems have attempted to use the heat from large server farms for heating sidewalks or buildings, such endeavors tend to be large scale and use whatever level of heat is generated in a relatively large area without providing effective management for the level of thermal output or managing the heat at a more discrete level.

Some consistently high load processing tasks may be performed in homes, both small and large businesses, and vehicles, such as the mining of cryptocurrencies, the rendering of computer graphics imagery (CGI), machine learning, artificial intelligence modeling and application (including the use of programs like ChatGPT), gaming, analytics, and other localized and distributed processing tasks. For example, a domestic user may use their home computer to mine cryptocurrency or perform CGI rendering while they are asleep or away at work, or may even have a dedicated system for performing such mining or rendering. This processing may produce a large amount of heat that is generally wasted. When the waste heat is viewed on a larger scale of many structures and vehicles, the amount of lost energy becomes significant. However, in order to capture and use such waste heat in hot water applications, a system is needed that is able to manage the interaction of processing loads with the production of hot water.

Referring to FIGS. 1A-2Q, various embodiments of a system 100 illustrate different configurations of a processing/compute module 102 (referred to herein simply as a processing module for purposes of convenience) coupled to a hot water tank 104 or a fluid conduit either directly or indirectly (e.g., via heat pumps, heat exchangers, and/or other fluid conduits). It is understood that while hot water tanks and inline systems may be used for purposes of example, the various embodiments described herein may be used with any type of fluid system (e.g., water system) that uses, produces, manages, provides, and/or is otherwise involved in the storage, transportation, and/or delivery of fluids such as water.

The processing module 102 is designed with one or more processors (not shown) used to perform processing tasks such as cryptocurrency mining, CGI rendering, machine learning, artificial intelligence modeling and application (including the use of programs like ChatGPT), gaming, analytics, general computing, and/or any other task(s). These processing tasks generate thermal energy that may be used to heat the water in the hot water tank 104. By using processing tasks that potentially generate profit and/or provide other benefits, either directly or indirectly, the cost of heating the water may be offset partially or entirely. Although profit-oriented processing tasks may be used herein for purposes of example, it is understood that the present disclosure may be applied to systems that are performing processing tasks that are not profit-oriented.

As will be described later in greater detail, a controller (not shown) may be used to manage the processing load of the processing module 102 based on a variety of factors. While the processing module 102 may be designed for, and dedicated to, a particular task, it is understood that the module may be designed and/or used for general purpose processing in some embodiments. Accordingly, many different configurations may be used for the internal and/or external configuration of the processing module 102. The controller may be any type of compute mechanism and may be a separate unit or built into the computing system that performs the processing tasks.

The processing module 102 may include various fluid connections (not shown) for coupling the processing module to the hot water tank 104 and/or to external pipes. An external shell of the processing module 102 may be made using insulating and/or conductive material(s) in order to thermally isolate the processing module 102 from the hot water tank 104 or to thermally couple the processing module 102 to the hot water tank 104. In some embodiments, additional material (not shown) may be used between the processing module 102 and the hot water tank 104 for thermal isolation or coupling.

The hot water tank 104 may have one or more regular heating elements and/or one or more smaller heating elements/coils (e.g., heating element 610 of FIGS. 6A-6F) controllable by the hot water tank 104 (e.g., as a conventional heating element) and/or by the processing module 102. For example, if the heat provided by the processing module 102 is not sufficient to provide hot water in a timely manner or at a temperature and/or in an amount needed, the heating element(s) 610 within the hot water tank 104 may be used to provide additional heat. It is understood that the hot water tank 104 may represent any type of fluid chamber, whether open or closed, including boilers and mixing chambers such as may be used in inline/circulation heating systems.

Enabling the processing module 102 to control the heating element 610 provides a hybrid solution. This hybrid solution may provide the processing module 102 with additional control when balancing the heat inputs to the hot water tank 104 provided by waste heat from the processing module 102 and heat from the heating element 610. This control extends the ability of the processing module 102 to take many different factors into account when managing the water's temperature. The control may be direct (e.g., the processing module 102 may directly turn the heating element 610 on and off) or may be indirect (e.g., the processing module 102 may interact directly with a thermostat of the hot water tank 104 or may communicate with a home automation system in order to control the heating element 610).

While the present disclosure may describe various embodiments using a processing module with a relatively small hot water heater, such as those found in homes, it is understood that the systems and processes described herein may be implemented in commercial environments as well. Furthermore, while the present disclosure may use processing tasks that maintain relatively consistent high loads for purposes of example, such as cryptocurrency mining, it is understood that the systems and processes described herein may be applied to any processing environment that generates and/or uses heat, regardless of the amount of heat being generated. In addition, the heat captured may be used in many different ways and is not limited to heating water.

While the present disclosure frequently uses hot water tanks as examples, the systems and methods described herein may be used with systems and devices such as heating, ventilation, and air conditioning (HVAC) systems, and such use may be an alternative to hot water tanks or may be combined with the use of hot water tanks. In addition, while the present disclosure may frequently describe thermal output in terms of hot water, it is understood that other fluids, such as heated air, may be provided as an output. Generally, any system or device that can provide a thermal differential that enables the use and/or disposal of heat from processing tasks may be used. Accordingly, the present disclosure is not intended to be limited to hot water tanks and the production of hot water, but may be implemented with respect to many different systems and devices.

Referring specifically to FIG. 1A, a configuration is illustrated where the processing module 102 is designed as part of the hot water tank 104 or may be designed as a device that can be added to an existing hot water tank. When integrated during manufacturing, a basic shell may be provided that allows processing components to be added and removed later without requiring changes to the hot water tank 104. When designed as a modular addon, the processing module 102 may be provided with an exterior shell that is shaped to fit on top of the hot water tank 104. The addon may be designed to allow processing components to be added and removed. The cross-sectional fit may be relatively similar to the size of the water tank 104 as shown in FIG. 1A, or may be larger or smaller than the cross section of the hot water tank 104.

Figure 1B:
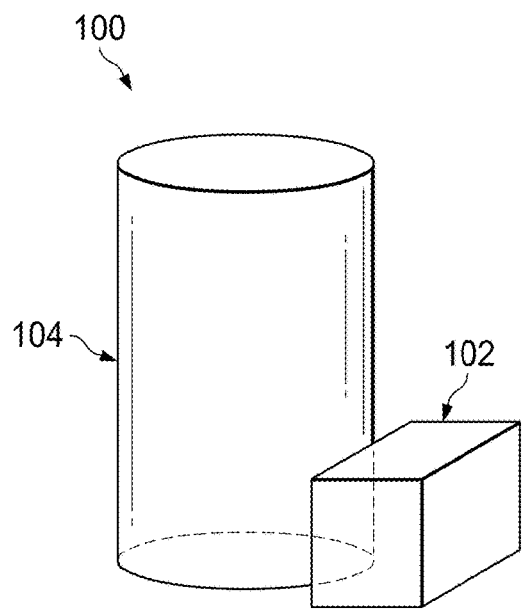

Referring specifically to FIG. 1B, a configuration is illustrated where the processing module 102 is designed as a standalone device. It is understood that the processing module 102 may come in many different sizes and shapes. The processing module 102 may be freestanding or may be coupled to the hot water tank 104 or a wall. This may provide a high level of installation flexibility, as the processing module 102 can be positioned wherever there is room, and provided hose inlets and outlets may be used to couple it to the hot water tank 104 and/or external pipes as needed. As a standalone design may have many different form factors, different versions may be manufactured for different installation environments. This approach may also provide a high level of scalability as the size may be increased or decreased as needed to account for factors such as the internal components desired, the volume of the hot water tank, and/or the amount of space available for installation.

Figure 1C:
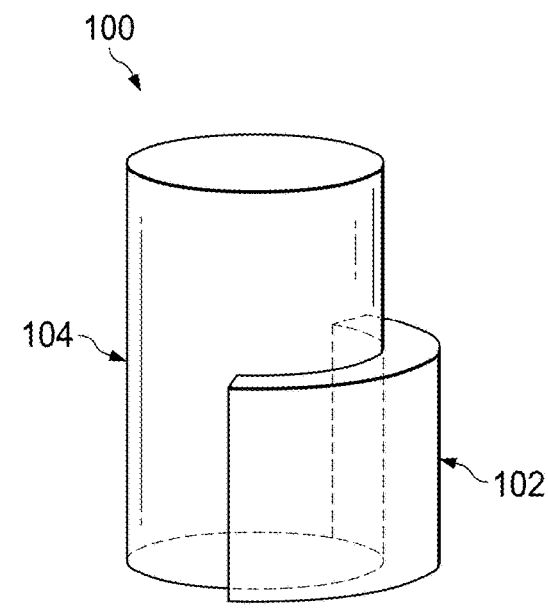

Referring specifically to FIG. 1C, a configuration is illustrated where the processing module 102 may be designed to fit around at least a portion of the hot water tank 104. For example, the processing module 102 may be designed with an exterior shell that is shaped to wrap around the hot water tank. The exterior shell of the processing module 102 may be rigid or may be designed with flexibility that enables the processing module to wrap around hot water tanks of different sizes and/or shapes. For example, the processing module 102 may be segmented, with each segment able to pivot relative to the neighboring segments. Different exterior shells, whether rigid or flexible, may be available to fit different hot water tank sizes and shapes.

Figure 2A:
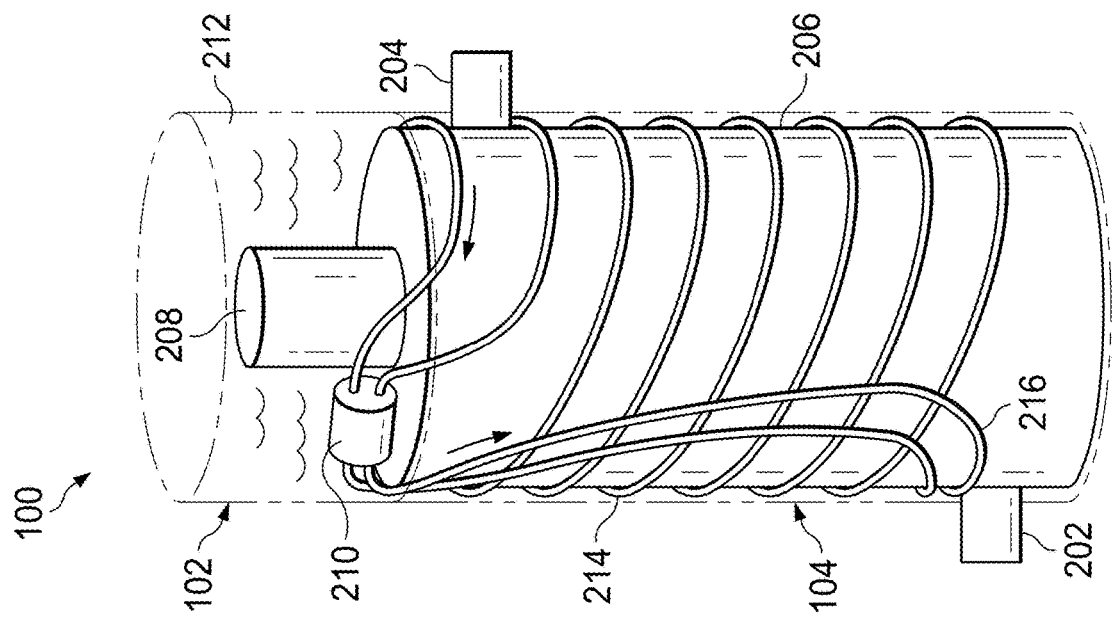
FIGS. 2A-2Q illustrate embodiments of different configurations of a processing module in various environments.

Referring specifically to FIG. 2A, a more detailed embodiment of the configuration of FIG. 1A is illustrated. In the present example, the hot water tank 104 includes an interior tank 206 that may be coupled to a cold water inlet 202 and a hot water outlet 204. The processing module 102 may include a processor bank 208 that contains one or more processors and a circulation pump 210, both of which may be submerged in a dielectric fluid 212. The pump 210 pumps heated dielectric fluid through a fluid conduit 214/216 (e.g., a tube or coil) that is wrapped around the interior tank 206. For purposes of example, as indicated by flow arrows, the fluid conduit is illustrated with a portion 216 that serves as a path for hotter dielectric fluid downwards and a portion 214 that serves as a return path for cooler dielectric fluid upwards as the thermal energy in the dielectric fluid is transferred to water in the interior tank 206. It is understood that the portions 214 and 216 may be sections of a single tube or coil, and that portions of the fluid conduit may be positioned so as not to be in direct contact with other portions. For example, the portion 216 may be positioned away from the interior tank 206 to avoid contact with the portion 204.

It is further understood that, in the embodiments described herein, flow may occur in either direction and is not limited to any one direction. Accordingly, arrows may simply indicate that flow may occur and may not in themselves indicate a particular direction of flow. Furthermore, multiple fluid conduits may be used. Fluid conduits may be arranged in many different ways, may have many different diameters, may wrap around the hot water tank any number of times, and/or may be made of many different materials, with inflow and outflow openings positioned anywhere relative to the hot water tank 104 or other components.

Figure 2B:
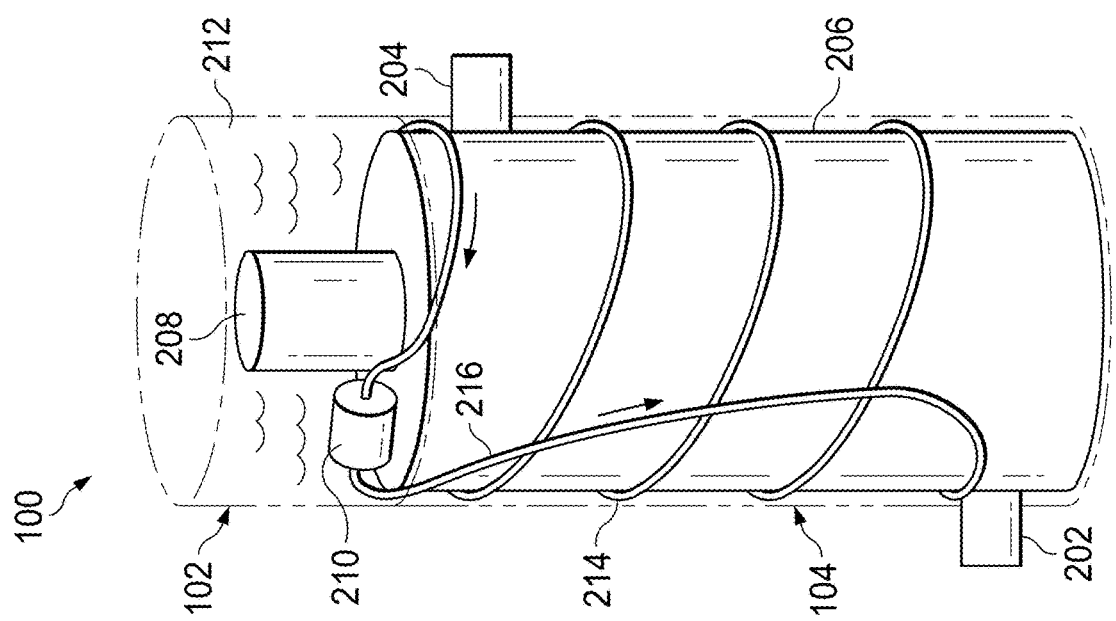

Referring specifically to FIG. 2B, an alternative embodiment of the configuration of FIG. 2A is illustrated. In the present example, a second fluid conduit is present in addition to the fluid conduit formed by the portions 214 and 216.

Figure 2C:
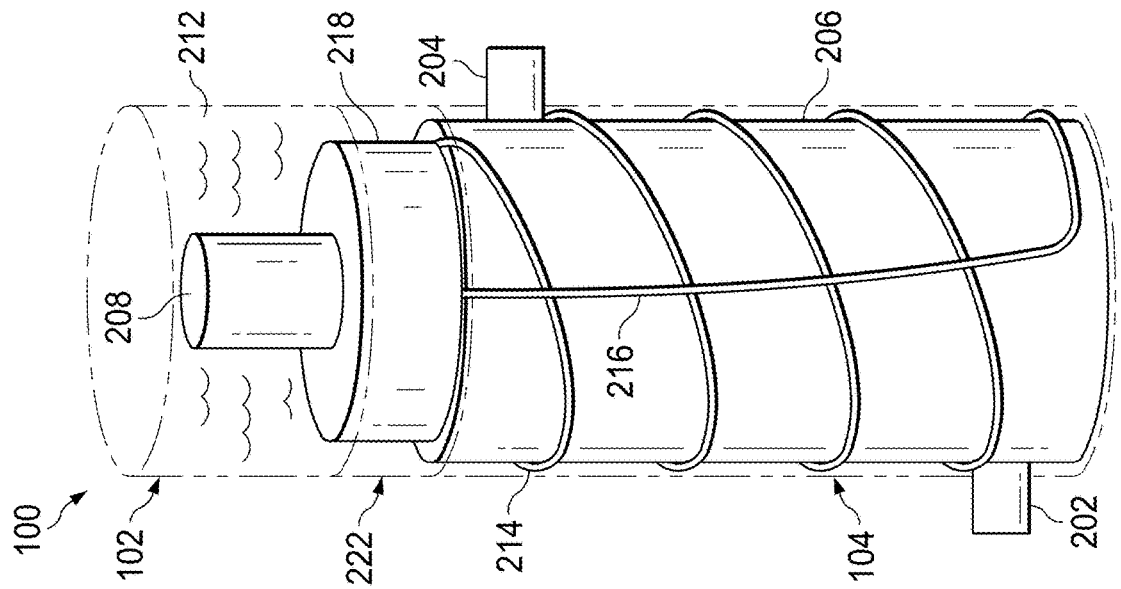

Referring specifically to FIG. 2C, an alternative embodiment of the configuration of FIG. 2A is illustrated. In the present example, a heat pump 218 may be thermally coupled to the processor module 102 using fins 220. The fins 220 may be inside the processing module 102 (e.g., in direct contact with the dielectric fluid 212), or may fit into cavities formed in the processing module's case to receive the fins without direct contact between the fins and the dielectric fluid. In the present example, the heat pump 218 is in a section 222 positioned between the processing module 102 and the hot water tank 104. Fluid from the heat pump 218 moves through fluid conduit 214/216 to provide heat to the hot water tank 104. In some embodiments, the heat pump 218 may be part of the processing module 102. It is understood that one or more pumps and/or other circulation devices may be present within the processing module 102 of FIG. 2C and other embodiments described in the present disclosure in order to circulate the dielectric fluid and/or other fluids within and/or around the processing module.

Figure 2D:
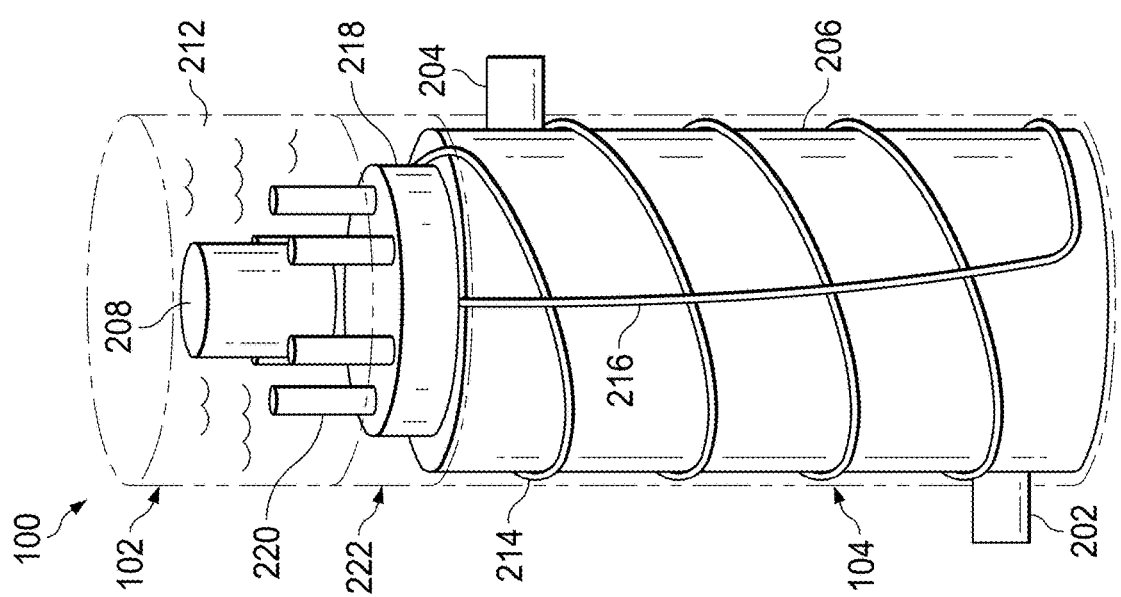

Referring specifically to FIG. 2D, an alternative embodiment of the configuration of FIG. 2C is illustrated. In the present example, the heat pump 218 is located between the processing module 102 and the hot water tank 104, and may be thermally coupled to the processing module and/or the hot water tank without the use of fins. For example, the processor bank 208 may be placed at or near the bottom of the processing module 102 to minimize the distance between the processor bank and the heat pump 218 and to thereby enhance the transfer of heat from the processing module to the heat pump.

Referring specifically to FIG. 2E, an alternative embodiment of the configuration of FIG. 2C is illustrated. In the present example, a heat exchanger 224 is positioned between the processor bank 208 and the heat pump 218. As shown, no dielectric fluid is present in the processing module 102, but it is understood that such fluid may be present in other embodiments. Instead, air and/or other types of fluids and/or conducting materials may be used to transfer heat away from the processor bank 208. The heat exchanger 224 may remove heat from the processor bank 208 and transfer that heat to the heat pump 218.

Referring specifically to FIG. 2F, an alternative embodiment of the configuration of FIG. 2C is illustrated. In the present example, the heat pump 218 is not immediately adjacent to the processing module 102. The processing module 102 transfers heat to the heat pump 218 via fluid(s) in a fluid conduit 226, and receives cooled fluid(s) via a fluid conduit 228. It is understood that fluid conduits 226 and 228 may form a single fluid conduit.

Figure 2H:
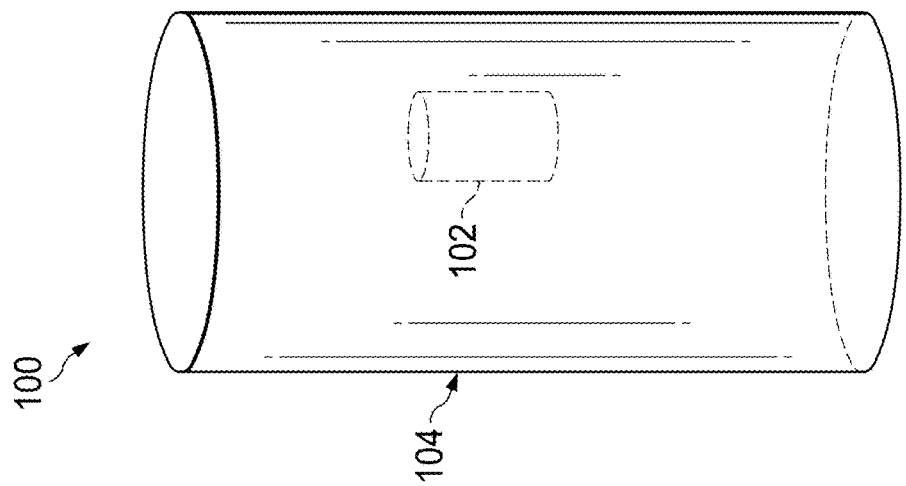
Figure 2G:
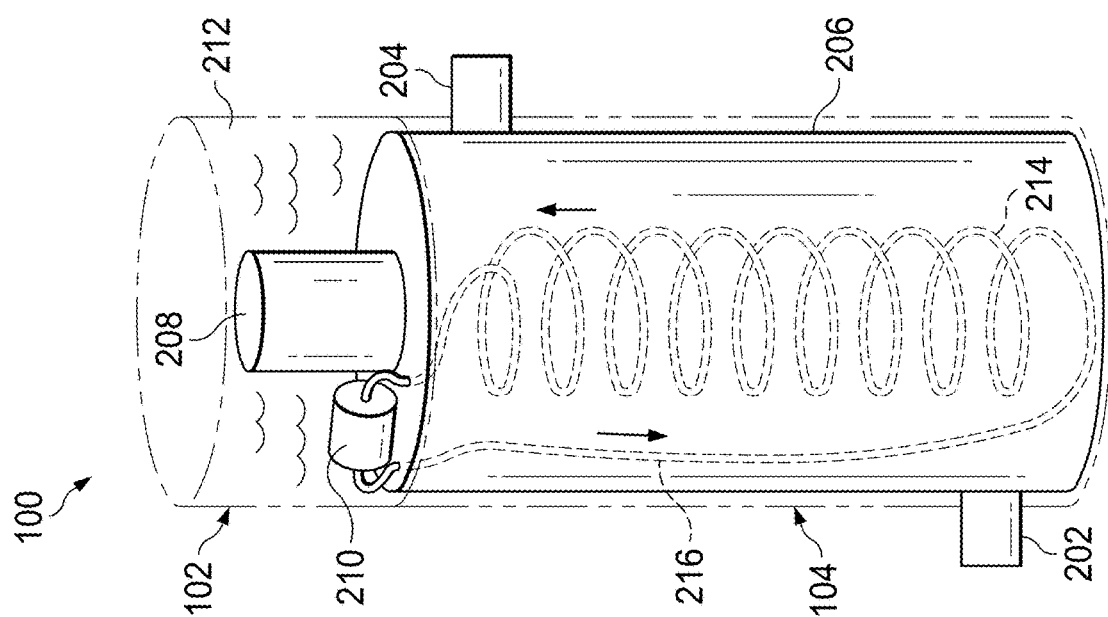

Referring specifically to FIG. 2G, an alternative embodiment of the configuration of FIG. 2A is illustrated. In the present example, rather than wrapping the fluid conduit portion 214 around the interior tank 206, the fluid conduit portion is positioned within the interior tank.

Referring specifically to FIG. 2H, an alternative embodiment of the configuration of FIG. 2A is illustrated. In the present example, the processing module 102 may be configured as a waterproof capsule that is inserted into the hot water tank 104. The capsule may be used to provide the processing module 102 as a static system that is sealed and does not need a pump. In other embodiments, the capsule may have channels and/or other openings that allow water to circulate within designated areas of the capsule.

Figure 2I:
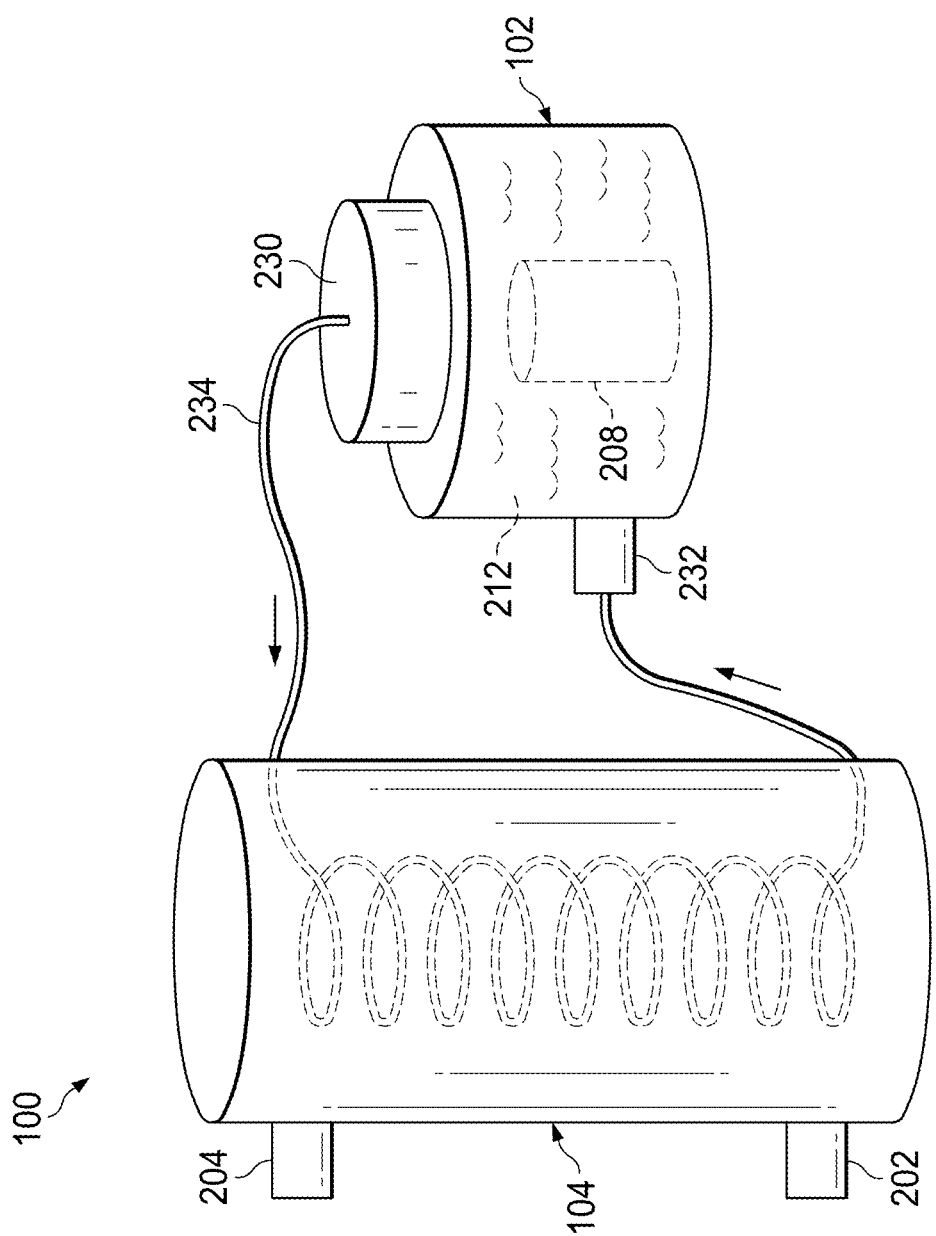

Referring specifically to FIG. 2I, one embodiment illustrates the processing module 102 being used as a condenser/evaporator for a heat pump system that includes a compressor 230 and an expansion valve 232. In the present example, the dielectric fluid 212 may serve both as a cooling fluid for the processor bank 208 and as a fluid for the heat exchanger system. In this embodiment, the fluid 212 may pass out of the processing module 102, through compressor 230, and into a fluid conduit 234. The fluid conduit 234 may couple to the hot water tank 104 or may be placed inside the tank as shown or around the tank (e.g., as in FIG. 2A). The fluid conduit 234 returns the fluid 212 to the processing module 102 via the expansion valve 232. It is understood that the processing module 102, compressor 230, expansion valve 232, and/or other heat exchanger components may be arranged in many different ways, including as a single unit. In some embodiments, the compressor 230 and/or the expansion valve 232 may be separated from the processing module 102.

Figure 2J:
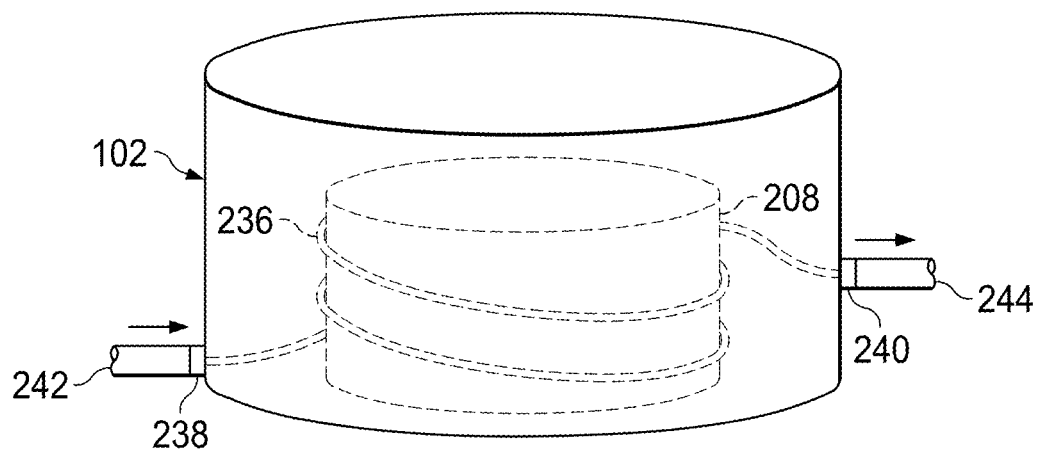

Referring to FIG. 2J, one embodiment of an alternate configuration of the processing module 102 of FIG. 2A is illustrated. In the present example, rather than providing heat to a hot water tank, the processing module 102 provides heat directly to an internal fluid conduit 236. The fluid conduit 236 receives heat from the processor bank 208. The fluid conduit 236 is coupled to an incoming fluid conduit 242 (e.g., a pipe or hose) via a connector 238. The fluid conduit 236 is also coupled to an outgoing fluid conduit 244 (e.g., a pipe or hose) via a connector 240.

This configuration enables the processing module 102 to provide heat directly to the fluid in the pipe 242/244 in a manner that allows for instant hot water. This and other tankless configurations may be referred to herein as being "inline." In the present disclosure, the term "inline" refers to any tankless implementation that provides instant/on demand heated fluid by heating the fluid as it flows through the system, rather than by preheating the fluid and storing it in a tank or other reservoir. The fluid being heated generally flows through such inline systems continuously until demand ends and the water is turned off. Such inline systems may be used in addition to, or as an alternative to, a system that uses a tank or other reservoir.

Figure 2K:
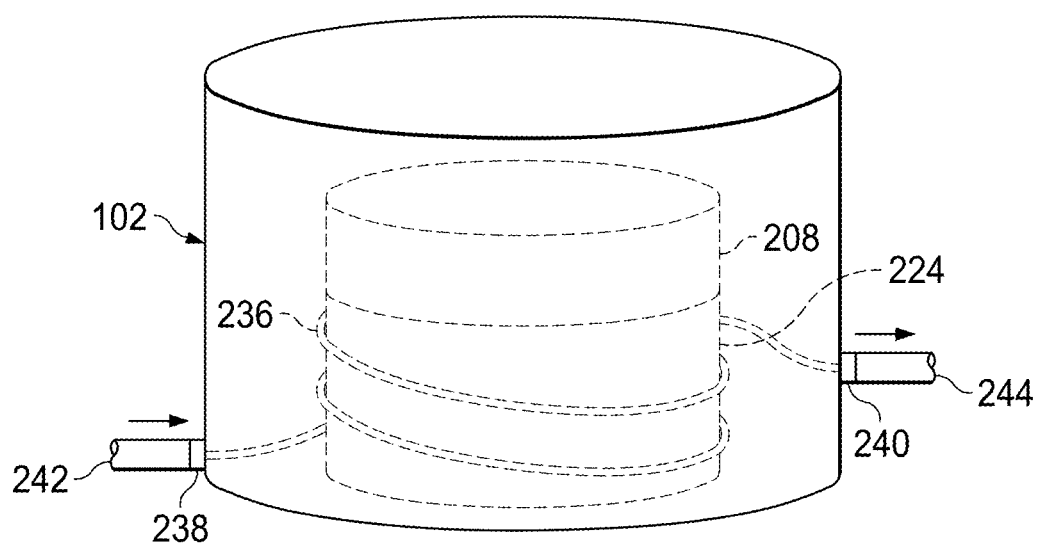

Referring specifically to FIG. 2K, an alternative embodiment of the configuration of FIG. 2J is illustrated. In the present example, the fluid conduit 236 receives heat from a heat exchanger 224, rather than directly from the processor bank 208.

Figure 2L:
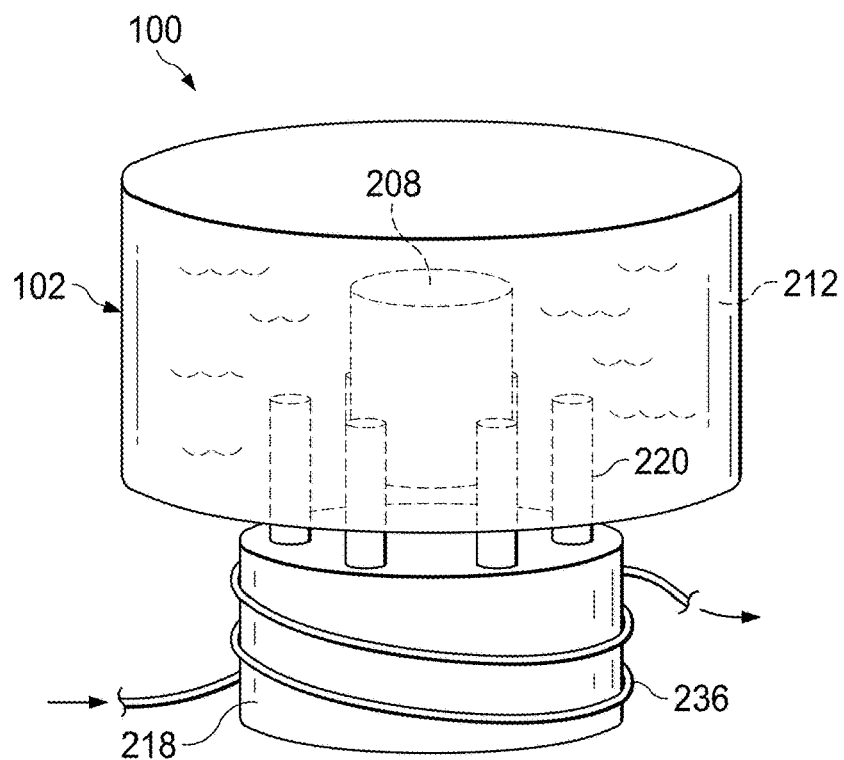

Referring specifically to FIG. 2L, an alternative embodiment of the configuration of FIG. 2J is illustrated. In the present example, the fluid conduit 236 receives heat from a heat pump 218, which has fins 220 positioned within the dielectric fluid 212 to aid in heat transfer.

Figure 2M:
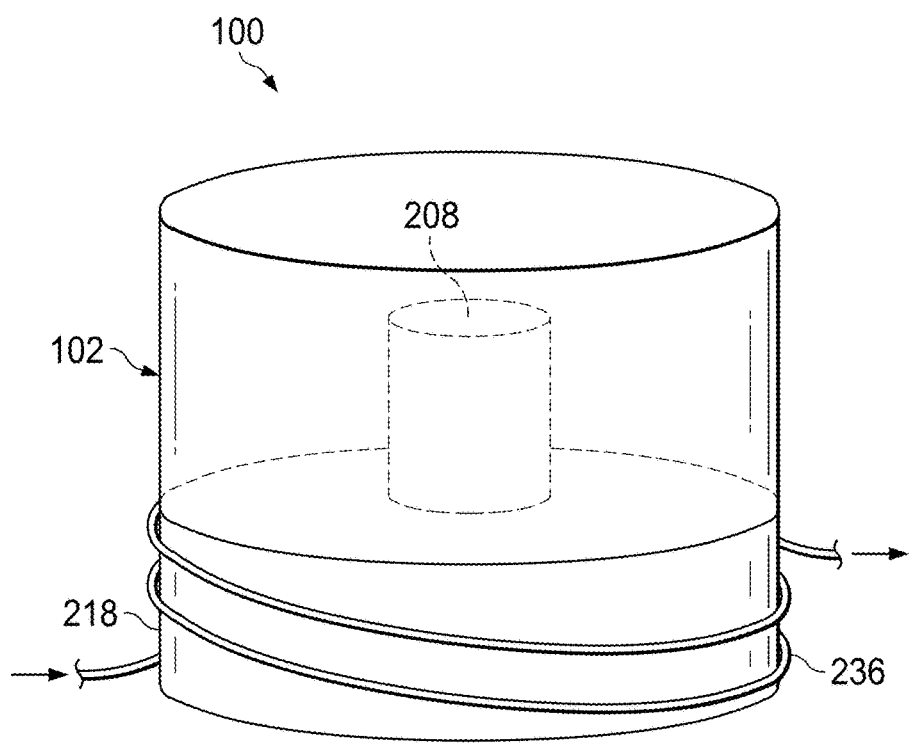

Referring specifically to FIG. 2M, an alternative embodiment of the configuration of FIG. 2L is illustrated. In the present example, the fluid conduit 236 receives heat from the heat pump 218, which is positioned substantially adjacent and/or otherwise thermally coupled to the processor bank 208 and does not have fins in the dielectric fluid 212.

Figure 2N:
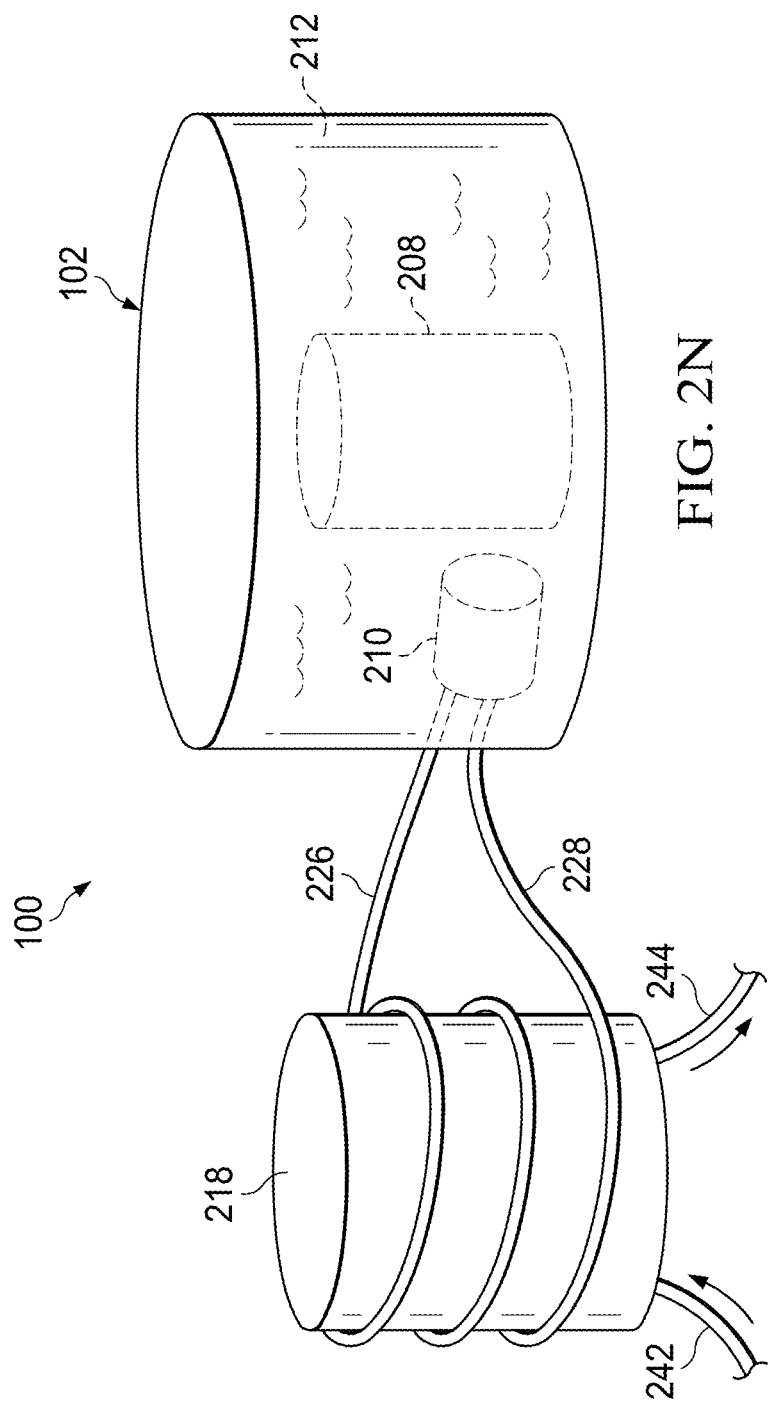

Referring specifically to FIG. 2N, an alternative embodiment of the configuration of FIG. 2J is illustrated. In the present example, the processing module 102 uses a pump 210 to move heated fluid to heat pump 218 via fluid conduit 226, and to receive cooled fluid via fluid conduit 228. The heat pump 218 may use the transferred heat to directly heat the fluid passing through fluid conduit 242/244.

Figure 2O:
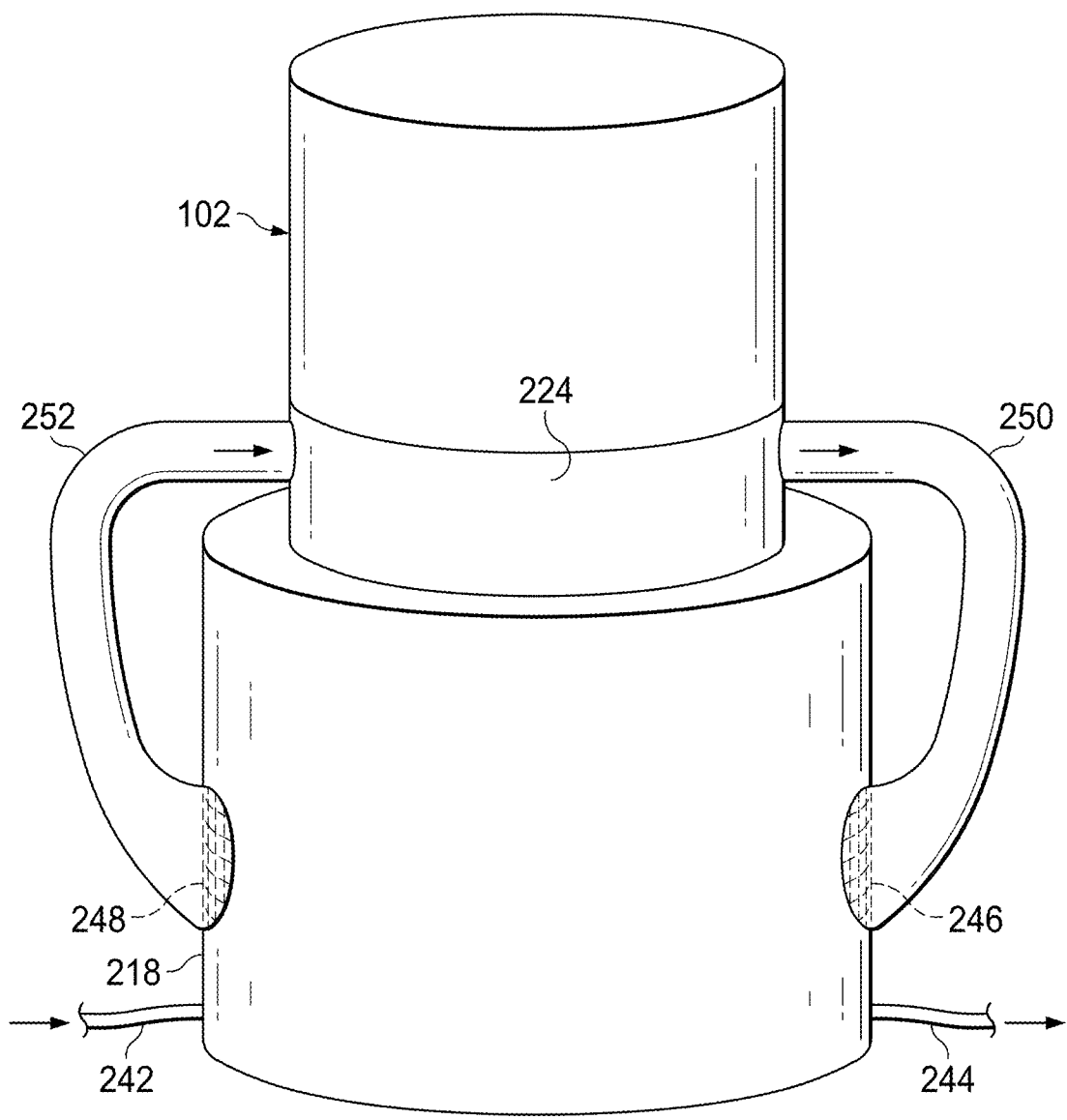

Referring specifically to FIG. 2O, an alternative embodiment of the configuration of FIG. 2J is illustrated. In the present example, a heat pump 218 may be configured to pull in heated air via a vent 246, remove the heat from the air in order to transfer the heat to a fluid (e.g., fluid in a hot water tank or a pipe 242/244), and then exhaust the cooled air via a vent 248. A heat exchanger 224 may be used to pull heat from the processing bank 208. Heated fluid (e.g., air) may be provided by the heat exchanger 224 to the vent 246 via a fluid conduit 250, and cooled air may be received by the heat exchanger from the vent 248 via a fluid conduit 252. This configuration may be useful in adapting the processing module 102 to existing heat pump installations.

Figure 2P:
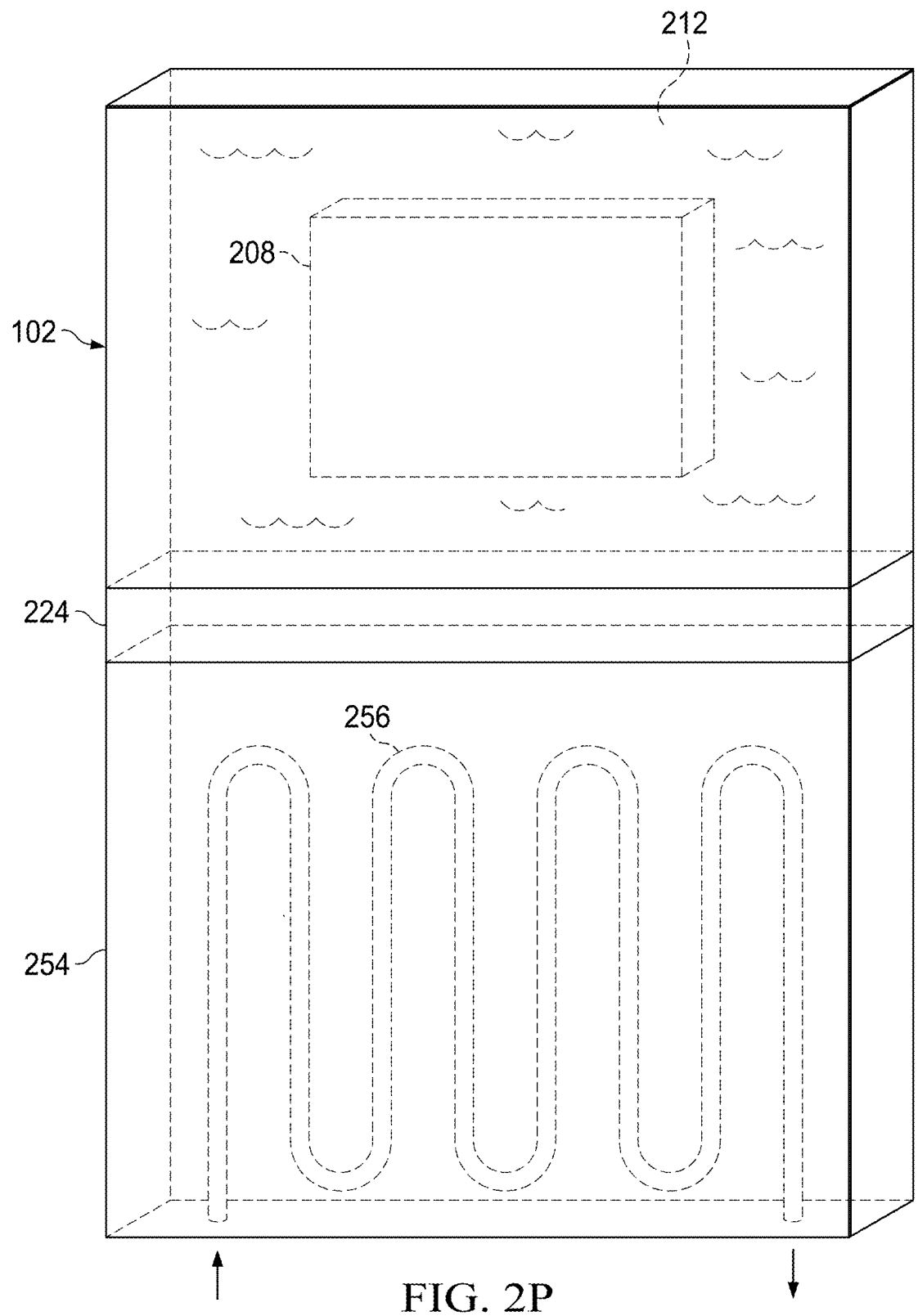

Referring specifically to FIG. 2P, an alternative embodiment of the configuration of FIG. 2J is illustrated. In the present example, an inline or instant heating system 254 is configured to heat water as the water passes through a fluid conduit 256. Heat may be transferred from the processing module 102 to the inline heating system 254 via a heat exchanger 224.

Figure 2Q:
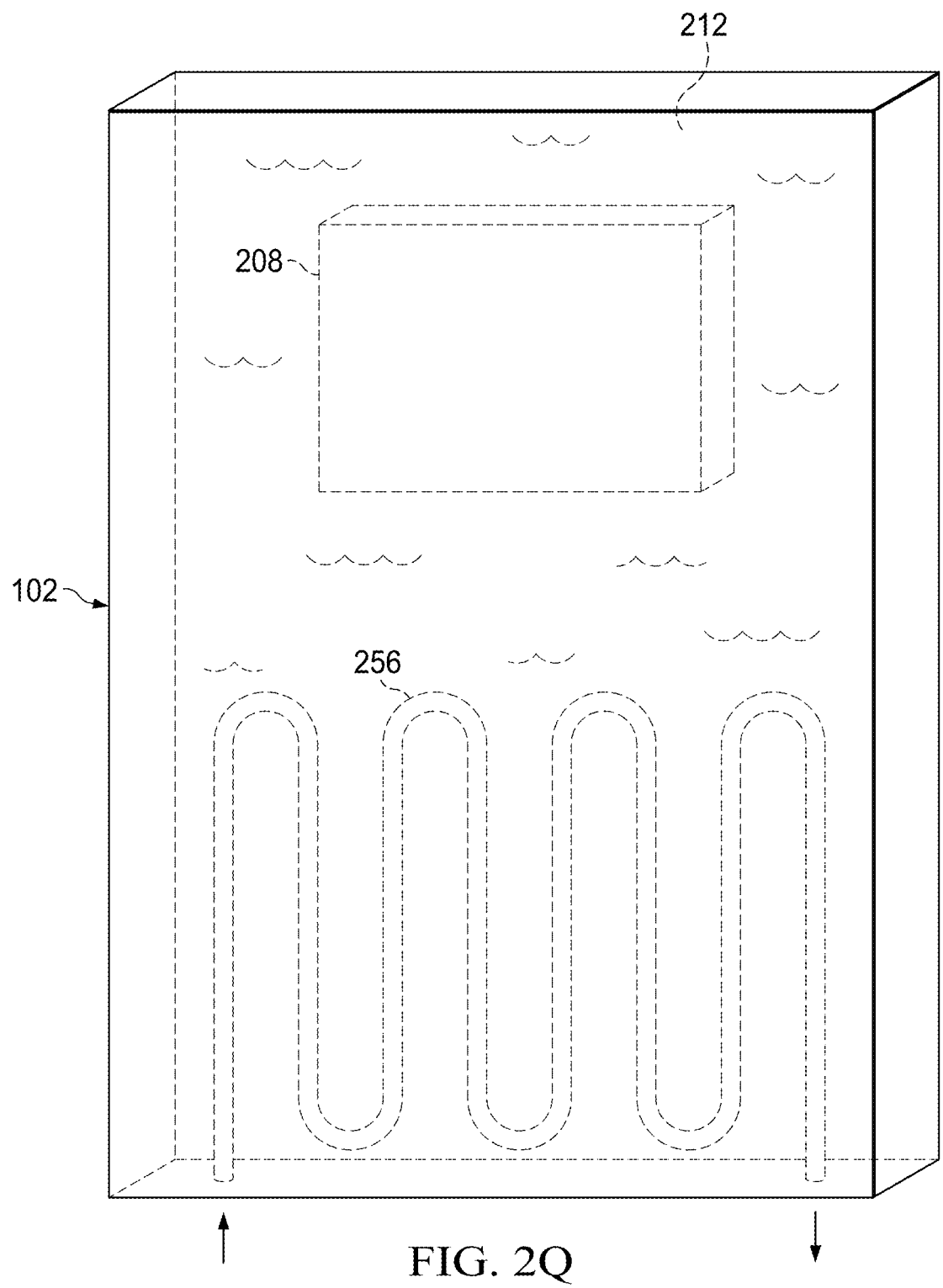

Referring specifically to FIG. 2Q, an alternative embodiment of the configuration of FIG. 2P is illustrated. In the present example, the fluid conduit 256 is part of the processing module 102 and is exposed directly to the dielectric fluid 212, enabling heat to be transferred from the processing module 102 to the fluid conduit in a more direct manner.

Referring generally to FIGS. 1A-2Q, it is understood that many different configurations may be used to transfer heat from the processing module 102 and/or processing bank 208. For example, while the embodiments of FIGS. 2P and 2Q may be used to provide heat as inline hot water systems, it is understood that each embodiment may be adapted for use with a hot water tank and/or other fluid reservoirs as well. Similarly, other embodiments illustrated with a hot water tank 104 may adapted for use as inline systems and/or for use with other fluid reservoirs.

Accordingly, components illustrated in the embodiments of FIGS. 1A-2Q may be combined in many different ways, and aspects of one embodiment may be combined with those of other embodiments. For example, heat exchangers may be used in embodiments that do not explicitly illustrate such heat exchangers or removed from embodiments where shown, dielectric fluid may be added, removed, and/or replaced or combined with other fluids, fluid conduits may be moved, shortened, lengthened, and/or otherwise modified, heat pumps and inline heating systems may be swapped or used together, and many other modifications may be made, and such modifications are within the scope of the present disclosure. Accordingly, various modifications may be made to the illustrated systems and/or components in order to deploy them in a particular environment or for a particular purpose, including modifications needed to prepare a system for use with existing hot water tanks, heat pumps, inline hot water systems, fluid reservoirs, and/or for other purposes and/or for use with other external systems and components.

Figure 3A:
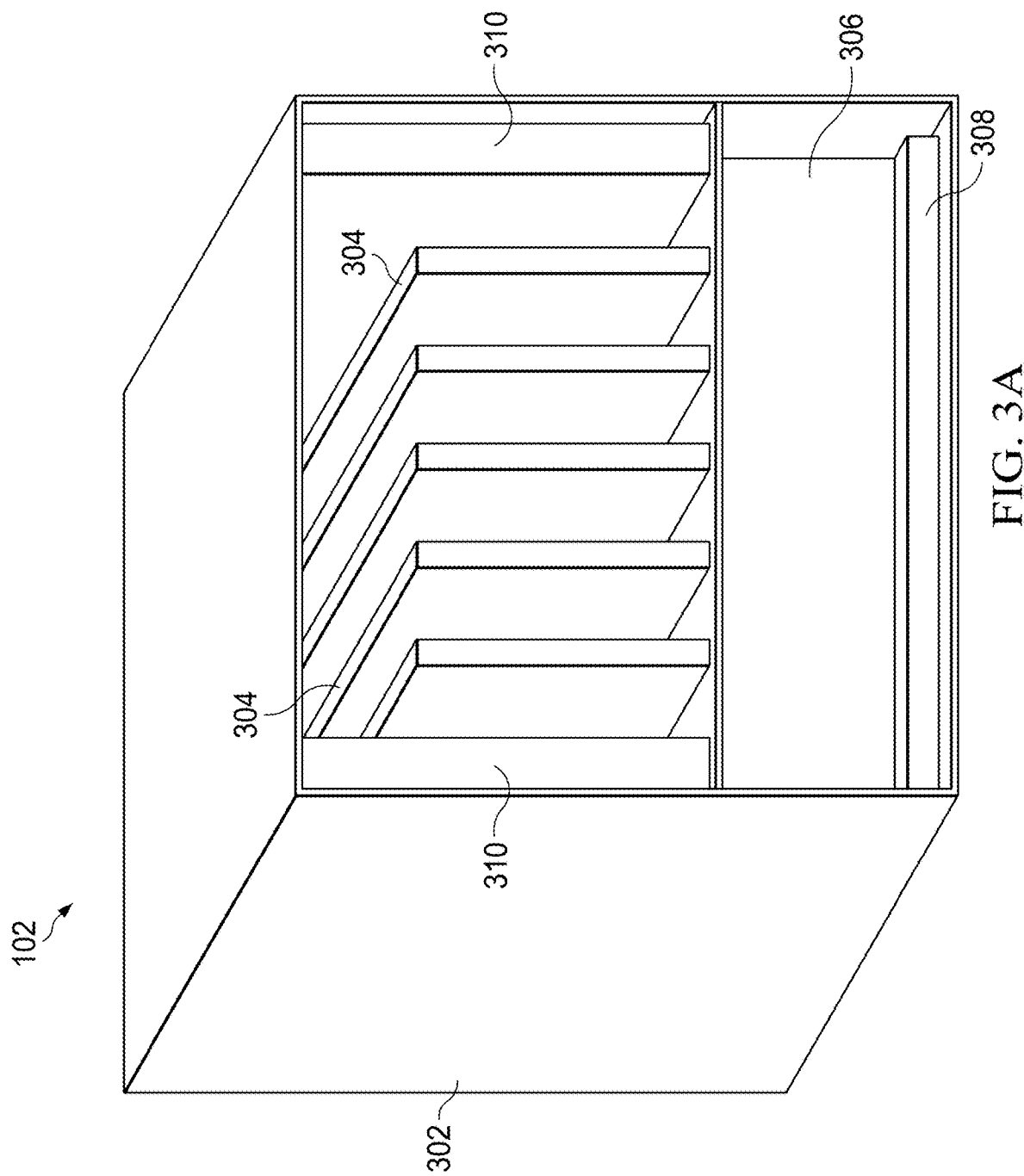
FIGS. 3A and 3B illustrate one embodiment of a processing module.
Figure 3B:
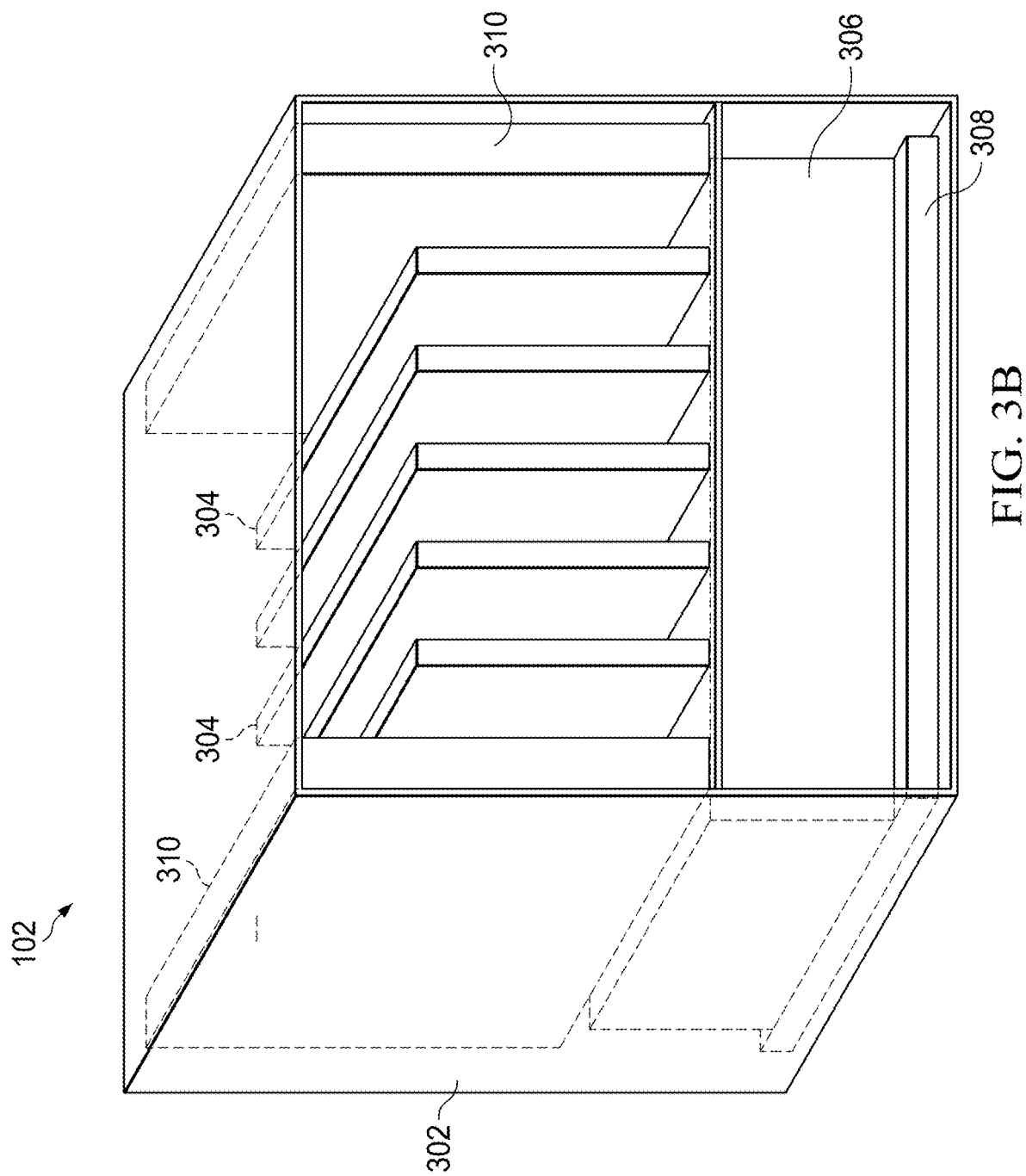

Referring to FIGS. 3A and 3B, one embodiment of a processing module 102 is illustrated with a portion of the case removed to allow a view of the interior. The processing module 102 includes a case 302 that contains one or more processors and/or cards 304. In the present example, the case 302 is rectangular and may be similar to that shown in FIG. 1B. In some embodiments, processors may be mounted on cards and inserted into slots (not shown). In other embodiments, processors may be directly inserted into empty sockets. For example, a motherboard may be mounted in the case 302, and the motherboard may provide one or more processor sockets. The particular configuration of the interior of the case 302 and how the processors are mounted may vary depending on many factors, such as the form factor of the case and/or motherboard, the number and configuration of processors and/or cards, the type and configuration of cooling components features (e.g., heat sinks, fans, and/or fluid (liquid or gas) cooling components), and/or the type and configuration of thermal transfer components (e.g., heat exchangers).

In some embodiments, processors and/or cards 304 may be removable in order to customize the processing module 102, and to allow the processing module to be more easily upgraded and repaired. For example, if the components 304 are cards such as GPU cards or ASICs, a card may be removed from its slot and replaced simply by inserting another compatible card into the slot. This enables the processing module 102 to be reconfigured for different purposes without needing to replace the entire module. For example, some components may be more effective for mining cryptocurrency, while other components may be more effective at CGI rendering. By removing components that are less effective for a desired purposes and replacing them with more effective components, the processing module 102 may be configured for better performance for that task.

The processing module 102 may be designed and/or constructed as a single unit or may be modular. The modular aspect may be physical and/or may be viewed from a processing perspective. Physically, the processing module 102 may be modular to allow sections to be added and/or removed, rather than single components. For example, additional processing capacity may be added to the processing module 102 by coupling an additional module to the processing module 102. The additional module may contain components such as one or more processors, additional memory, and/or other electronic circuitry configured to provide the desired functionality to the processing module.

From a processing perspective, the processing module 102 may be configured to divide the available processing power into sets (e.g., groups of processors) that can be activated and deactivated as needed. Additional processing sets may then be brought online or taken offline based on the amount of processing required at the time. Additionally, or alternatively, the available processing power may be divided into levels (e.g., percentages of total available processing power) that can be activated or deactivated as needed. Single processors, sets of processors, and/or all available processors may be run in different power modes to regulate the amount of processing and/or energy consumption needed for those processors.

Such allocations of processing power may provide scalability and enable the processing module 102 to manage different processing levels for different purposes. For example, the processing module 102 may be configured with different modes of operation, with each mode associated with a different level of processing capability. A low power mode may provide minimal processing capability in conjunction with minimal heat production. A higher-level mode may provide additional processing capability with increased heat production. Such mode-based operations may be defined in many different ways, including the use of custom modes, to enable the processing module 102 to scale processing usage in a predefined manner.

The case 302 may also include one or more cooling components 306 and heat exchangers 308. Cooling components 306 may include heat sinks, fans, and/or fluid cooling components. The type and configuration of the cooling components 306 may depend on many different factors, including the cooling needs of the processors, the amount of available space, and/or the type of heat exchanger and/or other components designed to transfer heat to the hot water tank 104. The heat exchanger 308 and cooling components 306 may be integrated into a single system or may be two separate systems designed to interact in order to pull heat from the processors and transfer it to the hot water tank. Accordingly, the components 306 and 308 may be a single component in some embodiments.

Additional components 310 may be present in the case 302. The components 310 may represent power supplies, network interfaces, random access memory (RAM), non-volatile memory (e.g., hard drives), and/or other components of the processor module 102, including part of the heat exchanger 308 and cooling components 306. One or more of the additional components 310 (e.g., a local controller) may be used to control the processing module 102, including the timing of higher and lower intensity computing periods, and how such periods are balanced with the requirements for hot water. In some embodiments, as will be discussed below in greater detail, the processing module 102 may be part of a distributed system with other processing modules, and the control aspect may be remotely managed from a system-wide perspective rather than as a standalone module. Some or all of the processing power for the local controller 310 may be physically separate from the processors 304 or the functionality of the local controller may be executed by the processors 304.

The local controller 310 may regulate various aspects of the processing module's operation in addition to the processing load. For example, the local controller 310 may provide for the management of cooling (e.g., fan and pumps speeds), the provision of a graphical user interface (GUI), the control of water intake and exhaust (if applicable), and/or similar tasks. The local controller 310 may be coupled to sensors for hot water tank/water temperature, power, and/or system health (e.g., system temperature, fan speeds, and/or power stability).

The configuration of, and tasks performed by, the local controller 310 may vary based on the configuration of the processing module 102, including the processing tasks that the processing module is assigned. Reconfiguring, updating, and/or selecting various options via the local controller 310 may be used to modify the purposes and/or performance of the processing module 102. For example, the type of cryptocurrency being mined may be changed or the processing load may be switched from cryptocurrency mining to CGI rendering. Accordingly, while some changes to the processing module 102 may require physical modifications, others may be accomplished using the local controller 310.

The local controller 310 may use various types of information to determine when to increase and decrease the processor load, and may be provided with different parameters defining how to balance processing tasks with hot water needs. The operation of the local controller 310 is described in greater detail with respect to FIG. 8. In some embodiments, the local controller 310 may be tied directly into the hot water heater controller, and may control the hot water heater 104 in conjunction with the processing module 102.

It is understood that the components 304, 306, 308, and 310 may take many different forms and may be configured in many different ways. Furthermore, one or more of the components 304, 306, 308, and 310 may be combined or sub-divided into additional components, and the illustrated components are for purposes of example only. Due to the large number of possible configurations and the large number of possible uses, the configuration and/or appearance of a particular processor module 102 may be identical to, or very different from, the configuration and/or appearance of another processing module. Regardless of their configuration and appearance, however, a common feature of such processing modules 102 is that they may be designed to direct excess thermal energy from the processing load for use in one or more external applications, such as to heat the water in the hot water tank.

Figure 4A:
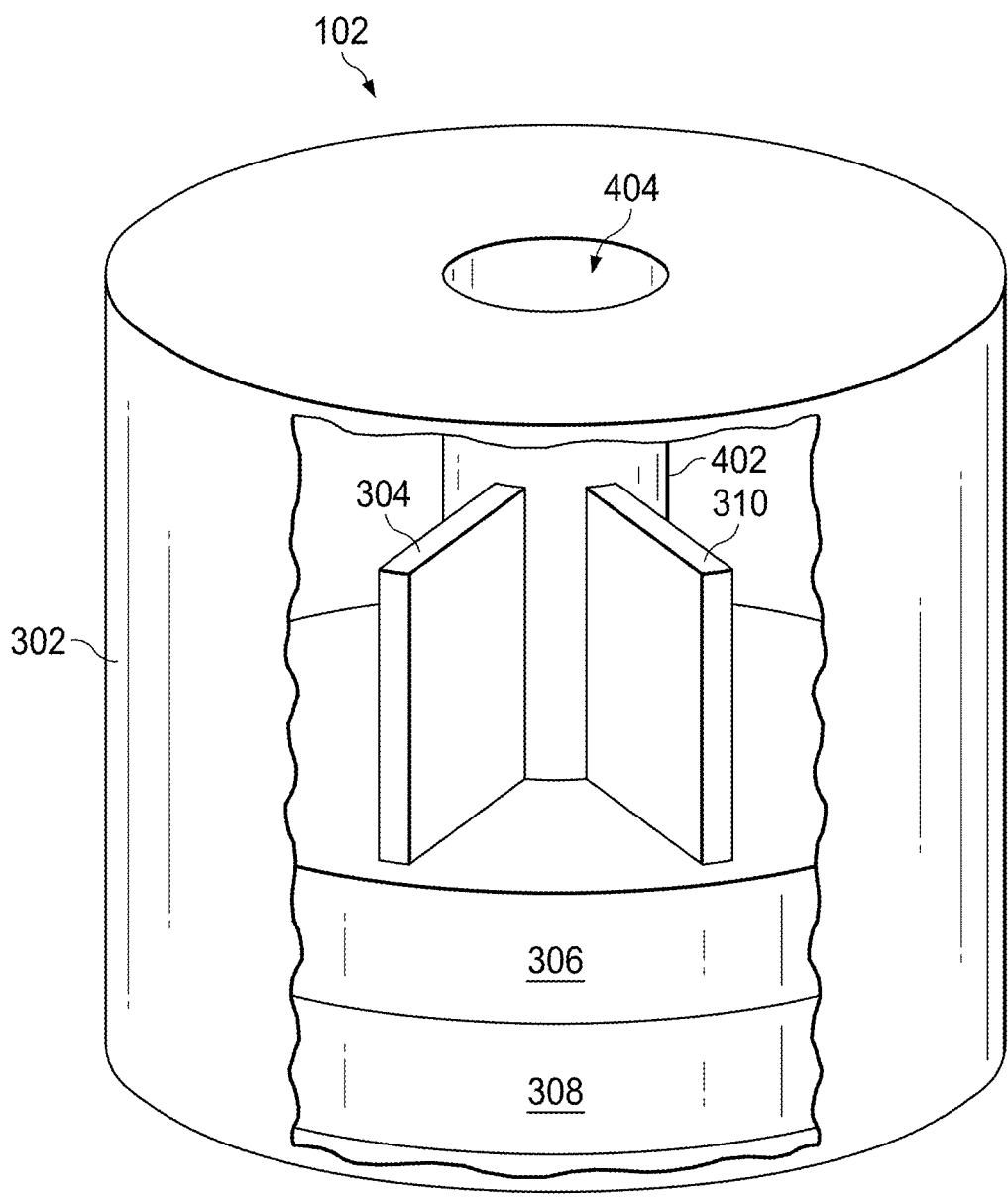
FIGS. 4A and 4B illustrate another embodiment of a processing module.
Figure 4B:
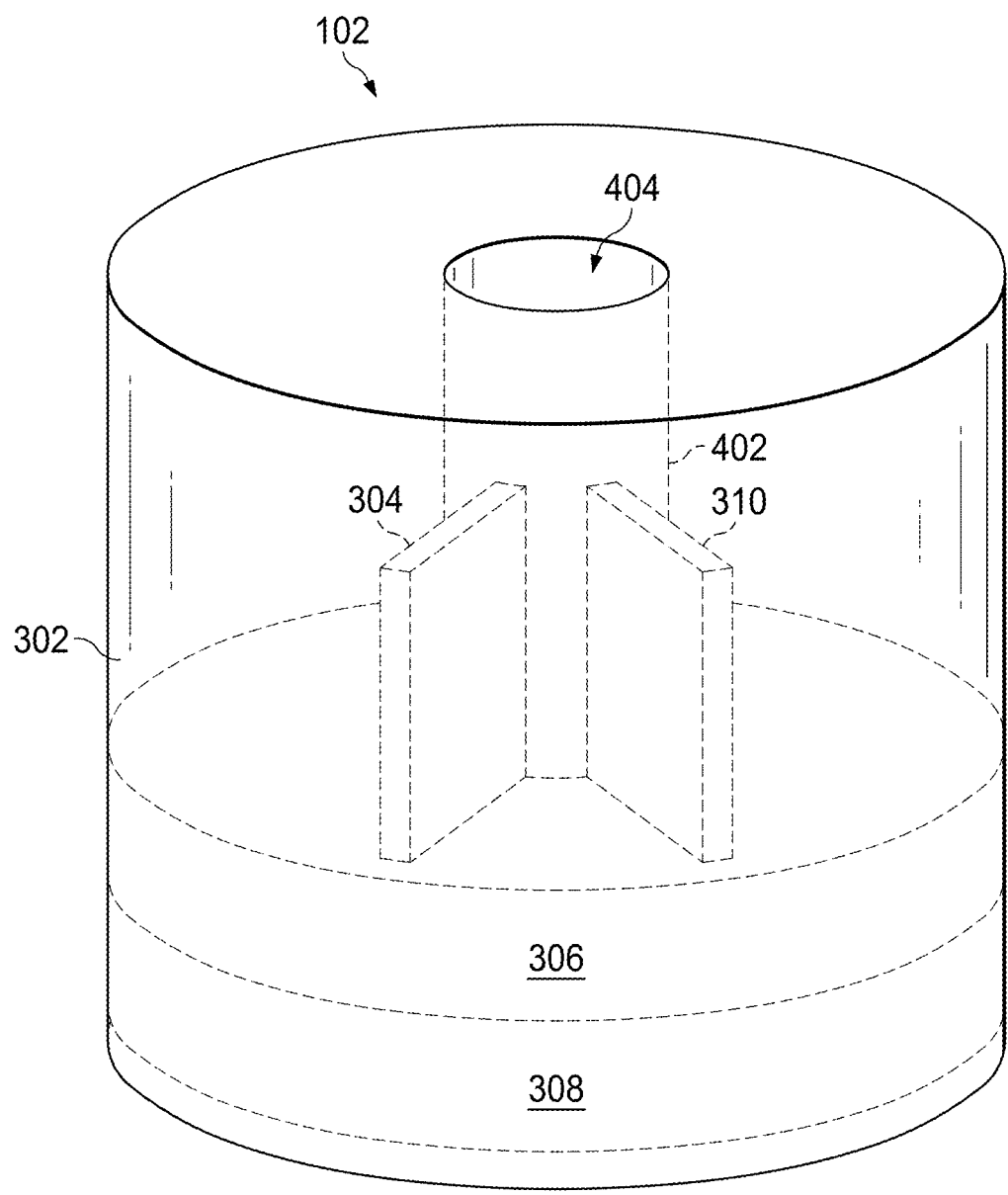

Referring to FIGS. 4A and 4B, another embodiment of a processing module 102 is illustrated with a portion of the case removed to allow a view of the interior. The processing module 102 includes a case 302 that contains one or more processors and/or cards 304, cooling components 306, and heat exchangers 308. In the present example, the case 302 is cylindrical and may be similar to that shown in FIG. 1A. As the components 304, 306, 308, and 310 are described with respect to FIGS. 3A and 3B, they are not described in detail in the present embodiment.

The case 302 may include a central portion 402 that is open to the exterior via an opening 404. The central portion 402 may provide air flow and/or other access to the interior of the case 302. In some embodiments, the central portion 402 may be provided by additional components 310 or may house such components.

Figure 5A:
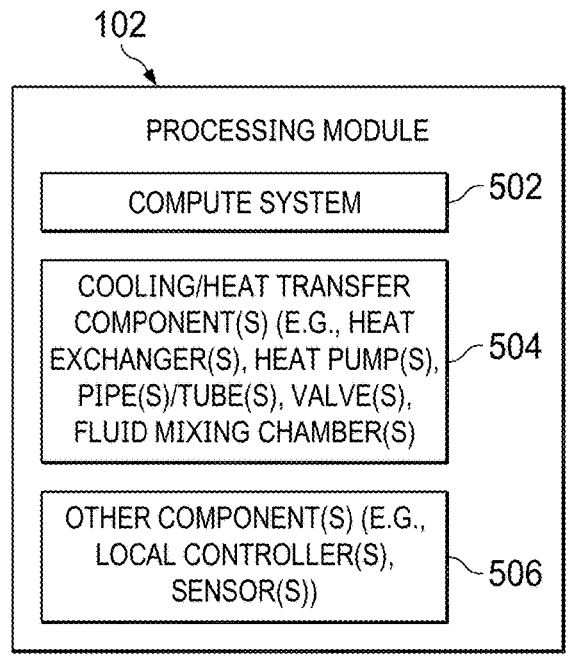
FIGS. 5A and 5B illustrate other embodiments of a processing module as a self-contained unit (FIG. 5A) and with external components (FIG. 5B) that may or may not be part of the processing module.
Figure 5B:
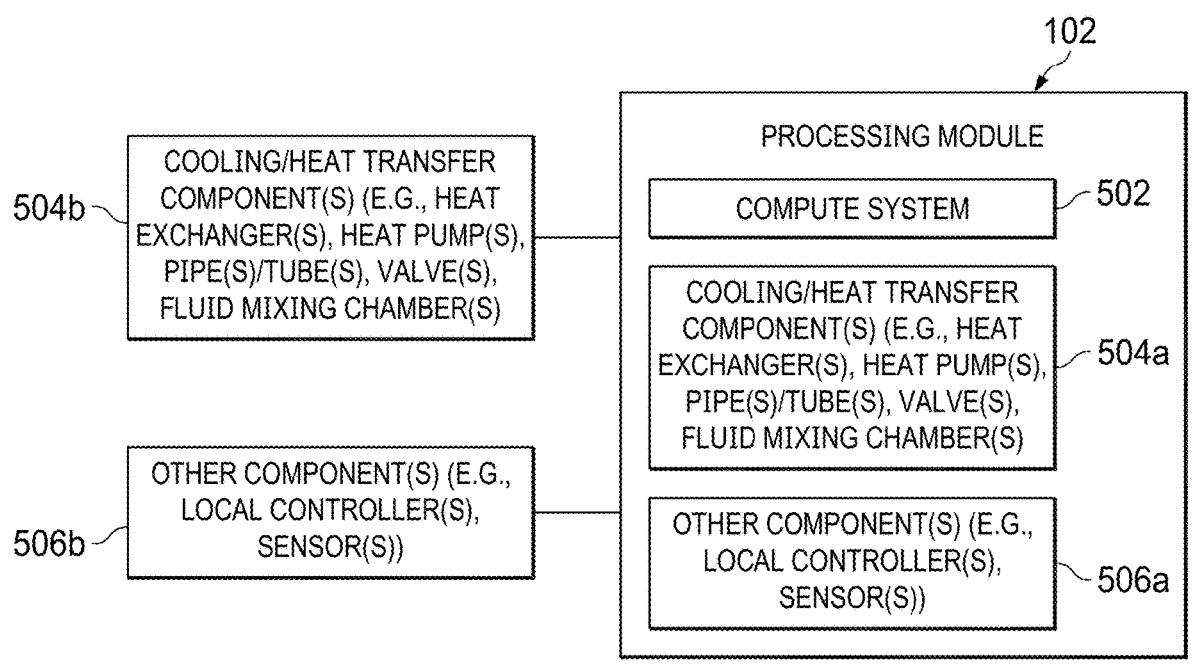

Referring to FIGS. 5A and 5B, other embodiments of the processing module 102 are illustrated. In the present examples, the processing module 102 may include and/or interact with a compute system 502, cooling and heat transfer components 504, and other components 506. As shown in FIG. 5A, the processing module 102 may include all of the illustrated components. For example, the processing module 102 may be a relatively self-contained module intended to provide all needed components other than possible connections that may depend on the particular installation of the hot water heater or other appliance or home device with which the processing module is to interact. The other components 506 may include various sensors for detecting information related to vibration, voltage, fluid flow, pressure, humidity, temperature, security concerns (e.g., physical access detection)), and/or other information.

Alternatively, as shown in FIG. 5B, the processing module 102 may include only a portion of the illustrated components. For example, the processing module 102 may include the compute system 502, some cooling/heat transfer components 504a, and some other components 506a such as a local controller and some sensors. Additional cooling/heat transfer components 504b and other components 506b may be external. Such external components may not be considered part of the processing module 102 or may be considered as add-ons that become part of the processing module when coupled to the processing module.

In such examples, the external components may be pre-existing (e.g., a heat pump already coupled to a hot water heater) or may be installed or otherwise deployed specifically for use with the processing module 102. The external components may be in one or more separate cases (e.g., a cooling module that can be coupled to the case 102 holding the computing system 502) or may be provided as stand-alone components. Accordingly, it is understood that the compute system 502, cooling and heat transfer components 504, and other components 506 may be distributed and arranged in many different ways.

Referring to FIGS. 6A-6H, various embodiments illustrate different configurations of the flow of thermal energy and/or fluids between the processing module 102 and the hot water tank 104. The configuration of a particular processing module 102 may be designed to interact with a particular hot water heater configuration, or may be flexible enough to interact with different hot water configurations. It is understood that the different embodiments may be combined in many ways, with feature(s) of one or more embodiments being included as feature(s) in another embodiment or excluded from a particular embodiment where illustrated.

Figure 6B:
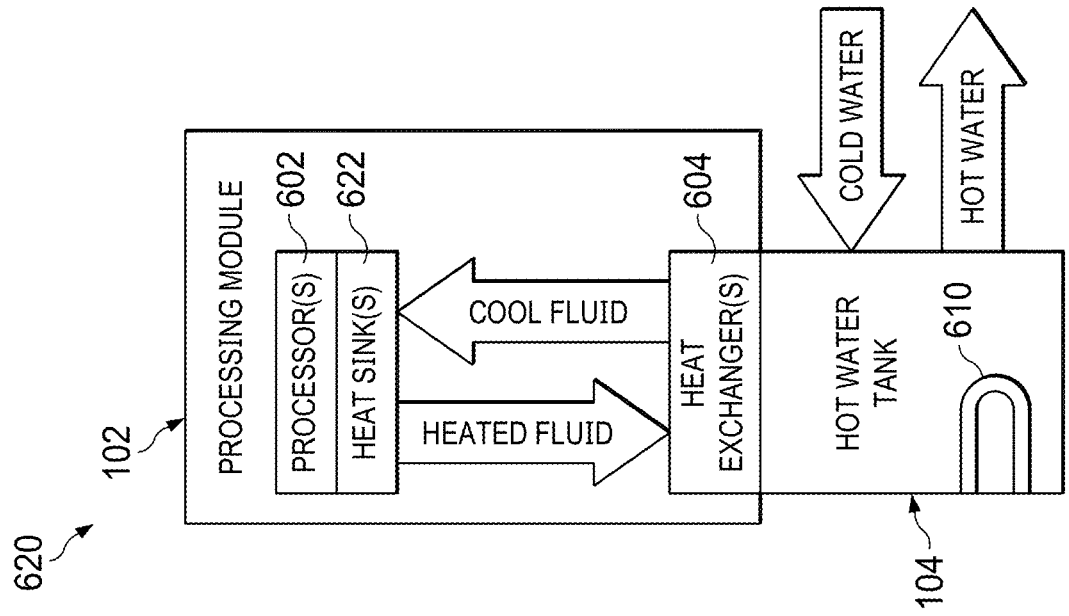
FIGS. 6A-6H illustrate embodiments of different configurations of the flow of thermal energy and/or fluids between a processing module, a hot water tank, and other inlets and/or outlets.
Figure 6A:
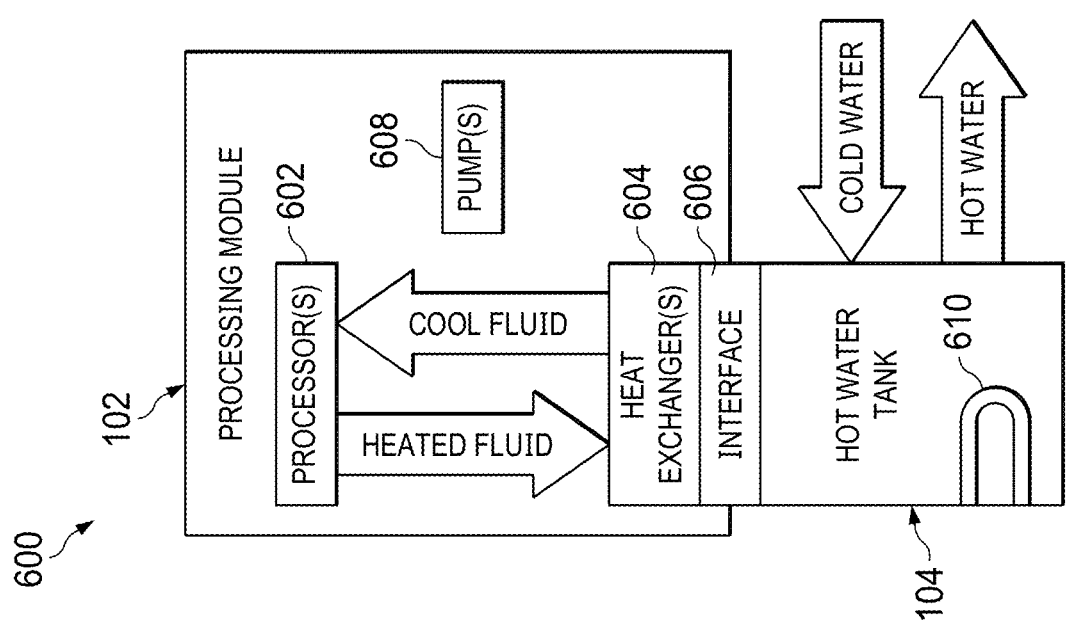

Referring specifically to FIG. 6A, one embodiment of a system 600 illustrates one possible configuration of the processing module 102. In the present example, the processing module 102 produces thermal energy using processors 602, which may be similar or identical to the processors 304 of FIG. 3A. A heat exchanger 604 (which may be similar or identical to the heat exchanger 308 of FIG. 3A) circulates cool fluid across the processors 602. The cool fluid cools the processors 602 as it absorbs heat from them and then circulates back through the heat exchanger 604.

The type of fluid and how it is used to cool the processors 602 may depend on the particular configuration of the processing module 102. For example, the fluid may be air that is passed across the processors 602 and through the heat exchanger 604, which may have radiator-like fins for managing the heat. In another example, the fluid may be a nonconductive liquid (e.g., a dielectric fluid) within which the processors 602 are submerged and the liquid may be circulated through the heat exchanger 604. The radiator may contain one or more fluids that are conductive or nonconductive (e.g., water). In some embodiments, the water to be heated may be run through the radiator, thereby heating the water while providing cooling for the processors. The fluid(s) in the radiator and/or passed across the processors may be thermally enhanced to facilitate heat transfer. In some embodiments, the fluid may be a mixture of different fluids.

In embodiments with dielectric fluid, the dielectric fluid may change dimensions significantly by expanding as it absorbs thermal energy. To accommodate such changes, embodiments described herein may account for such thermal expansion using a mechanism such as a bellows or piston chamber, and/or in other ways, such as by vacuum evacuating gases.

The heat exchanger 604, which interfaces with the hot water tank 104 via interface 606, provides thermal energy from the fluid to the hot water tank. This cools the fluid, which circulates back to the processors 602 to repeat the process. The hot water tank 104 has external connections that enable it to receive cold water and send out hot water. The heat exchanger 604 provides energy for heating up the cold water received by the hot water tank 104. Although shown as being in direct contact with the hot water tank 104, the interface 606 may not be in direct contact in this and other embodiments. For example, the interface 606 may be wrapped around one or more pipes, may be inserted into the fluid channel of one or more pipes, and/or may be inserted into the hot water tank 104. In some embodiments, there may be a gap between the interface 606 and the hot water tank 104 and/or the pipes, with the gap filled with a material designed to facilitate heat transfer.

One or more pumps 608 may be used to move the fluid across the processors and/or through the heat exchanger 604. It is understood that the pump(s) 606 may be present in each of FIGS. 6B-6H. In some embodiments, the heat exchanger 604 may have its own pump(s) for circulation. In other embodiments, the pump 608 may be used both for fluid flow over the processors 602 and for fluid circulation within the heat exchanger 604. The pump 608 may be configured to force fluid, whether gas or liquid, across the processors 602 in order to facilitate heat transfer. The pump 608 may be coupled to the area of the processors 602 in many different ways. In some embodiments, the pump 608 may use one or more directional nozzles to achieve a desired fluid flow. Some implementations may cause a Venturi effect to further facilitate heat transfer from the processors 602. The circulation pump flow may be driven by a pump powered by heat from a device such as a Peltier device and/or other thermoelectric devices.

The circulation system of the heat exchanger 604 may vary depending on, for example, the length of the circulation paths (e.g., tubing) needed to move the fluids and the capabilities of the pump(s) responsible for circulation. In some embodiments, the heat exchanger 604 may be multi-staged, which may allow for the use of shorter circulation paths. It is understood that the specific implementation of the heat exchanger 604, pump 608, and circulation paths may vary depending on various factors such as desired efficiency, heat transfer characteristics, and the physical configuration and dimensions of the processing module 102.

The pump 608 may be configured with more control than simply on and off, and so may be run faster or slower. The pump speed may be modified to account for fluid friction, which will generally increase the faster the fluid is moved. The pump speed may be varied to allow the fluid(s) more or less time to absorb heat from the processors 602, with an ideal operating speed depending on many different factors such as ambient temperature, processor load and thermal output, thermal properties of the fluid(s), the length of the circulation tubes, and similar factors.

The hot water tank 104 may have one or more heating elements 610. The heating element 610 may be controlled independently of the processing module 102, the processing module 102 may be configured to control the heating element 610, or the processing module 102 may have some, but not full, control over the heating element 610. It is understood that, although shown in each of FIGS. 6A-6H, the hot water tank 104 may not have such a heating element 610 in some embodiments.

Referring specifically to FIG. 6B, one embodiment of a system 620 illustrates another possible configuration of the processing module 102. In the present example, the configuration is similar to that of FIG. 6A, except that one or more heat sinks 622 are positioned between the processors 602 and the heat exchanger 604. The heat sinks 622 may be coupled (e.g., mechanically or fluidly coupled) to the processors 602 to pull thermal energy off the processors. One or more fluids (e.g., air and/or water) may be passed across the heat sinks 622 to move the generated heat into the heat exchanger 604. In some embodiments, the heat sinks 622 may be liquid cooled and that liquid may be passed through the heat exchanger.

Figure 6D:
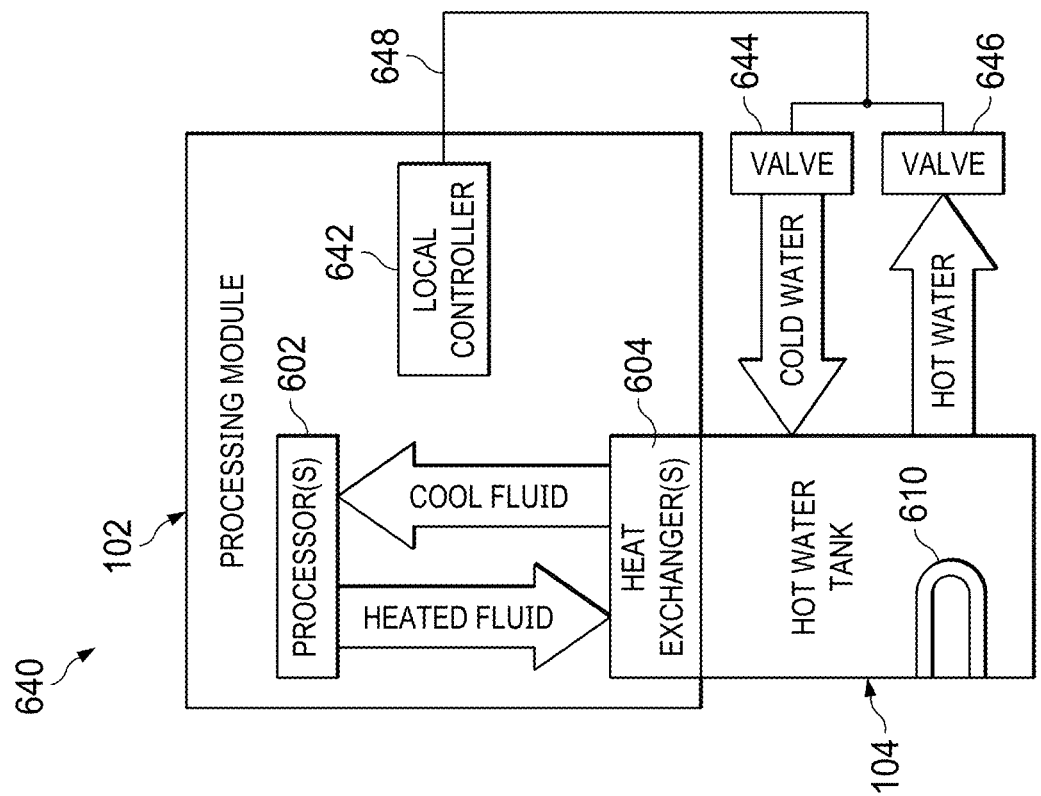
Figure 6C:
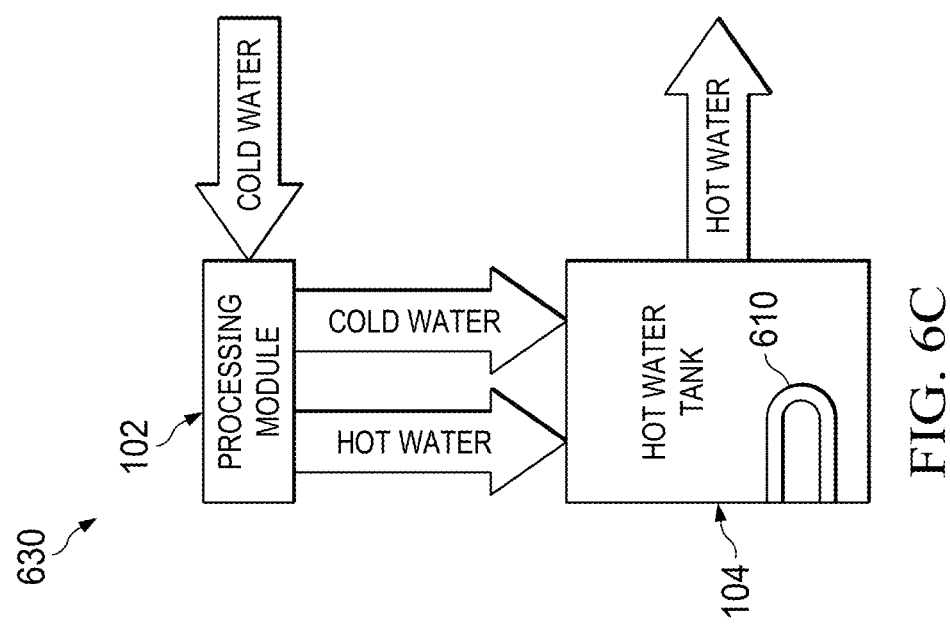

Referring specifically to FIG. 6C, one embodiment of a system 630 illustrates another possible configuration of the processing module 102. In the present example, the hot water tank 104 does not have a cold water inlet or, if present, it may be disabled. Instead, cold water is routed into the processing module 102 (and may be used for cooling), heated, and sent to the hot water tank 104. The processing module 102 may also supply cold water directly to the hot water tank 104. For example, the processing module 102 may be unable to produce enough hot water in a timely manner because the processing load has been reduced or because the volume of hot water needed is more than the processing module can manage, and so may route cold water to be heated directly by the heating element 610 in the hot water tank 104. In another example, the processing module 102 may pass cold water to the hot water tank 104 to prevent the water in the hot water tank 104 from becoming too hot. In such embodiments, the processing module 102 may monitor the temperature of the water in the hot water tank 104. Such monitoring may use one or more sensors coupled to the processing module 102, or may rely on temperature information provided by the hot water tank 104.

Referring specifically to FIG. 6D, one embodiment of a system 640 illustrates another possible configuration of the processing module 102. In the present example, processing module 102 is configured similarly to that of FIG. 6A or 6B, although the heat sink 622 of FIG. 6B is not shown. A local controller 642 (which may be similar or identical to the local controller 310 of FIG. 3A) that may be part of the processing module 102 may control a valve 644 and/or a valve 646 via control line(s) 648. It is understood that the control line(s) 648 represent communication channels and may be wired and/or wireless. The valve 644 enables the processing module 102 to control the amount of cold water entering the hot water tank 104, which in turn provides the processing module 102 with more control over the temperature of the water in the hot water tank. In such embodiments, the processing module 102 may monitor the temperature of the water in the hot water tank 104. This enables the processing module 102 to control the maximum temperature of the hot water for safety and/or other reasons.

The valve 646 enables the processing module 102 to vent hot water from the hot water tank 104, enabling the hot water to be used for secondary purposes, such as watering. In such embodiments, cold water may be added to the hot water tank 104 via valve 644 to cool the water. Alternatively, or additionally, a temperature control mixer (as described below with respect to FIG. 6E) may be used to mix the vented hot water with cool water.

Figure 6E:
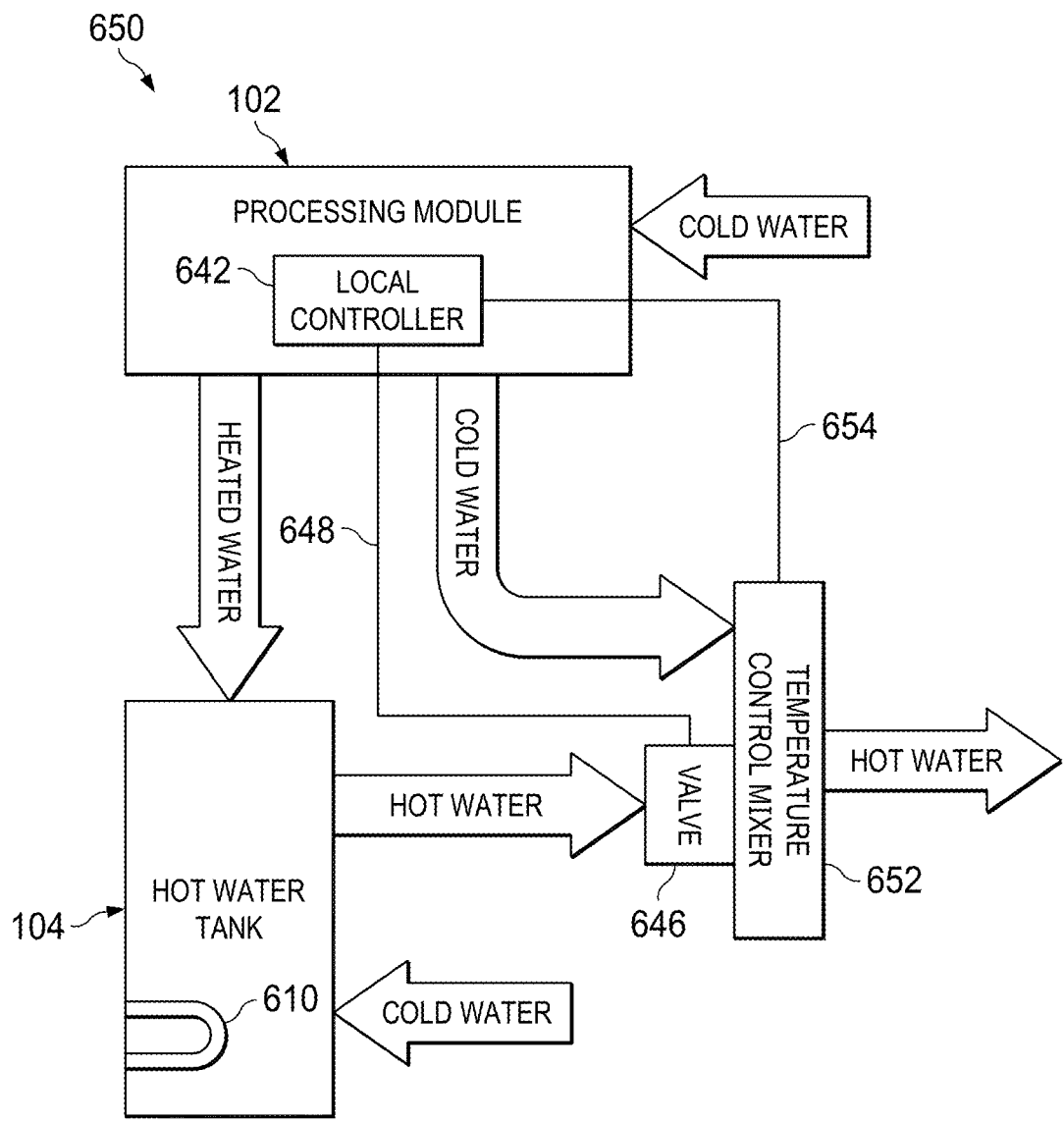

Referring specifically to FIG. 6E, one embodiment of a system 650 illustrates another possible configuration of the processing module 102. In the present example, processing module 102 is configured similarly to that of FIG. 6C, although it does not provide cold water directly to the hot water tank 104 and the hot water tank has an external cold water inlet. The local controller 642, which may be part of the processing module 102, is coupled to a temperature control mixer 652 via control line 654. The temperature control mixer 652 may be part of the processing module 102 in some embodiments. The control line 654 may be wired or wireless.

The local controller 642 may monitor the temperature of water leaving the hot water tank 104, and mix cold water into the stream using the temperature control mixer 652. This enables the processing module 102 to control the maximum temperature of the hot water for safety and/or other reasons. Valve 646, controlled via control line 648, may be used to regulate the outflow of hot water from the hot water tank 104, enabling the processing module 102 to vent hot water as needed. In some embodiments, the hot water flow may be shut off entirely, resulting in only cold water leaving the temperature control mixer 652.

The temperature control mixer 652 illustrates one implementation of a means to regulate the temperature of water provided by the hot water tank 104. The temperature control mixer 652 may be incorporated into any of the embodiments described herein for general temperature control of outlet water, for safety reasons, and/or to provide more efficient thermal transfer when needed. Different embodiments of the temperature control mixer 652 may be used. For example, in one embodiment, the temperature control mixer 652 may start with or generally contain cold water, and hot water may be added to regulate the temperature. The temperature control mixer 652 may have one or more mechanical and/or electronic monitoring and safety components to ensure that the water released is at a safe temperature for its intended purpose. An example of such a component is a mechanical device that shuts off the hot water flow into the temperature control mixer 652 if there is no cold water flow.

Multiple outlets may exist for hot water and different temperatures may be provided at some or all of the different outlets via an outlet manifold or a similar device. In such embodiments, some or all outlets may have individual temperature control mixers 652 or a single temperature control mixer may be used for multiple outlets. For example, the temperature control mixer 652 may be configured to provide different temperatures to different outlets, with other outlets blocked at that time or multiple outlets open as long as they share the same temperature range (e.g., an outlet to a washing machine and a shower may have the same temperature parameters). Alternatively, the temperature control mixer 652 may include multiple chambers that individually regulate different water temperatures for different outlets. Different manifold devices may provide different options, with some providing a single outlet and others providing multiple outlets. For example, a single outlet manifold device may be used for a smaller home, while a multiple outlet manifold device may be used to control temperatures for a home with an irrigation system, heated flooring, and regular water needs.

In some embodiments, a device such as a thermostatic mixing valve may be used in addition to, or as an alternative to, the temperature control mixer 652. For example, a thermostatic mixing valve may be used to ensure that hot water does not pass through the temperature control mixer 652 to a shower or other sensitive destination before a lack of cold water can be detected or addressed. In other embodiments, one or more thermostatic mixing valves may be used in place of a temperature control mixer 652 for some or all outlets.

Figure 6F:
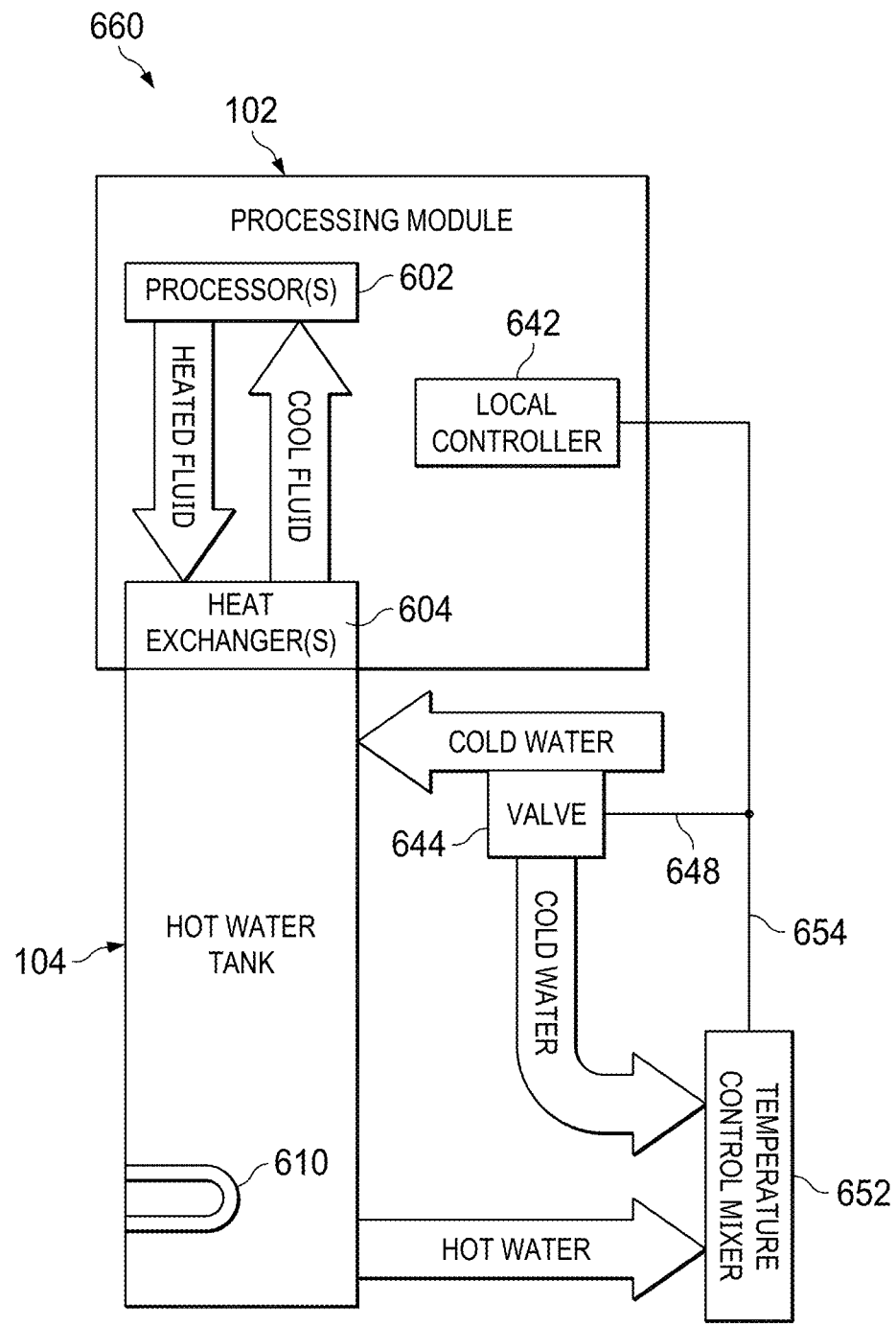

Referring specifically to FIG. 6F, one embodiment of a system 660 illustrates another possible configuration of the processing module 102. In the present example, processing module 102 is configured similarly to that of FIGS. 6A and 6B, although the heat sink 622 of FIG. 6B is not shown. A local controller 642, which may be part of the processing module 102, is coupled to valve 644 via control line 648 (FIG. 6D) and to a temperature control mixer 652 via control line 654 (FIG. 6E). The local controller 642 may monitor the temperature of water leaving the hot water tank 104, and mix cold water into the stream using the temperature control mixer 652. The cold water is controlled via valve 644. This enables the processing module 102 to control the maximum temperature of the hot water for safety and/or other reasons.

Although not shown, the valve 646 (coupled to control line 648) of FIGS. 6D and 6E may be inserted into the hot water exit pipe of the hot water tank 104 and used to regulate the outflow of hot water from the hot water tank.

Figure 6G:
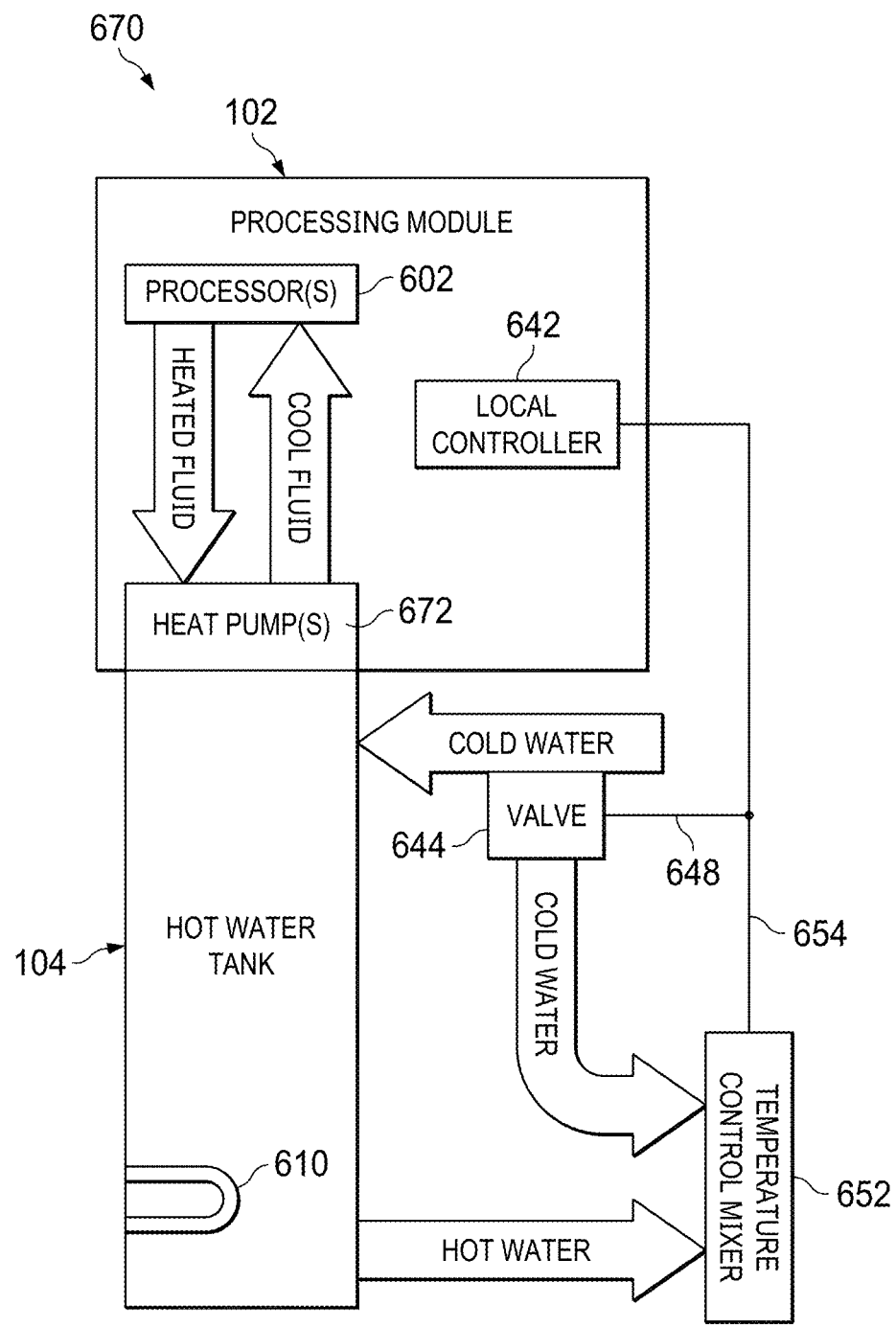
Figure 6H:
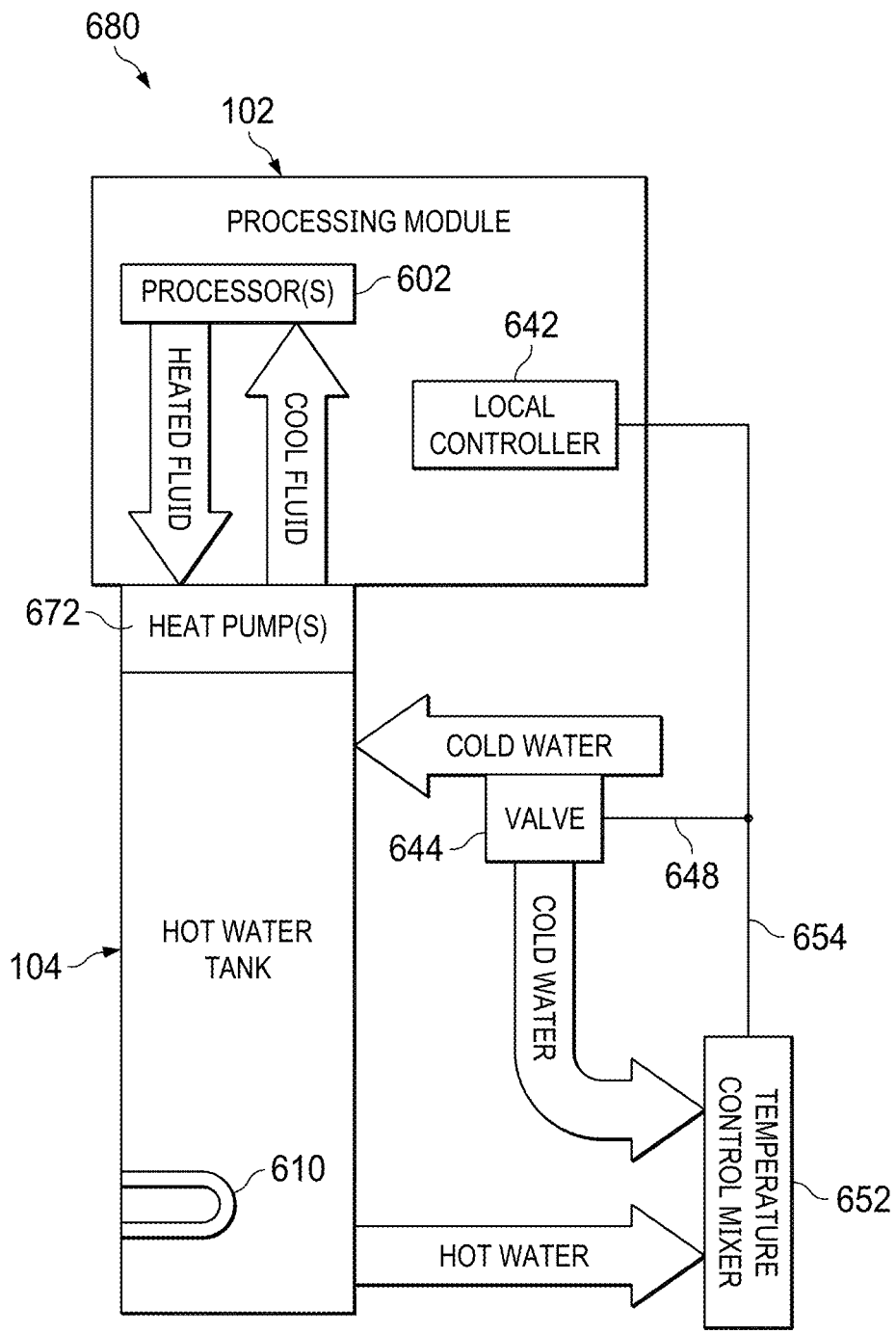

Referring specifically to FIGS. 6G and 6H, embodiments of systems 670 and 680, respectively, illustrate other possible configurations of the processing module 102. In the present examples, processing module 102 is configured similarly to that of FIG. 6F, except the heat exchanger 604 has been replaced with a heat pump 672 that is located internally (FIG. 6G) or externally (FIG. 6H). Although not shown, the heat exchanger 604 (FIG. 6F) may be present and used as an interface with the heat pump 672 in some embodiments.

The heat pump 672 may be integrated with the processing module 102 so that dielectric fluids and/or other fluids used to cool the processors are directly circulated through the heat pump and returned. In other embodiments, the heat pump 672 may be separate from the processing module 102 and fluids used to cool the processors may be directed to an interface with the heat pump or injected into a conduit that provides air and/or other fluids to an intake for the heat pump. The heat pump 672 may be implemented in many different ways, and may use air and/or other fluids and may use a compression/decompression cycle.

Figure 7A:
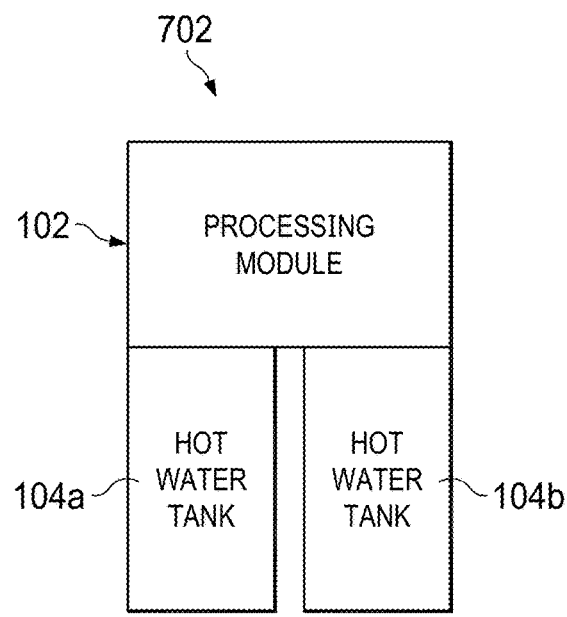
FIGS. 7A-7C illustrate embodiments of different configurations of processing modules and hot water tanks.
Figure 7B:
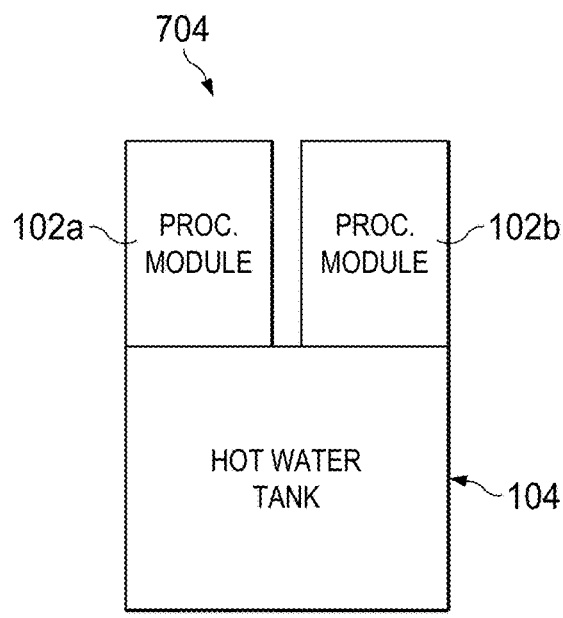
Figure 7C:
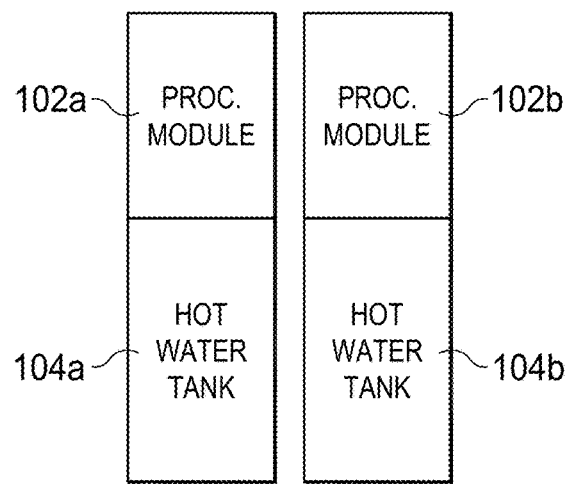

Referring FIGS. 7A-7C, embodiments of systems 702, 704, and 706, respectively, illustrate different configurations of processing modules 102 and hot water tanks 104. In FIG. 7A, the system 702 includes a single processing module 102 that is coupled to multiple hot water tanks 104a and 104b. In FIG. 7B, the system 704 includes multiple processing modules 102a and 102b that are coupled to a single hot water tank 104. In FIG. 7C, the system 706 includes processing modules 102a and 102b that are coupled to hot water tanks 104a and 104b, respectively. The processing module(s) 102 in each of FIGS. 7A-7C may include or be otherwise coupled to their respective hot water tank(s) and/or other components as illustrated in FIGS. 6A-6H.

By providing multiple processing modules 102 and/or hot water tanks 104 as illustrated in FIGS. 7A-7C, processing loads and/or hot water may be provided for particular applications or needs. For example, the system 702 of FIG. 7A and the system 706 of FIG. 7C may be used to provide hot water to two different destinations, such as a kitchen and a sauna. The configuration of the processing module 102 as a single module (FIG. 7A) or multiple modules (FIG. 7C) may depend on various factors, such as convenience or the need to maintain different temperatures in the hot water tanks 104a and 104b, whether the hot water tanks are located close together or relatively far apart (e.g., whether a single processing module 102 may be effectively coupled to multiple hot water tanks), the ability of the single processing module 102 of FIG. 7A to sufficiently heat the water in multiple hot water tanks to a desired temperature or to do so within a relevant time frame, and/or other factors. The configuration of FIG. 7B may be used, for example, to add or remove processing loads by turning entire processing modules 102a and 102b on or off.

Referring generally to FIGS. 6A-6H and 7A-7C, it is understood that many different configurations may be used to transfer heat from the processing module 102 and/or processors 204. For example, while the embodiments of FIGS. 6A-6H and 7A-7C may be used to provide heat to hot water tanks, it is understood that each embodiment may be adapted for use with inline hot water systems and/or other fluid reservoirs as well.

Accordingly, components illustrated in the embodiments of FIGS. 6A-6H and 7A-7C may be combined in many different ways, and aspects of one embodiment may be combined with those of other embodiments. For example, heat exchangers may be used in embodiments that do not explicitly illustrate such heat exchangers or removed from embodiments where shown, dielectric fluid may be added or removed, fluid conduits may be moved, shortened, lengthened, and/or otherwise modified, heat pumps and inline heating systems may be swapped or used together, and many other modifications may be made, and such modifications are within the scope of the present disclosure. Accordingly, various modifications may be made to the illustrated systems and/or components in order to deploy them in a particular environment or for a particular purpose, including modifications needed to prepare a system for use with existing hot water tanks, heat pumps, inline hot water systems, fluid reservoirs, and/or for other purposes and/or for use with other external systems and components.

Figure 8:
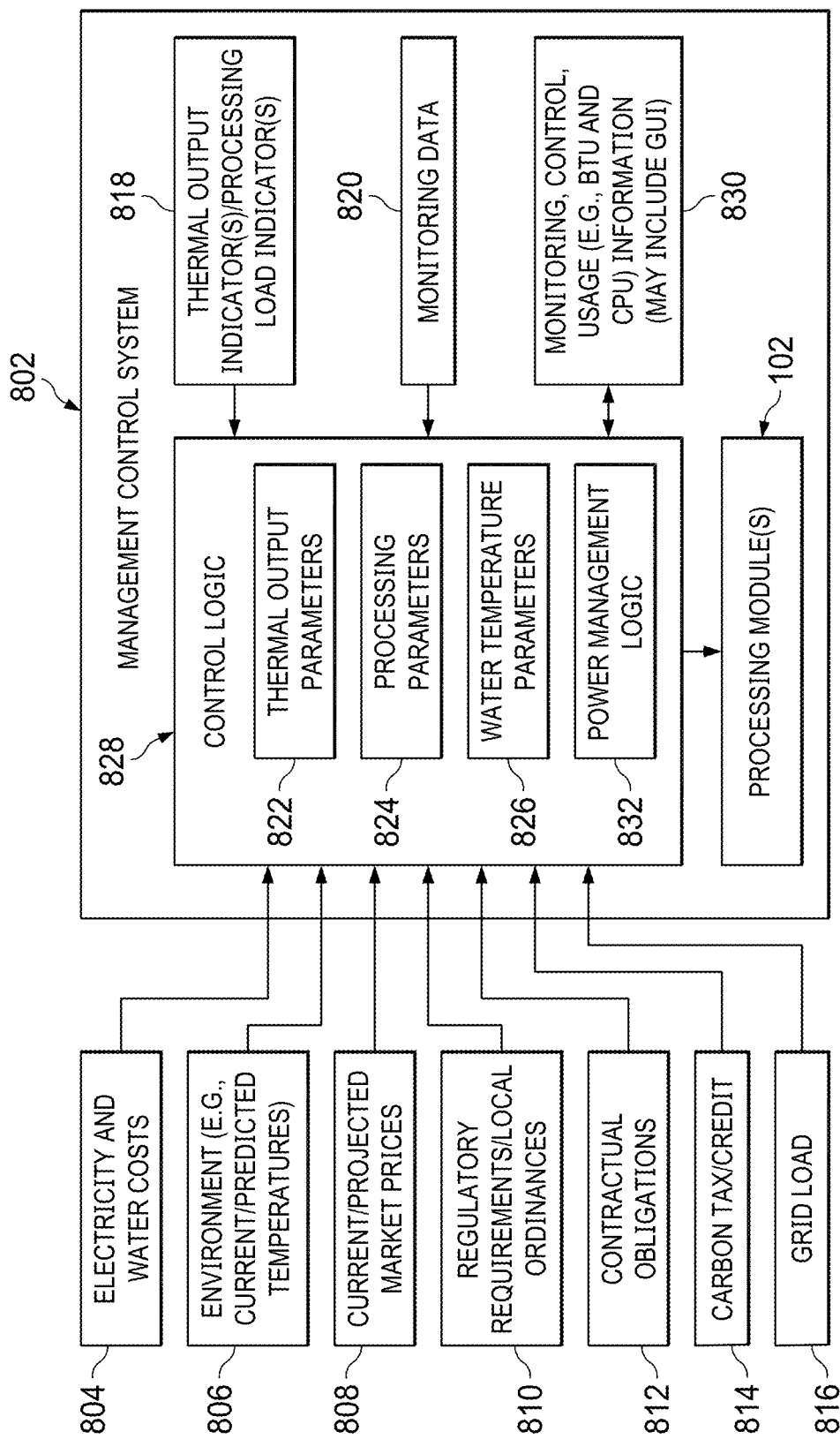
FIG. 8 illustrates one embodiment of a control flow and associated information that may be used to regulate a processing module.

Referring to FIG. 8, one embodiment of a management control system 802 is illustrated. The management control system 802 may be provided and/or executed, for example, by the local controller 310 of FIGS. 3A-4D, the compute system 502 of FIG. 5A, the local controller 642 of FIGS. 6D-6H, and the remote controller. The management control system 802 may be configured to manage the processing load for the associated processing module 102, which in turn impacts the amount of heated fluid produced by the processing module. In some embodiments, the management control system 802 may be able to add cold water to the hot water tank, mix the hot water with cold water as the water leaves the tank, and/or divert hot water to secondary uses.

The management control system 802 may provide general control for the processing module 102 and related components, and may perform predictive and reactive diagnostics, manage network connections, communicate with other devices and systems, and perform other functions needed to initialize, maintain, and control the processing module 102 and related components. In some examples, the management control system 802 may be configured to auto start when first powered up, establish a network connection, and begin any processing tasks configured to run at startup. For example, the management control system 802 may begin mining cryptocurrency or may connect to an external system to obtain data (e.g., rendering or machine learning data) that is to be processed. This enables the processing module 102 to begin operating after installation with minimal external interactions, thereby simplifying the deployment and use of the processing module.

The management control system 802 may manage the relationship between the processing load and thermal output in either direction. In other words, the management control system 802 may monitor and manage the operation of the processing module 102 from the processing side and/or the water side, enabling more granular control of the entire operation. To accomplish this, the management control system 802 may control various operations and components such as the processing load, pump(s) 304, temperature control mixer 342, fluid flow valves, and/or fans. Depending on the configuration of the management control system 802, certain functions may be prioritized. This enables the processing module 102 to be run as a full time processor and part time water heater, a full time water heater and part time processor, or a hybrid that balances processing and hot water as needed.

For example, if the management control system 802 identifies that hot water is needed or will be needed soon (e.g., based on a usage schedule or estimate), the management control system 802 may be configured to increase the processing load of the processing module 102. This will increase the thermal output of the processing module 102 and thereby increase the amount of heat being directed to the hot water tank 104. In this scenario, there is no need to limit the amount of thermal energy being produced by the processing module 102, as the generated thermal energy has an immediate use in heating the water in the hot water tank 104. A water or usage schedule or profile (e.g., a hot water usage schedule/profile) may include any information that relates to past usage, present usage, and/or future estimated usage of water, including hot water, as well as any other inputs desired (e.g., sprinkler schedules, expected occupancy, and seasonal variations in water use) to identify when water is likely to be used, the potential need for particular water temperatures, and/or at what volumes the water is likely to be used.

If no hot water is needed or will be needed soon, the management control system 802 may be configured to allow the water in the hot water tank 104 to cool somewhat. For example, a desired minimum water temperature may be lower during the day (e.g., when use is lower because no one is home). To allow this to occur, the management control system 802 may decrease the processing load, thereby decreasing the thermal output of the processing module 102, and/or may divert the heated water to secondary uses.

In some embodiments, a standby mode for the processing module(s) 102 may generate sufficient heat to keep the water in the hot water tank 104 hot or at least warm. Accordingly, power management logic 832 in the management control system 802 may be configured with different power profiles for the processing module(s) 102. For example, there may be a standby mode that draws a certain level of power (e.g., two hundred and fifty watts or some other positive draw) and a low power mode that maintains the power draw to as close to zero as possible. This may enable the management control system 802 to modulate revenue generation relative to power consumption.

More specifically, it may be desirable to optimize the generation of heat when revenue may also be generated. By enabling the management control system 802 to manipulate various power profiles of the processing module(s) 102, the management control system 802 may be able to optimize revenue generation relative to heat generation as a product of power consumption.

In some embodiments, the management control system 802 may be configured to modulate processing loads relative to processing times. For example, assume that the water in the hot water tank 104 is to be heated to a specified temperature. The actual heating process may be accomplished or aided by the heat generated by the processing module(s) 102 over a period of time. The management control system 802 may control this process by adjusting the processing load, which then impacts the amount of time needed. More specifically, the management control system 802 may use relatively heavy processing loads (therefore increasing the amount of heat produced), which may shorten the time required, or may use relatively light processing loads (therefore decreasing the amount of heat produced), which may lengthen the time required. It is understood that the processing load and needed time may be modulated across a range of values from a maximum load and shortest time to a minimum load and longest time, with factors such as the maximum possible amount of heat generated, maximum possible amount of heat transferable to the water, amount of water to be heated, current water temperature, target water temperature, and/or other factors impacting the time required.

By modulating the processing load relative to time, various heating cycles may be implemented. For example, lower heat generation may be used over a longer period of time, or higher heat generation may be used with periods where the processing load is turned off. This provides the management control system 802 with flexibility based on different usage profiles and/or targets. For example, with cryptocurrency mining, it may be desirable to maximize processing when possible as maximum computation speed may be desirable, even if such a processing load can be maintained for relatively short periods of time. In contrast, to accomplish such objectives as reducing thermal stress and/or maintaining power consumption at a relatively stable level, a lower processing level may be used over a longer period of time. Accordingly, the management control system 802 may balance any number of factors when modulating processing loads.

In some embodiments, the processing module 102 may have a way to release thermal energy without affecting the temperature in the hot water tank 104, which would enable the use of higher processing loads without increasing the water temperature. In still other embodiments, hot water from the hot water tank 104 may be diverted to secondary uses, such as lawn or garden watering. For example, a sprinkler system schedule may be used to determine when to vent hot water that is not needed, with processing loads planned accordingly. In such embodiments, cold water may be mixed with the hot water to ensure a safe temperature. In other embodiments, the hot water may simply be routed to a drain or otherwise dumped for safety and/or other reasons. This process may be used, for example, if high levels of processing are desired, but the water in the hot water tank 104 is too hot for efficient thermal transfer, too hot for general use for safety reasons, and/or there is no use ongoing or expected in the near future.

If increased processing is needed and hot water is needed, the management control system 802 may be configured to increase the processing load of the processing module 102. This will increase the thermal output of the processing module 102 and thereby increase the amount of heat being directed to the hot water tank 104. In this scenario, there is no need to limit the amount of thermal energy being produced by the processing module 102, as the generated thermal energy has an immediate use in heating the water in the hot water tank 104.

If increased processing is needed, but hot water is not needed, the management control system 802 may be configured to increase the processing load of the processing module 102. The thermal output may be directed to the water in the hot water tank 104. Even if additional hot water is not needed at the time, the hot water tank 104 may serve as a heat sink for the thermal output of the processing module 102 and/or increasing the water's temperature may save the need to provide more heat to the water later.

It is understood that the transfer of heat to the water may increase the water temperature to the point that the water is not a viable heat sink for the thermal energy produced by the processing module 102, thereby decreasing the cooling of the processing module 102 past a desired threshold. If this occurs, the management control system 802 may be configured to take one or more actions. For example, heat may be vented directly from the processing module 102 into the surrounding air, although this may have a limited impact if the processing module 102 is in a relatively warm and/or poorly ventilated space. In another example, hot water may be vented from the hot water tank 104 by the management control system 802 and replaced with cold water, thereby increasing the temperature delta between the water and the thermal energy produced by the processing module 102, which may restore the hot water tank 104 as a viable heat sink.

This process may be used, for example, if high levels of processing are desired, but the water in the hot water tank 104 is too hot to be safe and/or to allow for adequate thermal transfer needed for cooling the processing module 102. For example, assume the cryptocurrency has reached a value threshold that makes additional processing worthwhile. However, due to the increased water temperature in the hot water tank 104, additional processing is not currently feasible. The processing load may be lowered or paused entirely to avoid further heating the water due to safety reasons and/or because the processing module 104 will overheat. By venting hot water from the hot water tank 104, processing may be increased as the water temperature is lowered to a safe level and/or due to the hot water tank now serving as a more efficient thermal transfer sink for waste heat from the processing module 102. It is understood that venting of heat may be accomplished in many different ways, such as by venting heat from the processing module 102 and/or the hot water tank 104 into the air, and/or by releasing hot water into a drain or other system.

The management control system 802 may use a variety of information in its management of the processing module 102. At a basic level, a user may simply use their water normally and the system may transfer heat to the hot water tank 104 relatively steadily. In such embodiments, the hot water tank 104 provides a use for the waste heat, but there is little or no optimization or scheduling to increase the efficiency of the processing module 102 or the hot water tank 104. In other embodiments, optimization may occur based on user inputs and/or automated optimization processes. At higher customization levels, the management control system 802 may optimize the processing module's operations based on monitored data and/or using parameters input by the user, such as preferred peak hot water time ranges, level of processing outputs, etc.

It is understood that the relationship between processing loads and the generation of hot water may take many different factors into account and those factors may be weighted in many different ways. For example, the management control system 802 may use system-wide parameters, module specific parameters, and external factors when determining how to manage the processing module 102. Weighting may be used to provide prioritization of certain factors, such as prioritizing maximum processing over cost savings regardless of water needs. The system may be configured to enable smart management of electricity, which may allow the use of software processes to move at least some system components into downtime procedures in order to minimize standby energy usage. These same processes may be used to minimize water usage to the system itself.

As an example, assume that the cost of electricity for a particular home is lowest from 12:00 AM to 4:00 AM. Hot water use in the home during the week is highest between 6:00 AM and 7:30 AM, and then sporadically spikes at night from 6:00 PM to 10:00 PM depending on whether additional showers are taken, the dishwasher is used, laundry is done, and similar factors. Based on factors such as the cost of electricity, electrical grid load, and need for processing, the management control system 802 may determine whether to increase processing in order to heat the water during the 1:00

AM to 4:00 AM period and then maintain the water temperature for a longer period of time until 6:00 AM, or may wait until closer to 6:00 AM to increase processing. The water temperature may then be allowed to drop until time to heat the water for potential use starting at 6:00 PM.

Hot water may be proactively prepared as a form of heat storage buffering to account for economic and/or time management factors. Such preheating may be performed by overheating the water in advance and/or by using lower power over a longer period of time. In systems designed for lower power heating, smaller gauge wire and/or other components may be used due to lower peak current values and/or smaller processor systems may be used with higher duty cycles. Accordingly, for a particular system implementation, an estimated amount of time desired for producing a sufficient amount of hot water may be used to select the components (e.g., wires) and processor power used for the system. As the target time for heating the water is reduced, the components and processing power may be enhanced to account for the larger peak power needs and processing loads used to produce the additional heat needed for the faster heating cycle.

The ability of the management control system 802 to predictively manage hot water and processing loads may take many different factors into account. For example, hot water history and processing load history may be used. User inputs may be used to adjust to specific instructions, such as maximizing free hot water or the profitability of the processing load. User tracking (e.g., cell phone location information, vehicle location information, and/or motion sensing from home security systems or other sources) may be used to determine when hot water will likely be needed.

The time of day and other time-based events, such as the scheduling of an alarm clock and/or electronic calendar entries may be used. For example, a programmed alarm or a calendar entry may indicate the user will catch an early flight or has to leave the house earlier than usual for a meeting, and the management control system 802 may compensate for this time shift to ensure sufficient hot water is ready. Accordingly, the management control system 802 may be configured to use many different types of events to manage the availability of hot water and associated processing loads.

The management control system 802 may apply machine learning and inputs in many different ways. Such inputs may from electronic calendars, alarms, emails, text messages, and/or other tracking, scheduling, and messages from computers, cell phones, and other devices, as well as through activities that are not directly detected by the management control system itself. For example, a user may purchase airplane tickets using a credit card. This information may be received by the management control system 802, which may rebalance the processing load and hot water regulation based on the times and dates on the tickets, and possibility the identity of the people traveling. The information may be obtained by the management control system 802 as a message from the bank or credit card company, from e-tickets received by the user's device, from an email with confirmation details, and/or similar methods.

The management control system 802 may be configured to utilize the inlet or outlet pressure associated with a closed loop water system to identify leaks and/or unintentional overuse of devices within the water system. For example, if a significant drop in water pressure is found to occur on either the inlet valve or outlet valve and that drop is maintained for a defined period of time, the management control system 802 may be configured to recognize that there is a leak, a faucet is running, and/or another event that needs to be addressed is occurring. Through analytics, such as classification techniques, the management control system 802 may characterize those drops in pressure to include main water line leakage, and alert end users when they are away to leaks caused by frozen pipes and/or unintentional use. Through use of water, flow rate, thermal and pressure changes, and/or other information, the management control system 802 may be used to identify the number of occupants.

Other analytics processes may be supported by the management control system 802, such as smart usage, heat preparation and saving, grid support, optimizing for load from the processing tasks, and/or other processes. For example, a user may take showers at 7:00 AM every day, and the management control system 802 may detect this pattern and prepare for the increased hot water load typically experienced at that time. On the processing side, a user may have a high processing need when they get home from work at 5:30 PM, and the management control system 802 may mix cold water in with the hot water in order to increase the available thermal capacity needed for such processing.

These and similar technologies are applicable in radiant floor heating, pool heating, and other high usage applications for hot water. The amount of heat needed in these applications may generally involve increased processing loads, thereby allowing for more uptime and usable processing for such scenarios. For example, a swimming pool may be fitted (e.g., either retrofitted or as a primary installation) with an inline system that uses a processing module 102 to provide a relatively continuous flow of hot water to warm the pool. Due to the size of swimming pools, heating the water to a desirable temperature and maintaining that temperature may be expensive. Using the management control system 802 to control the inline processing module 102, such expenses may be offset by earnings generated by the processing tasks.

The management control system 802 may be integrated with, or otherwise coupled to, a home or business automation system. For example, a home automation system may manage an alarm system, a sprinkler/irrigation system, the hot water tank, and/or a heating, ventilation, and air conditioning (HVAC) system. The management control system 802 may use information from the home automation system to manage the processing load and hot water temperatures. For example, assume the sprinkler system is on a timer that defines the days and times that watering is to occur. The watering is scheduled to occur in the near future at a time when no hot water is generally needed. Prior to the scheduled watering, the management control system 802 determines that a cryptocurrency is at a current high value and additional processing would be beneficial from that perspective.

By coupling the management control system 802 to an automation system, the hot water can be used in many different ways other than simply providing hot water for regular needs such as showers, dishwashers, and washing machines. For example, water may be used for irrigation, heated flooring and/or walls, circulating hot water through the regular pipes to provide heating and prevent freezing, providing heat to a radiator system, providing additional heat for an HVAC unit, hot tubs, swimming pools, water features, fountains, fishponds, sous vide cooking systems, industrial and home dish washing systems, industrial and home clothes washing systems, pressure washers, degreasers, vehicle washing systems, and/or other devices, systems, and uses that may benefit from water having a temperature greater than the ambient temperature. Heated air produced by the processing load may also be used in addition to, or as an alternative to, hot water.

Not only may the warmer water be used to prevent freezing for swimming pools, fishponds, and other relatively stationary and/or exposed water, but the destination water may provide a heat sink for circulated water. For example, a swimming pool in a relatively cool climate or during winter may provide a large heat sink that enables additional processing to occur due to the relatively large levels of cooling provided by the amount of available cool water. Hot water and/or heated air may also be used to provide heat to ovens and/or other appliances and/or environments that operate at higher than ambient temperatures.

Figure 9:
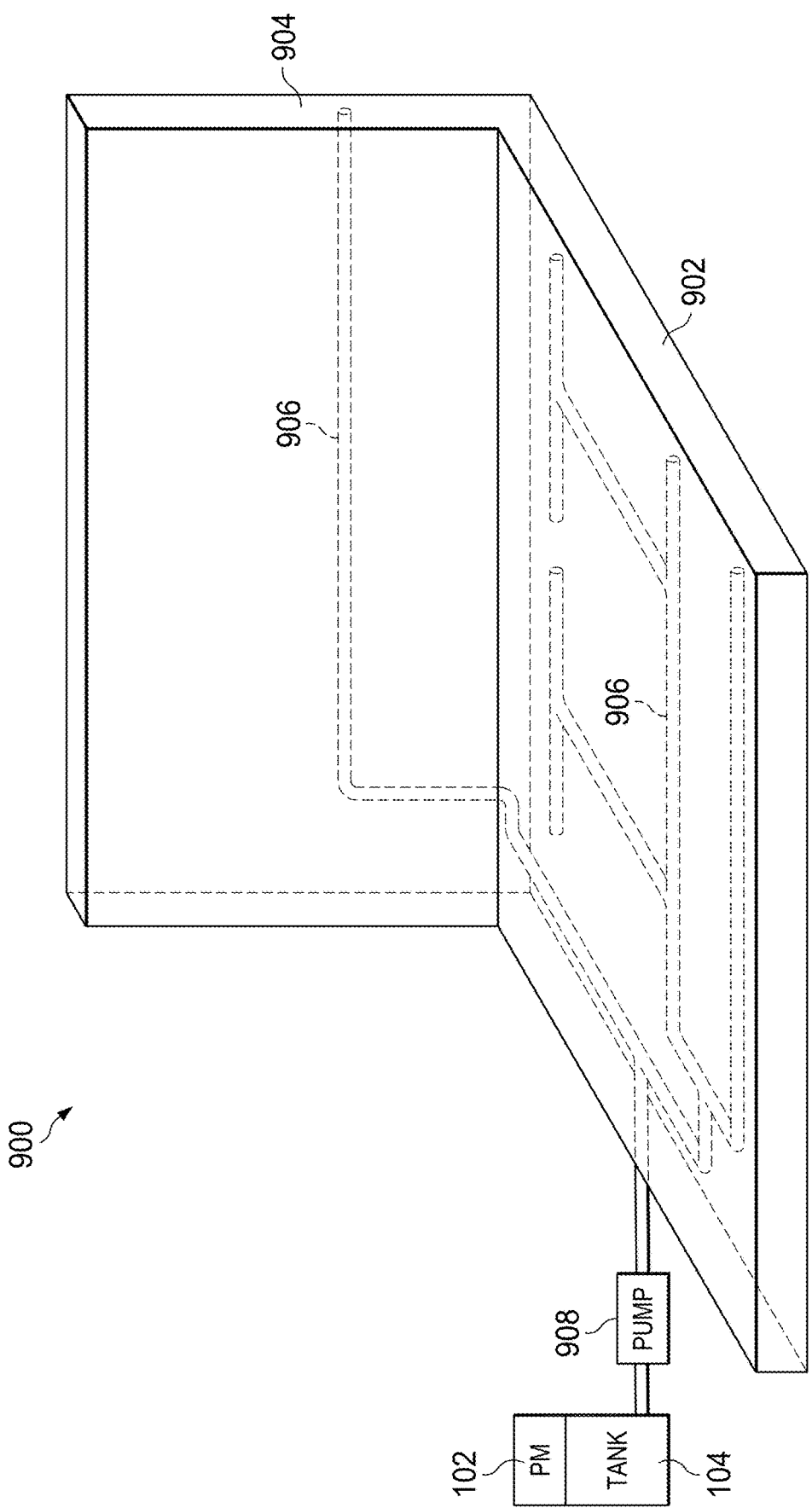
FIG. 9 illustrates one embodiment of an environment within which a processing module may be used.

With additional reference to FIG. 9, one embodiment of an environment 900 illustrates a floor 902 and a wall 904. Pipes 906 present in the floor 902 and/or wall 904 may be used to provide heating using water controlled by the processing module (PM) 102 and hot water tank 104. In other embodiments, the hot water tank 104 may not be present and the processing module 102 may be configured to provide, or assist in providing, inline hot water as a tankless system.

Water for heating flooring and/or walls may be provided on a controllable basis, with the granularity of control depending on the presence of valves, the number and locations of pipes, the presence of loops connecting pipes, and/or other components. For example, if a house has multiple rooms with pipes in the floors for heating, water may be controlled for individual rooms or even for part of a room, with zones designated to control heat for a certain area. Heated water circulated through pipes or a radiator may be used to support an HVAC system by further heating the air. Hot water may also be circulated through one or more pipes using one or more pumps 908 to provide hot water more quickly when a faucet is used or hot water is needed for other purposes (e.g., by a dishwasher, washing machine, or coffee maker).

Water may also be circulated through the pipes in the walls, floor, and/or attic to provide heating and/or to prevent freezing, although a bypass may need to be installed if not present in order to form a loop for the water. Such a bypass may be controlled by a valve or by other means, such as pressure created by the circulation pump 908. A circulation pump may be provided separately or as a dual drive pump (e.g., one motor) that circulates water around the house in conjunction with circulating dielectric fluid through the heater system. Digitally controlled valves, mechanically indexed valves, and/or other control mechanisms may be used to provide circulation paths to several points in the house, which provides general heating for the home while performing processing tasks. This process may be controlled as a function of ambient temperature, tank temperature, outside temperature, and/or economic information (e.g., the value of cryptocurrency) to increase efficiency.

By controlling the water flow through individual loops, pipes may be targeted for circulating hot water based on their likelihood of freezing, the need to provide heat to a room, and/or for other reasons. Such pipes may be the regular pipes used to provide water for the house or may be installed for heating and/or other purposes. Because of the control provided by the local control system 802, hot and cold spots may be addressed by altering the flow rate and/or temperature of the water, as well as varying the processing load. It is understood that similar systems may be used to provide radiant heating for driveways, sidewalks, and other surfaces in order to melt snow and ice. Heated water may also be circulated through an irrigation system to prevent freezing.

As the temperature of the water may be controllable, the flow rate and temperature may be balanced based on one or more priorities. For example, the cost of water, the cost of electricity, and the need for processing may be used to determine an optimal flow rate and temperature. If the water will be too hot for a particular use if released straight from the hot water tank, cold water may be mixed into the hot water to reduce the temperature to a desired level. In areas where water is rationed or otherwise more limited, the temperature of the water may be increased while the flow is reduced to provide a desired level of heating. If the purpose of water circulation is to prevent freezing, the flow of water may be reduced to a point where no freezing will occur, but water usage will be minimized.

The management control system 802 may determine that it is worthwhile, based on its operating parameters, to increase the processing load to capture the processing value (e.g., of the cryptocurrency, rendering, and/or other processing tasks) and then direct the hot water that is produced to the sprinkler system (after mixing in cold water). However, if the heated water from the additional processing has no use (e.g., would have to be dumped because there is no watering in the near future), the management control system 802 would determine whether the additional cryptocurrency mining was worthwhile based on this set of data.

In some embodiments, the management control system 802 may weigh the environmental cost of dumping water against the financial cost. For example, to prevent or minimize water waste caused by dumping hot water, the processing load may be reduced or turned off to reduce or eliminate the amount of water that needs to be dumped. The environmental cost may be prioritized to override the financial cost even if it would be more profitable from a purely financial perspective to increase the processing load and dump the water. Accordingly, environmental and/or financial priorities may be set for the management control system 802 to enable the system to control the processing load in light of environmental factors as well as financial factors.

In other embodiments, the management control system 802 may shift the watering schedule to align with the processing load, although such modifications may be restrained by various parameters that limit the extent of the changes. Accordingly, the management control system 802 may control the automation system and/or receive information from the automation system to manage processing loads and water temperature.

The management control system 802 may also take the type of processing tasks into account, which may or may not include external factors. For example, assume the processing tasks involve mining a cryptocurrency. As the mining occurs, the processing tasks may generate value and that value may be tied to the processing module 102. The generated value may be a result of the processing module's contribution to a mining pool using that pool's particular distribution approach and may take many different factors into account, including hash rate, power consumption, power cost, pool fees, difficulty, block reward, and/or price. Accordingly, a particular value of output per unit time may be determined and that value may be used by the management control system 802 to determine how to schedule the processing tasks. For example, the pool contribution value may be used to determine whether it is worth increasing the processing load in light of the electricity cost. As such factors may change relatively often, the management control system 802 may be configured to dynamically recalculate various parameters as modified data is received.

When managing processing tasks, the management control system 802 may take the current stage of a particular task into account. For example, assume that it is time to allow the water temperature to drop based on cost, projected needs, and/or similar factors. The management control system 802 would generally reduce the processing load at this time in order to maintain the schedule and/or achieve desired parameters. However, the processing load is currently occupied with a task that will be completed in some additional amount of time (e.g., ten minutes). The management control system 802 may therefore allow the processing of the task to complete before reducing the processing load, as this may be more efficient overall than stopping the task. It is understood that the parameters of the task itself may be considered because some tasks may be more costly to suspend or cancel than other tasks. Accordingly, the management control system 802 may attempt to optimize the system by balancing costs, water requirements, and other input parameters with task parameters when determining whether to complete, suspend, or cancel a current processing task.

The management control system 802 may use many different types of information to determine when to increase the processing load for cryptocurrency mining and/or to produce hot water at the desired time. Continuing the present example, the current and estimated future value of the cryptocurrency being mined, how much processing time at a particular load is required to generate a percentage of that value, the cost of electricity during the lowest 12:00 AM to 4:00 AM period and other time periods (e.g., the actual metered cost and other factors, such as whether there are local electricity restrictions in place and, if so, the associated times and/or kilowatt limits), the cost of water (e.g., the actual metered cost and other factors, such as whether there are local water restrictions in place and, if so, the associated times and/or volume limits), and similar factors may be taken into account to produce an optimized schedule that maximizes the mining value while also providing the desired hot water.

The management control system 802 may take longevity and reliability into account when managing the processing load. For example, the thermal expansion and contraction of components (e.g., thermal stress), including circuit boards and connections (e.g., solder points), occurs when temperatures vary over time. This thermal stress may negatively impact the longevity and reliability of components and therefore reduce the efficiency and productivity of the system over time. Generally, relatively rapid temperature changes have a greater negative impact than slower changes. Accordingly, the management control system 802 may manage the processing load to minimize the long-term impact of thermal expansion and contraction. For example, the management control system 802 may gradually increase the processing load to a maximum level, rather than ramping it up as quickly as possible. It is understood that many different factors may be taken into account, including the ambient temperature, the cooling capabilities of the processing module 102, and the current and expected thermal sink availability provided by the water temperature of the hot water tank 104.

The management control system 802 may take noise into account when managing the processing load. For example, running the processors at high load may produce a significant amount of noise. This noise may be noticeable, particularly if the processing module 102 is positioned in a closet or other location that is relatively close to people, such as in or near an office, living room, entertainment room, or bedroom. Even if the closet or other area is equipped for noise suppression (e.g., using padding or acoustic panels), the noise level may still be noticeable. Accordingly, the management control system 802 may reduce the processing load when people are nearby (e.g., in the evening and at night) and increase the load when the noise will have less impact. As with other scheduling, the management control system 802 may use alarm clocks, calendars, location services, input schedules, and/or other information when managing noise levels.

The management control system 802 may be configured to take grid load into account. For example, the grid may become overwhelmed due to high demand, infrastructure failures (e.g., a downed power line, a generator going offline, and/or a blown transformer), and/or other factors. When this occurs, the management control system 802 may reduce the processing load/hot water temperature to reduce the power needs of the processing module 102 and/or hot water tank 104. This provides dynamic grid support that may be ramped up and down as needed, enabling the management control system 802 to balance the processing load/hot water temperature with the demands on the grid. In extreme cases, the management control system 802 may suspend or minimize processing and/or shut off the hot water tank 104 until the grid stabilizes. While this may have a minimal impact on grid performance when done at a single house, implementing dynamic grid support over a wide area may have a significant impact. It is understood that dynamic grid support may be localized and specific, such as identifying a specific set of addresses and regulating power usage by a subset of devices at those addresses (e.g., turning all water heaters down by twenty percent until a grid problem is corrected).

The management control system 802 may be configured to use alternate energy sources, including wind power, solar energy, geothermal energy, and/or other energy sources. For example, a house or business may have a generator. If there is a power failure, the generator may be used to provide energy until power is restored. The management control system 802 may modulate the processing load and water temperature based on the available power provided by the generator and/or other sources (e.g., solar power). The management control system 802 may lower or even shut off processing and water heating to lower the load on the generator until power is restored or another power source is available (e.g., daylight with available solar power). Accordingly, the management control system 802 may dynamically manage the processing load and water temperature based on available power.

It is understood that alternate energy sources may be used even if sufficient electric grid power is available, and that the use of such alternate sources may be based on cost, energy needs, and/or other factors as determined by the management control system 802 and/or received instructions. In some embodiments, the management control system 802 may be configured to harvest hot air, steam, and/or water pressure for conversion to electrical power.

The management control system 802 may be configured to perform diagnostics for predictive and/or reactive maintenance monitoring of the processing components (e.g., processors and memory), other components of the processing module (e.g., cooling and thermal transfer components, including leakage of dielectric and/or other system fluids), and/or components that are coupled to the processing module but are not part of the processing module (e.g., the hot water tank, pipes, and valves). By monitoring the components and overall system for indicators of possible failure, issues may be detected and addressed prior to actual failure.

For example, if an unexpectedly high amount of heat is being generated by the processing tasks, the management control system 802 may be configured to analyze the cooling and thermal transfer components to ensure that they are functioning properly. If they are functioning properly, the management control system 802 may determine whether the heat sink (e.g., the hot water tank, swimming pool, and/or other thermal sinks used to dispose of the heat generated by the processors) are providing a sufficient temperature differential. Such diagnostics may be applied in many different ways across all parts of the system to prevent failures and/or identify failures that occur.

Safety devices, such as an electro-mechanical safety shut-off for the processors, may be triggered automatically and/or by the management control system 104 at the occurrence of certain events. For example, if the temperature of the processors, circuit boards, and/or other components passes a defined threshold, those components may be shut off. In certain situations where the heat is excessive, the entire processing module 102 may be shut down. If there is a failure (including a loss of power) that requires the processing module to shut down, the management control system 802 may indicate to any networked devices that it is going offline before shutting down. In such embodiments, the processor module 102 may be coupled to a battery backup or similar device that provides a limited amount of power to the processing module after main power is lost.

In cases where failure occurs and a reboot or shutdown is performed, the management control system 802 may be configured to automatically reboot or restart the processing module 102, or external commands may be used to manage such actions. Upon reboot or restart, the management control system 802 may restart any processing tasks that were running when the reboot or restart occurred, may message a remote system to indicate that it is ready for processing data, or may wait for additional instructions prior to restarting the processing tasks. Any such restart may include synchronizing with external devices and/or systems in order to reconnect dropped connections, sending messages (e.g., notifications and/or diagnostics), and/or receiving instructions.

The management control system 802 may be configured to detect and respond to the loss of network connections, including local networks and the internet, by taking actions in an attempt to reconnect. Processing tasks may continue and/or be suspended during such connection loss, depending on the particular tasks and/or configuration of the management control system 802. For example, processing tasks may be tasks for which security is a priority, and loss of a connection prevents the management control system 802 from reporting any possible unauthorized access attempts. Accordingly, loss of network connection or loss for a particular amount of time may trigger a response from the management control system 802, such as erasing the processing tasks and memory in order to prevent the possibility of unauthorized access.

In other embodiments, if the network connection is lost or if the connection becomes slow or unstable, the management control system 802 may enter a low/no bandwidth mode and continue processing any remaining assigned data as long as there is sufficient storage space to store the processing results. If there is not sufficient storage space or if there is no more assigned data to process, the management control system 802 may instead process local data. For example, the management control system 802 may compress local security camera footage, perform rendering tasks that are not prioritized unless there is downtime, perform batch processing of data associated with the home or other local locations (e.g., from the water heater and/or appliances), download data from an automobile or other sources, and/or perform other data retrieval and/or processing tasks that can be accomplished using only the local network.

In some embodiments, data may be transferred for batch processing at a later time. For example, if the connection is relatively low bandwidth for the amount of data to be processed, the data may be transferred over time. Once the data is received, the data may be processed relatively quickly and sent back out. This enables low speed data to be buffered (e.g., task buffering) for later processing at peak processing times.

Accordingly, as shown in FIG. 8, the management control system 802 may calculate the processing load based on many different factors to maximize user value and/or achieve other prioritized goals. The management control system 802 may account for electricity and water costs 804, environmental data 806 (e.g., current and predicted temperatures), current and projected market prices for processing tasks 808, regulatory requirements and/or local ordinances 810, contractual obligations 812 (e.g., the requirement to perform a certain amount of processing in return for use of the processing module 102), carbon taxes and credits 814, and/or grid load 816.

Additional information may be received in the form of thermal output indicators and/or processing load indicators 818 and other monitoring data 820 (e.g., ambient temperature near the processing module 102, current and predicted weather information such as temperature and humidity, hot water temperature, and/or device proximity (e.g., the location of devices such as mobile phones indicating the presence or absence of people)). Weather data may be used to predict the possibility of grid strain (e.g., based on extremely high or low predicted temperatures) and/or to estimate needed grid power based on weather events that may affect the availability of wind and solar energy. For example, if an ice storm is predicted, the hot water temperature may be increased beforehand to reduce the need for electricity during the storm.

Input parameters for minimum and maximum thresholds and ranges may also be considered, including thermal output parameters 822 (e.g., maximum processor temperatures), processing parameters 824, and/or water temperatures 826. The input parameters may allow for user inputs to override calculated schedules. For example, if a family is expecting guests for the weekend, user inputs may indicate that additional hot water will be needed, and these inputs may override the calculated weekend schedule.

In some embodiments, inputs may be received in the form of location information, such as global positioning system (GPS) information and/or network information such as internet protocol (IP) address information. For example, GPS and/or IP address information may be used to determine whether people are present (e.g., presence information), and adjustments may be made based on the number of people and/or the normal behavior of the people present. In some examples, the presence of particular devices may be identified using, for example, a mobile identification number (MIN), a mobile subscription identification number (MSIN), and/or an international mobile subscriber identity (IMSI).

By identifying the presence of a particular device and potentially monitoring the device to see if it is being moved, additional adjustments may be made. For example, if an occupant of a home tends to take longer showers than other occupants but is not always home, the presence of the phone may be used as an input for machine learning to increase the amount of hot water at the time the user of the device generally takes a shower. On days where the device is not present and therefore the user is likely not present, the amount of hot water may be adjusted to account for the expected lower demand. A profile may be built over time for a particular user, identified by a mobile device and/or in other ways, and that profile may then be used as an input in managing the system.

Some or all of these inputs and/or others may be used by controller logic 828 to calculate processing loads balanced with water needs, and then manage the processing loads of one or more processing modules 102 in an attempt to achieve desired results. It is understood that many different factors may determine whether a particular desired result may be achieved, including external and/or unexpected factors, but the controller logic 828 of the management control system 802 may be configured to balance the factors as much as possible. Weighting certain factors may provide prioritization guidance to the management control system 802, enabling it to calculate processing loads that are optimal in various scenarios based on the available information.

Monitoring, control, and/or usage data (e.g., BTU and CPU usage and production levels) 830 may be provided by the controller logic 828 using a GUI, web pages, and/or other means. For example, the GUI may be provided by an application on a mobile device, and may provide interfaces for altering various processing parameters, displaying sensor information, and/or performing other functions. Sensor information may be obtained from various types of sensors and may include information related to vibration, voltage, fluid flow, pressure, humidity, temperature, security concerns (e.g., physical access detection), and/or other types of information.

Usage data may be provided to allow for dynamic billing of electricity and water use, and compensation for processing tasks. This negates the need for meter reads or other time consuming billing or compensation processes by allowing for real time monitoring of costs and earnings. The GUI, web page, and/or other interface may be used to illustrate the benefits provided by the system, specifically indicating energy saved, amounts earned by processing, the applicability of any reimbursement programs, and/or similar customer facing information in order to quantify the benefits of the system for the user.

Figure 10:
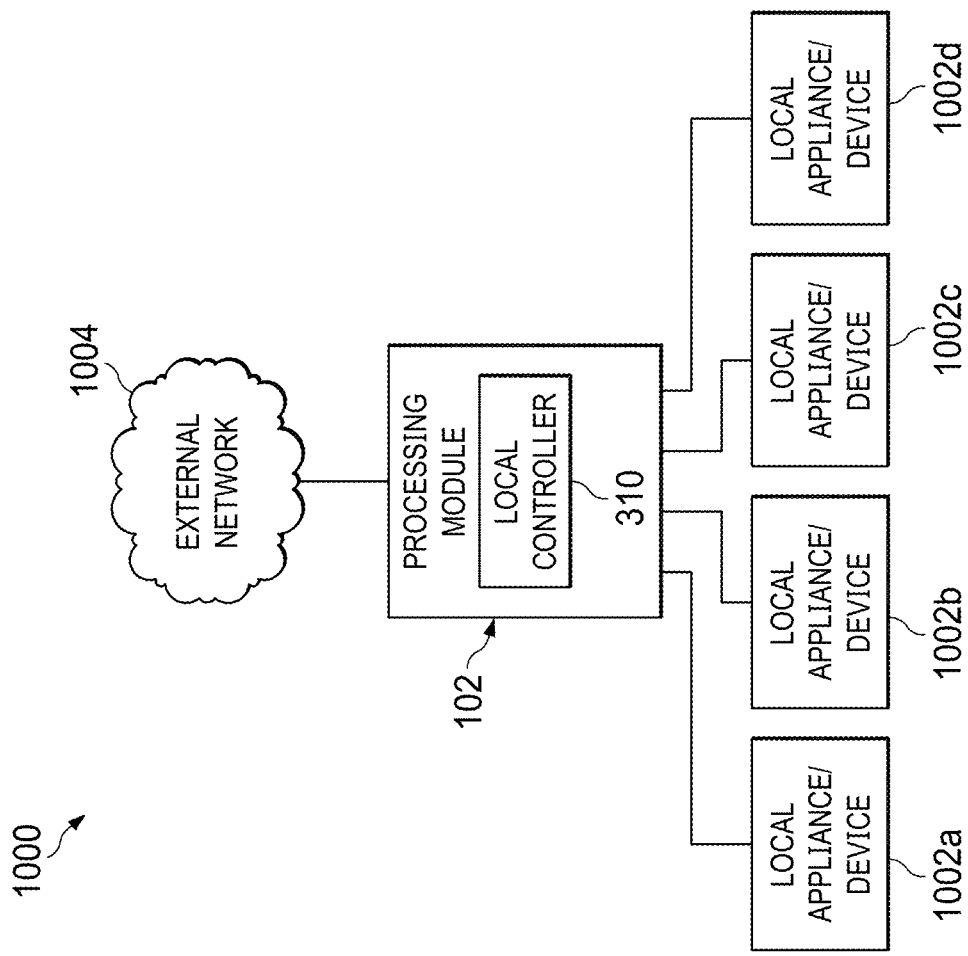
FIG. 10 illustrates one embodiment of an environment with a processing module serving as a hub for local appliances and devices.

Referring to FIG. 10, one embodiment of an environment 1000 illustrates the processing module 102 as a hub for appliances and other devices 1002*a*-1002*d* in a system that may include residential, commercial, and/or public structures, such as homes, apartment buildings, businesses, office complexes, schools, and industrial facilities, as well as large vehicles such as motorhomes, buses, trains, airplanes, boats, and ships. The processing module 102, which may have a relatively significant amount of processing power compared to other home appliances and devices, may provide processing power and/or connectivity for other devices via external network 1004. Such processing may be relatively low latency, as the connection to the processing module 102/local controller 310 is local. The coupled appliances and devices 1002*a*-1002*d* may be smart or dumb in terms of their integrated functions. By handling the processing needed by appliances and other devices, the functionality of such appliances and devices may be extended to provide additional functions beyond their software and/or hardware limits in a local manner.

The responsiveness and/or power use of such appliances and devices may also be improved. For example, devices that ordinarily send data for external processing may instead send the data to the processing module 102, which may either process the data itself or may manage the sending and receiving of the data with other devices. In this manner, the processing module 102 may provide additional intelligence to networked devices and may serve as a network router to manage internal and/or external network communications.

The combination of various appliances and devices, either from a system managed by a single processing module 102 or by combining systems to access multiple processing modules (as described with respect to FIGS. 11B and 12A-12C), enables the formation of a system (e.g., a server farm) that can be used to provide additional processing capabilities. For example, many appliances and devices in a home or business use little of their available processing power most of the time. This processing power may be harnessed by the processing module 102 and made available for more general use, including the processing tasks described herein. Machine learning, rendering, processing used to produce text, art, and/or other expressions by artificial intelligence (e.g., as embodied in neural network models), gaming, and other relatively processing intensive activities may all be supported. The use of such devices may be balanced with the resulting higher level of energy consumption to ensure that such processing does not have a negative overall impact.

Referring to FIG. 11A, one embodiment of an environment 1100 illustrates the local controller 310/642 of a processing module 102 coupled to a remote monitor and/or controller 1102. In other embodiments, the remote monitor/controller 1102 may be coupled to the processing module 102 without using a local controller. The remote monitor/controller 1102 may be used to monitor and/or manage the processing tasks and/or other operations of the processing module 102 using the management control system 802. For example, if the processing module 102 is performing cryptocurrency mining operations, the processing module's contribution to a mining pool may be monitored. In some cases, the processing module 102 may be provided by the third party who uses the remote monitor to compensate the home or business owner based on their contribution.

As an example, assume that a company wants to expand cryptocurrency mining operations or other distributable computing tasks that take large amounts of processing power. The company may provide the processing module 102 to a homeowner who agrees to connect it to their hot water tank. The company gets processing power with electricity provided by the home and the homeowner gets a more efficient hot water system. In some embodiments, the homeowner may receive a portion of the mining value, further incentivizing adaption and use of the processing module 102. The remote monitor/controller 1102 may be used to ensure the continued operation and health of the processing module 102, as well as verify the value of the mining contributed by that processing module 102.

In other embodiments, the remote monitor/controller 1102 may be used by the homeowner to view and/or change the operation of the processing module 102 without needing to physically interact with the processing module 102. In still other embodiments, the remote monitor/controller 1102 may be provided by and/or used by a utility company, such as an electric company, to view and/or change the operation of the processing module 102.

It is understood that the remote monitor/controller 1102 may have full access to the operations of the processing module 102, or access may be limited to certain functions for security or other reasons. Accordingly, the remote monitor/controller 1102 may include and execute some or all of the management control system 802 depending on the particular configuration and/or access rights of the remote monitor/controller 1102. In some embodiments, the remote monitor/controller 1102 may calculate a schedule and then send the schedule to the processing module 102 for execution. The schedule may be overridable or modifiable by local parameters or data, or may be unchangeable without permission from the remote monitor/controller 1102. In other embodiments, the remote monitor/controller 1102 may simply provide access to the local controller 310/642 of the processing module 102.

Due to the potentially sensitive nature of the data being processed by the processing module 102, security may be provided in different forms. Physical security may be provided by locking the case 102 itself and/or placing the processing module 102 in a locked room or cabinet, and electronic security may be used to monitor the case, room, or cabinet for signs of unauthorized access. If unauthorized access is detected or the processing module 102 is accessed in other unauthorized ways (e.g., via network intrusion), the memory of the processing module may be erased, encrypted, or otherwise secured to ensure that the data is not accessible.

Security may also be provided via location information, including GPS and/or IP address information. For example, if the processing module 102 is supposed to be at one location, but is detected at another location, security measures may be taken. Such security measures may include stopping any processing tasks, locking the system to prevent local access, and/or securing the data. If a physical security breach is detected by sensors, computer vision, and/or in other ways, automated responses may be employed, such as sending messages and/or making calls to initiate a physical response by security or police. The use of location information may also prevent the processing module 102 from being used in a different location than authorized, and/or to detect the need to modify scheduling or other processes to account for different weather patterns and similar changes that may occur due to location differences.

Such location information may also be used to assign processing tasks. For example, contractual obligations or export laws may require that data to be processed remains in a particular country or other geographic area, and the location information may be used to confirm compliance. A geofence may be formed and suitable processing modules 102 within the geofence may be selected for processing the data, while processing modules that are outside the geofence may be removed from consideration. Location based requirements (e.g., laws controlling the viewing of certain materials) may be enforced in this manner. User based preferences may also be applied, such as users preferring not to process certain types of data based on moral or other objections.

Referring to FIG. 11B, one embodiment of an environment 1110 within which aspects of the present disclosure may be practiced illustrates a remote monitor/controller 1112 coupled to local controllers 310a-310d of processing modules 102a-102d, respectively. The remote monitor/controller 1112 may be used to monitor and/or manage the processing tasks and/or other operations of the processing modules 102a-102d. It is understood that each processing module 102a-102d may be coupled to multiple appliances and devices as illustrated with respect to FIG. 10.

The processing modules 102a-102d may be in a single home or business, may be part of a larger relationship (e.g., in an office building or apartment complex, hotel, or rental units), or may be in a distributed system that is associated only at the level of the remote monitor/controller 1112, such as a business that provides processing modules along with electricity or installs them contractually on a per unit basis for distributed processing. In other embodiments, a different controller may be used within one or more of the processing modules 102a-102d, or the remote monitor/controller 1112 may monitor and/or control a processing module without using a local controller.

The remote monitor/controller 1112 may be similar or identical to the remote monitor/controller 1102 of FIG. 11A or may be different. For example, the remote monitor/controller 1102 may provide an interface to the processing module 102 for an immediate user, while the remote monitor/controller 1112 may provide access to distributed processing modules 102a-102d that may or may not be accessible to the user. This enables a user such as a homeowner to remotely access their processing module, but not processing modules that are part of the environment 1100 but not under their control.

The remote monitor/controller 1112 may include and execute some or all of the management control system 802 depending on the particular configuration and/or access rights of the remote monitor/controller 1112 in a manner similar to that discussed with respect to the remote monitor/controller 1102. The environment 1100 enables the remote monitor/controller 1112 to view and manage the processing modules 102a-102d from a system-wide perspective, including the provision of dynamic grid support. For example, the remote monitor/controller 1112 may calculate processing loads across the processing modules 102a-102d to maximize processing load relative to water usage. This enables optimization of the system itself, while taking the individual parameters of each of the processing modules 102a-102d into account.

In other embodiments, the processing modules 102a-102d may be managed locally with each node working with other nodes (e.g., using a mesh or area network with no central controller). For example, a system may be deployed where the first installed processing module is a master node and later installed processing modules are slave nodes. Alternatively, or additionally, the processing module with the highest bandwidth, most processing power, and/or other prioritized attributes may be the master node, and the master node may switch if parameters change or if the current master node becomes unavailable. Accordingly, it is understood that many different configurations of processing modules and controllers may be implemented, and each configuration may use some or all of the management control system 802.

In some embodiments, the processing modules 102a-102d may be used to provide a networked or edge computing system, as indicated by connections between the processing modules. For example, using an intertwined decentralized container connection protocol, multiple processing modules may be linked together via a wide range network, which may enable control and synchronization across multiple nodes within a localized area. This means that processing modules may be controlled without the necessity of a centralized network, and compute may be shared and load balanced across localized systems.

The remote controller 1112 may assign processing tasks to local controllers 210a-210d based on one or more factors that may include geographic location. For example, in managing grid load over an area, the remote controller 1112 may receive or otherwise identify a set of local controllers that fall within a particular geographic area that has been affected by high demand, infrastructure failures (e.g., a downed power line, a generator going offline, and/or a blown transformer), and/or other factors. The remote controller 1112 may reduce the power used by the processing module 102 and/or hot water tank 104 in order to reduce the grid load in that area.

This provides dynamic grid support that may be ramped up and down as needed, enabling the management control system 802 to balance the processing load/hot water temperature with the demands on the grid. In extreme cases, the management control system 802 may suspend or minimize processing and/or shut off the hot water tank 104 until the grid stabilizes. While this may have a minimal impact on grid performance when done at a single house, implementing dynamic grid support over a wide area may have a significant impact. Using the remote controller 1112, which may have a more comprehensive overview of the grid than a single local controller, problems or potential problems with the grid may be managed more optimally.

In some embodiments, the use of a distributed network of processing modules 102 and hot water tanks 104 may be used to minimize or eliminate data loss and/or the loss of computing power that may occur if data and/or computing tasks are assigned to a single or a relatively small number of processing modules 102. Loss may occur for various reasons, including the failure of a processing module 102 or the limitations of a single processing module 102 to perform processing for long periods of time due to, for example, insufficient hot water use resulting in a heat sink that is unable to support heavy and sustained processing loads. In the latter case, for example, a processing module 102 located in a home may not be able to run as a full time server due to lack of hot water use, and the processing module 102 may be used with other distributed processing modules to provide full server uptime.

By implementing a system in which data and/or tasks are assigned in a redundant manner to different processing modules 102, the partial or complete loss of a processing module 102 may be compensated for by the performance of other processing modules 102. In such systems, prioritization may occur where one or more processing modules 102 are the priority processors for certain data/tasks, and other processing modules 102 take over the data/tasks only if the priority processors fail. In other such systems, data/tasks may be distributed to multiple processing modules 102 for simultaneous processing. This may occur to ensure that the failure of a processing node does not delay the processing, such as for high value data/tasks where the stability of processing and/or timely completion are important. In still other systems, load balancing may occur to ensure that data/tasks are being handled in an efficient manner. Such systems may use lower peak, but more sustained, processing over multiple processing nodes 102. It is understood that many different data/task distributions may be used across a system of processing modules 102, and the processing modules 102 may or may not be aware of the other processing modules in the system.

In some embodiments, the use of distributed systems of processing modules 102 and hot water tanks 104 may be used to balance compute power across geographic areas by leveraging variations in regional schedules. For example, an implementation may be directed at maintaining a particular level of available processing power. In such an implementation, at any given time, one geographic area of the system may be experiencing relatively high hot water use and relatively low compute, while another geographic area of the system may be experiencing relatively low hot water use and relatively high compute. This may occur if a resident in New York is at work using compute power and a resident in Los Angeles is taking a shower. By identifying such patterns and using them to balance loads across the system, the average performance across the distributed computing network may be maintained.

Figure 12A:
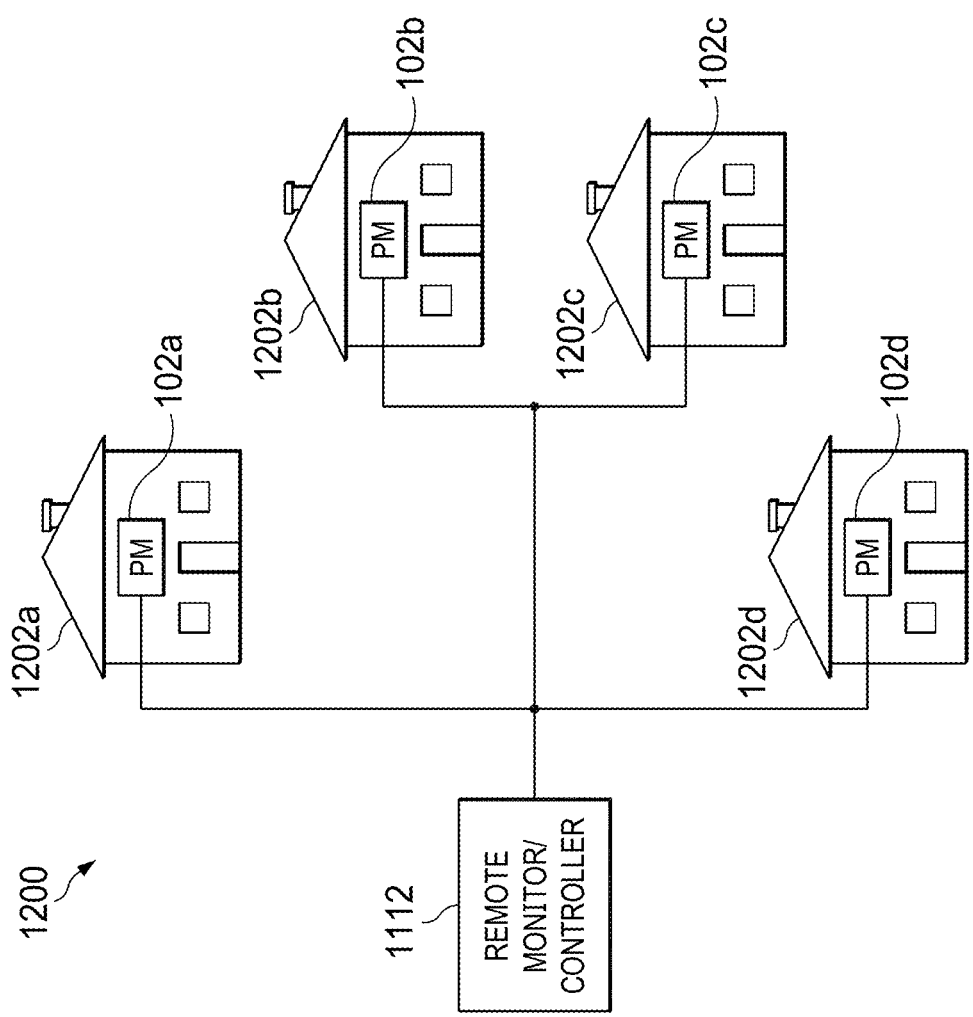
FIGS. 12A and 12B illustrate embodiments of an environment within which the multiple processing modules of FIG. 11A may be used.

With additional reference to FIG. 12A, one embodiment of an environment 1200 illustrates multiple homes 1202a-1202d. Each of the homes 1202a-1202d may include a processing module 102a-102d, respectively, coupled to a remote controller as described above with respect to FIG. 11B, and each processing module may be coupled to multiple appliances and devices as described above with respect to FIG. 10. Accordingly, the processing modules present in some or all of the homes 1202a-1202r may be used as a distributed processing system (e.g., a distributed server farm). The processing capabilities may vary over time based on the demand in each home for hot water, the available heat sinks (e.g., the presence of a swimming pool), parameters for electrical consumption, and/or other factors as described in the present disclosure.

Figure 12B:
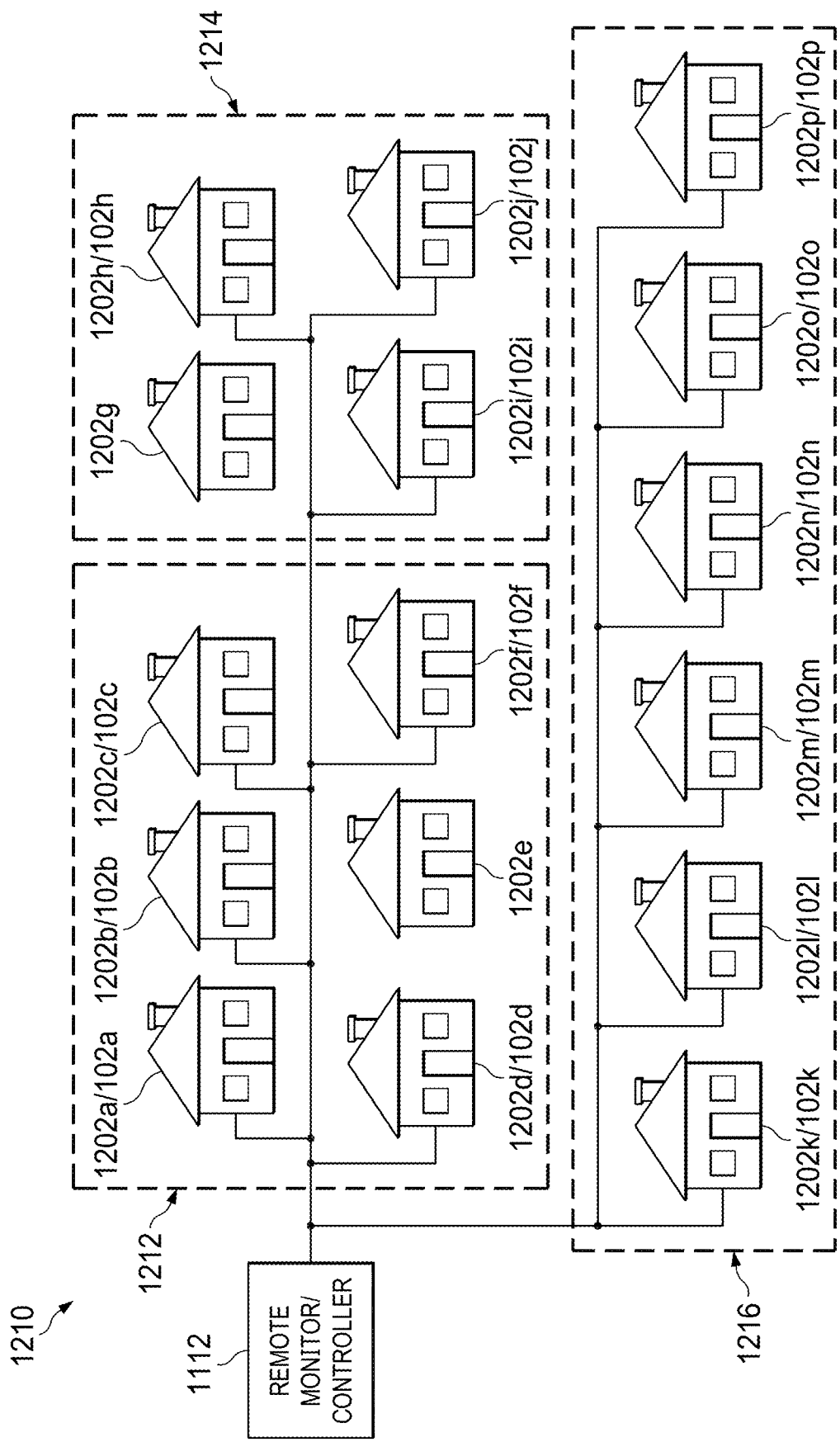

With additional reference to FIG. 12B, one embodiment of an environment 1210 illustrates multiple homes 1202a-1202p. It is understood that the homes represent many different types of residential, commercial, and public structures, including homes, apartment buildings, businesses, office complexes, schools, and industrial facilities, as well as large vehicles such as motorhomes, buses, trains, airplanes, boats, and ships. Some or all of the homes 1202a-1202p may include a processing module 102 coupled to a remote controller as described above with respect to FIGS. 11B and 12A, and each processing module may be coupled to multiple appliances and devices as described above with respect to FIG. 10. Accordingly, the processing modules present in some or all of the homes 1202a-1202p may be used as a distributed processing system (e.g., a distributed server farm). The processing capabilities may vary over time based on the demand in each home for hot water, the available heat sinks (e.g., the presence of a swimming pool), parameters for electrical consumption, and/or other factors as described in the present disclosure.

The homes 1202a-1202p may be viewed as a single processing system, or may be subdivided into multiple sections, such as sections 1212, 1214, and 1216. Each section may represent a particular geographic area, enabling the processing capabilities to be turned on and off, or otherwise managed, based on the weather, grid load, and other factors for that geographic area.

Figure 12C:
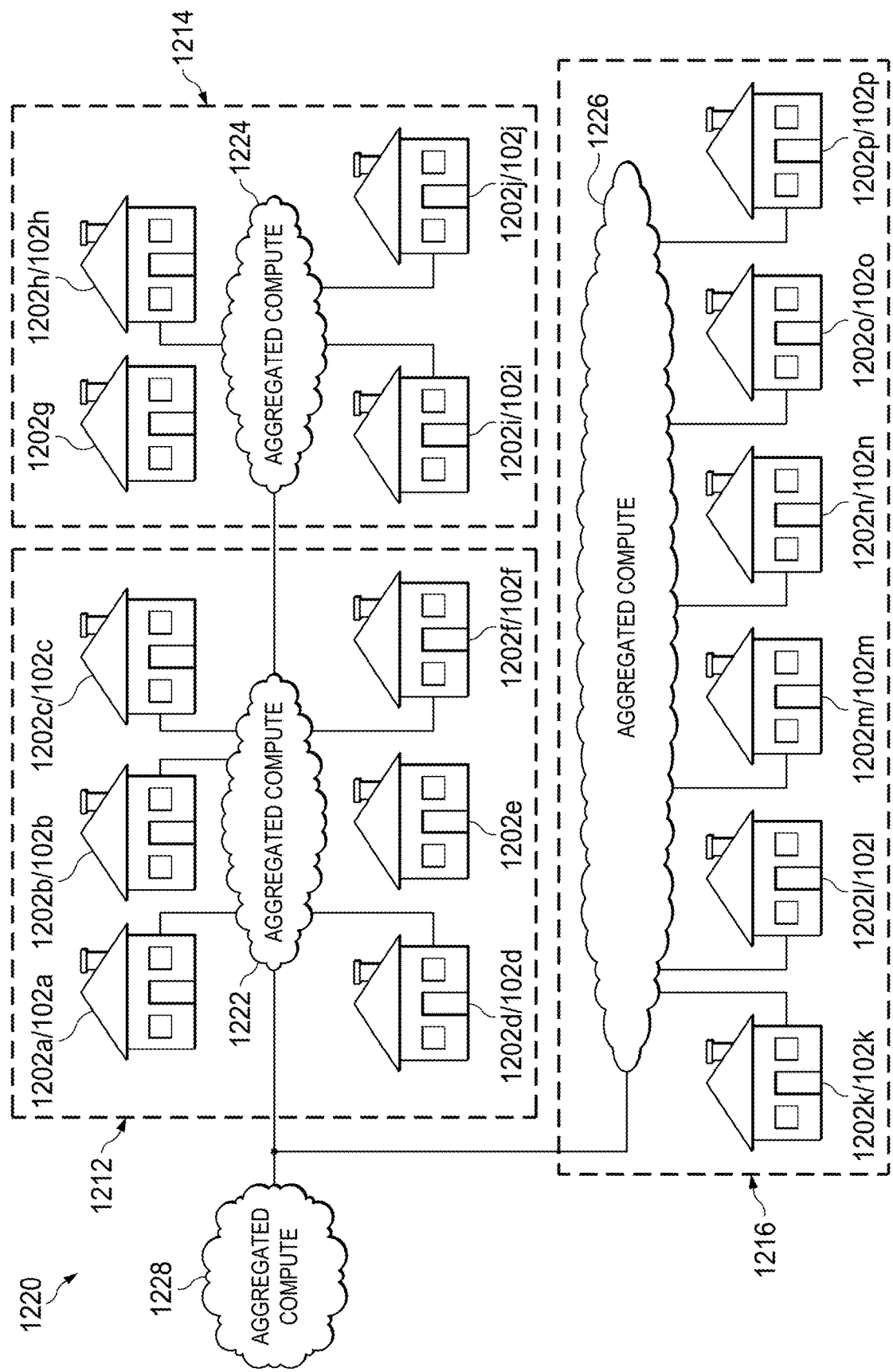
FIG. 12C illustrates one embodiment of an environment within which multiple processing modules may be used for aggregated compute.

With additional reference to FIG. 12C, one embodiment of an environment 1220, which may be similar or identical to the environment 1210 of FIG. 12B, illustrates multiple homes 1202a-1202p. In the present example, the processing capabilities provided by the processing module 102 associated with some or all of the homes 1202a-1202p may be used to provide aggregated compute functionality. The aggregated compute may be provided over smaller, localized areas (e.g., aggregated compute 1222 for section 1212, aggregated compute 1224 for section 1214, and aggregated compute 1226 for section 1216), or may combine areas for additional compute capability, such as aggregated compute 1228.

Figure 13:
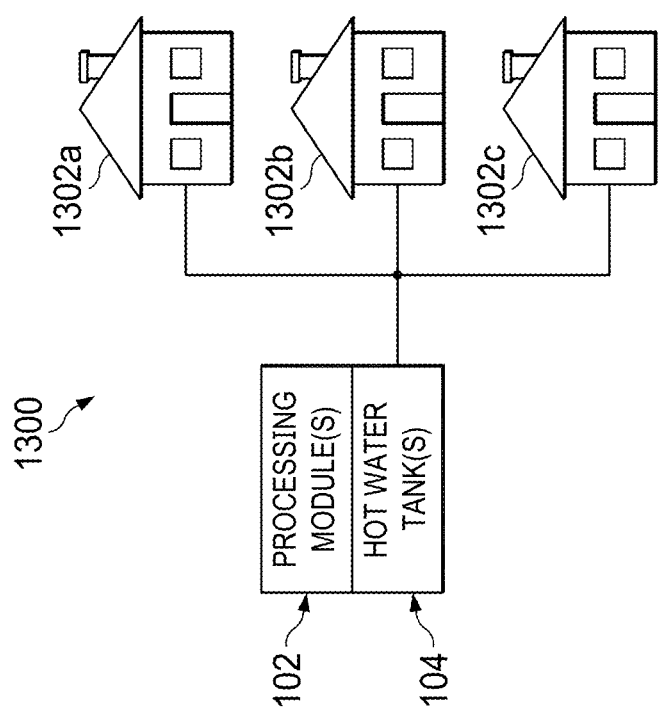

Referring to FIG. 13, one embodiment of an environment 1300 illustrates the use of one or more processing modules 102 across a larger geographic area, such as a neighborhood or district. In such embodiments, multiple structures 1302a-1302c may be coupled to one or more centralized hot water tanks 104. As described in other embodiments, the processing module(s) 102 may be used to provide heat for the hot water tanks 104.

Figure 14:
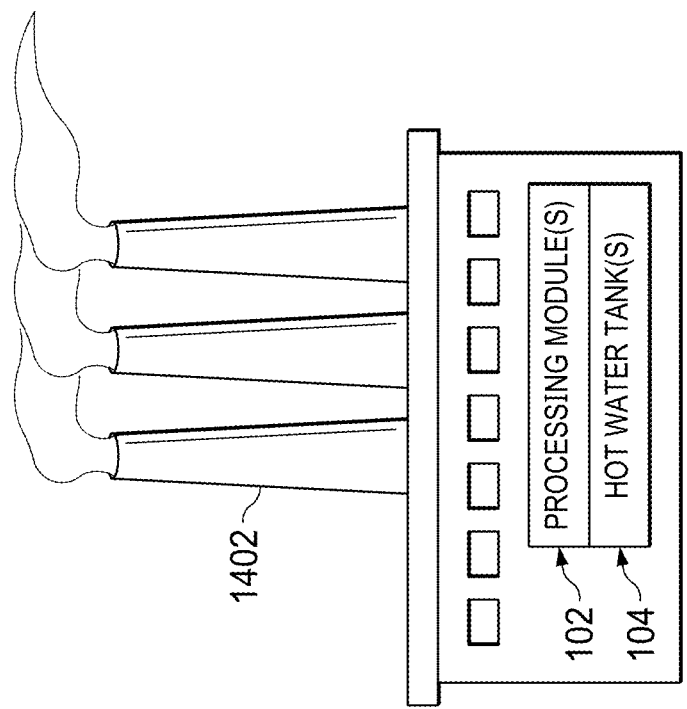
FIGS. 13-18 illustrate various embodiments of environments within which a processing module may be used.

Referring to FIGS. 14-19D, various embodiments of environments within which one or more processing modules 102 may be deployed are illustrated. FIG. 14 shows an embodiment illustrating an industrial facility 1402. In some embodiments, the industrial facility 1402 may be used to create sufficient heat levels needed to distill saltwater or contaminated water in order to generate freshwater. Such facilities may use dielectric fluids, heat pumps, and/or any form of heat exchanger system. For example, the facility 1402 may be a coastal server farm or a desert community water desalination plant that can simultaneously provide significant processing along with water distillation. In another example, a rural or relatively undeveloped area may be provided with both processing capabilities and clean water by the deployment of a processing module 102. By providing relatively continuous water filtration, smaller units may be deployed to provide a clean water source in remote areas such as cabins, rescue stations, and/or at any location having a need for sanitized water.

Figure 15B:
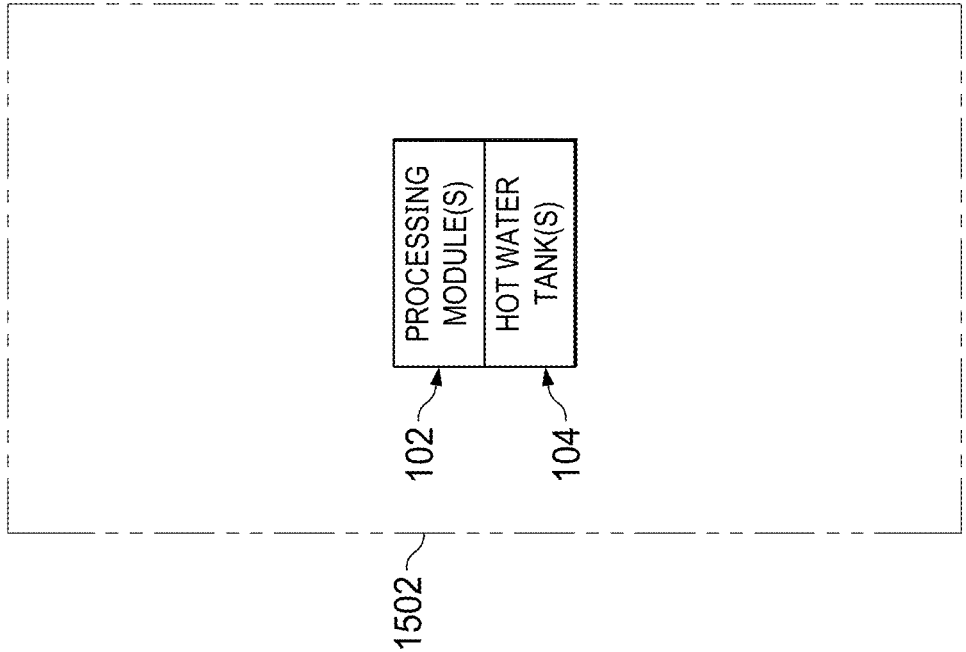
Figure 15A:
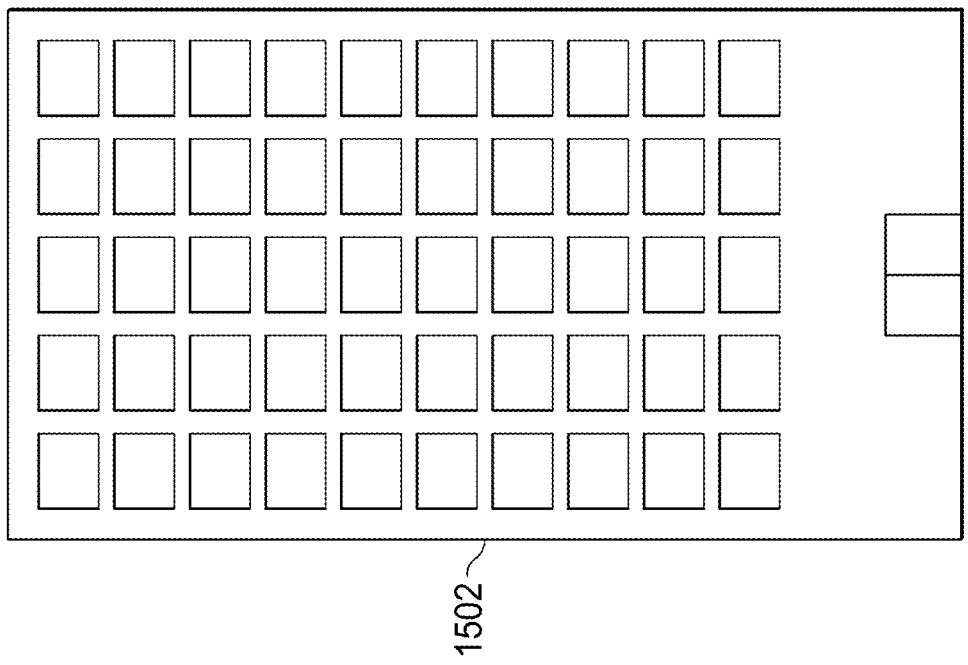

FIGS. 15A and 15G show an embodiment illustrating a multi-unit structure 1502 such as an office building, apartment building, or hotel. For example, a boiler in the structure 1502 or the facility 1402 of FIG. 14 may be fitted (e.g., either retrofitted or as a primary installation) with an inline system that uses a processing module 102 to provide a relatively continuous flow of hot water on an as needed basis. This enables the boiler to provide hotter, additional, and/or more consistent hot water than may otherwise be possible. Using the management control system 802 to control the inline processing module 102, the cost of the additional heat may be offset by earnings generated by the processing tasks.

Figure 16:
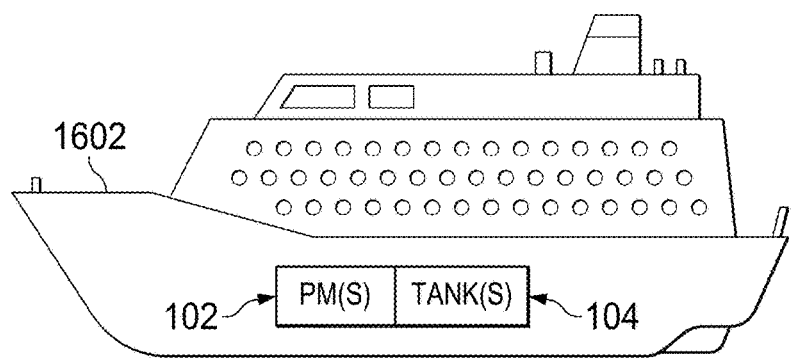
Figure 17:
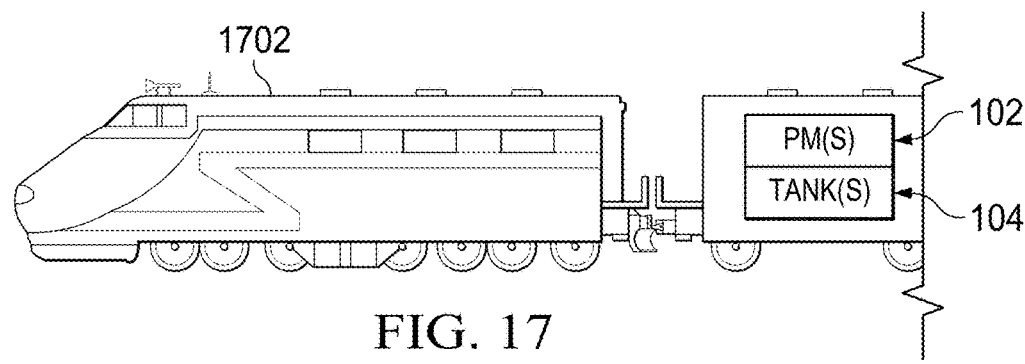
Figure 18:
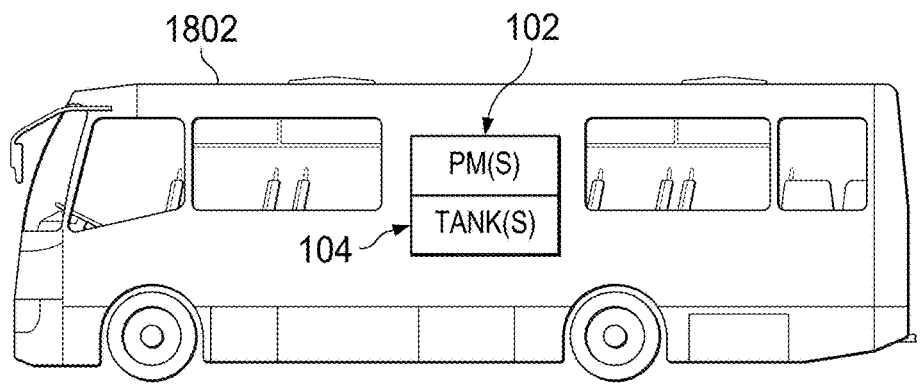

FIG. 16 shows an embodiment illustrating a ship 1602. FIG. 17 shows an embodiment illustrating a train 1702. FIG. 18 shows an embodiment illustrating a motorhome 1802. It is understood that any of the embodiments of FIGS. 9 and 14-19D may be modified to provide hot water using an inline hot water system in addition to, or as an alternative to, a hot water tank.

FIGS. 19A-19D show embodiments of an environment 1900 with a swimming pool 1902 and pool equipment 1904 coupled to processing module(s) 102. The pool equipment 1904 may include pumps, motors, filters, and/or other components used for servicing and operating the swimming pool 1902. It is understood that while the processing module 102 is shown downstream from pool equipment 1904, one or more components of the pool equipment may be downstream from the processing module depending on the particular implementation. It is understood that the processing module 102 may include dielectric fluid and/or be cooled using a heat exchanger or other device, and the water may not directly contact the processors themselves. The processing module 102 may be implemented in a tankless system (e.g., with no hot water tank) or may be coupled to a hot water tank.

Figure 19A:
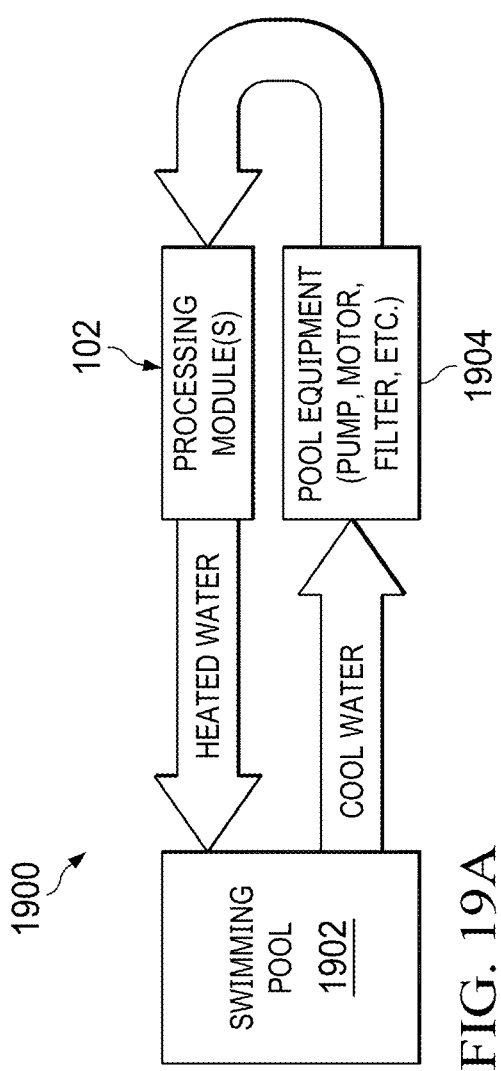
FIGS. 19A-19E illustrate various embodiments of an environment within which a processing module may be used with a swimming pool.
Figure 19B:
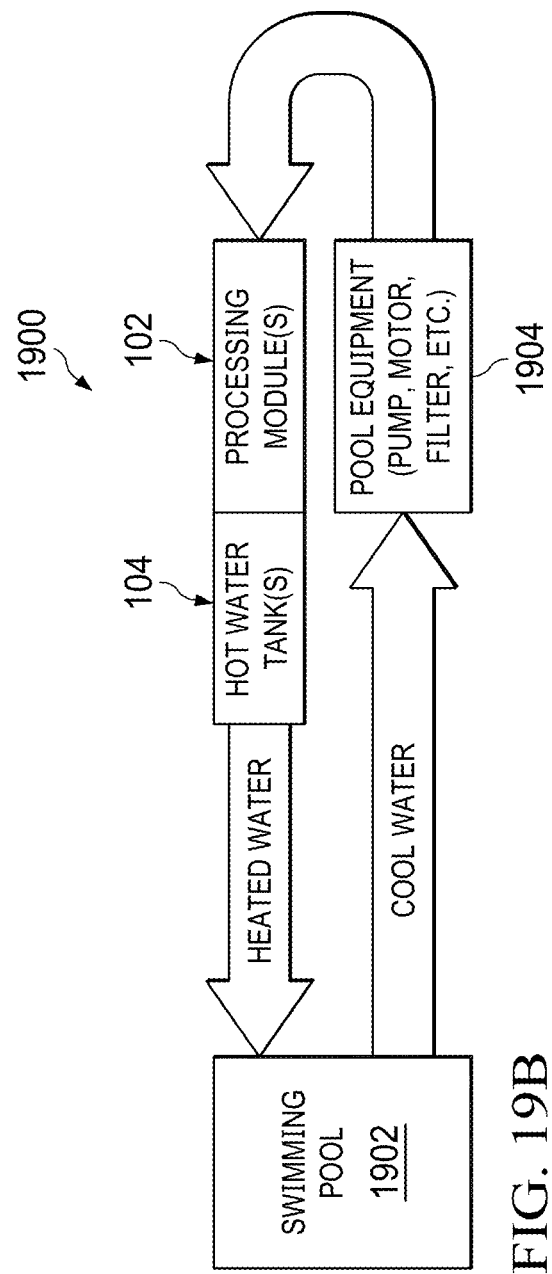
Figure 19C:
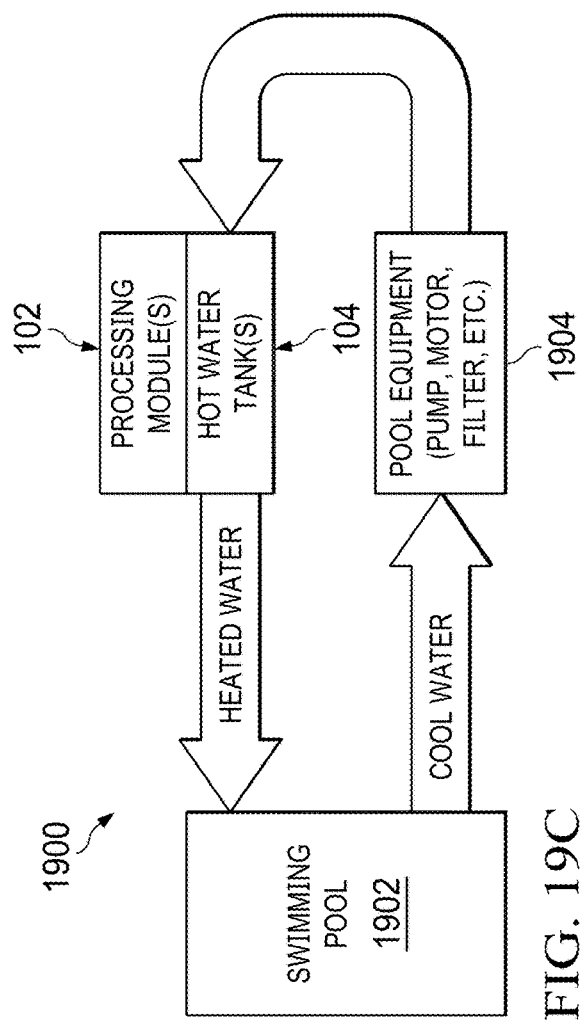

FIG. 19A illustrates an embodiment where the processing module 102 is in-line with the water supply for the swimming pool 1902 and no hot water tank is present. FIG. 19B illustrates an embodiment where the processing module 102 is in-line with the water supply for the swimming pool 1902 and a hot water tank 104 is present for the heated water. FIG. 19C illustrates an embodiment where the processing module 102 is not in-line with the water supply for the swimming pool 1902 and a hot water tank 104 is present for the heated water.

The hot water tank 104 of FIGS. 19B and 19C may be part of the pool equipment 1904 or may be installed specifically for use with the processing module 102. When the hot water tank 104 is part of the existing pool equipment 1904, a circulation loop may be included from the processing module 102 to the hot water tank 104, and heat generated by the processing module 102 may be used to supplement or replace heat provided by an existing pool heater coupled to the hot water tank 104.

Figure 19D:
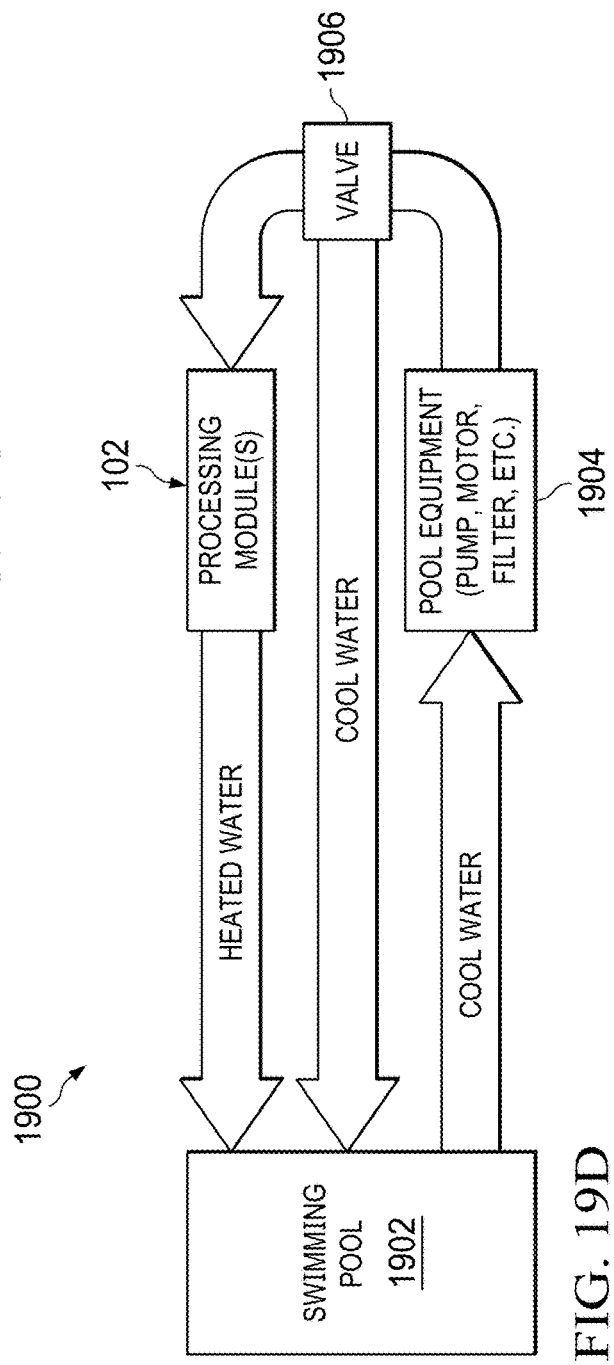

FIG. 19D illustrates an alternate embodiment of FIG. 19A where a valve 1906 is positioned upstream from the processing module 102. The valve 1906 may be used to redirect some or all of the cool water back to the swimming pool 1902 without being heated by the processing module 104. Although not shown, the addition of a hot water tank 104 as shown in FIGS. 19B and 19C provides alternate embodiments of FIG. 19D.

In some embodiments, the local controller 310/642 and/or management control system 802 (FIG. 8) may be configured to change the flow rate of water to the swimming pool 1902 to manage heat levels in the processing module 102 and/or the swimming pool 1902. The flow rate may be monitored (e.g., via a flow rate sensor and/or information from a pool pump) to detect stoppages and/or other flow issues that may impact the cooling of the processing module 102 in order to prevent overheating of the processors.

Figure 19E:
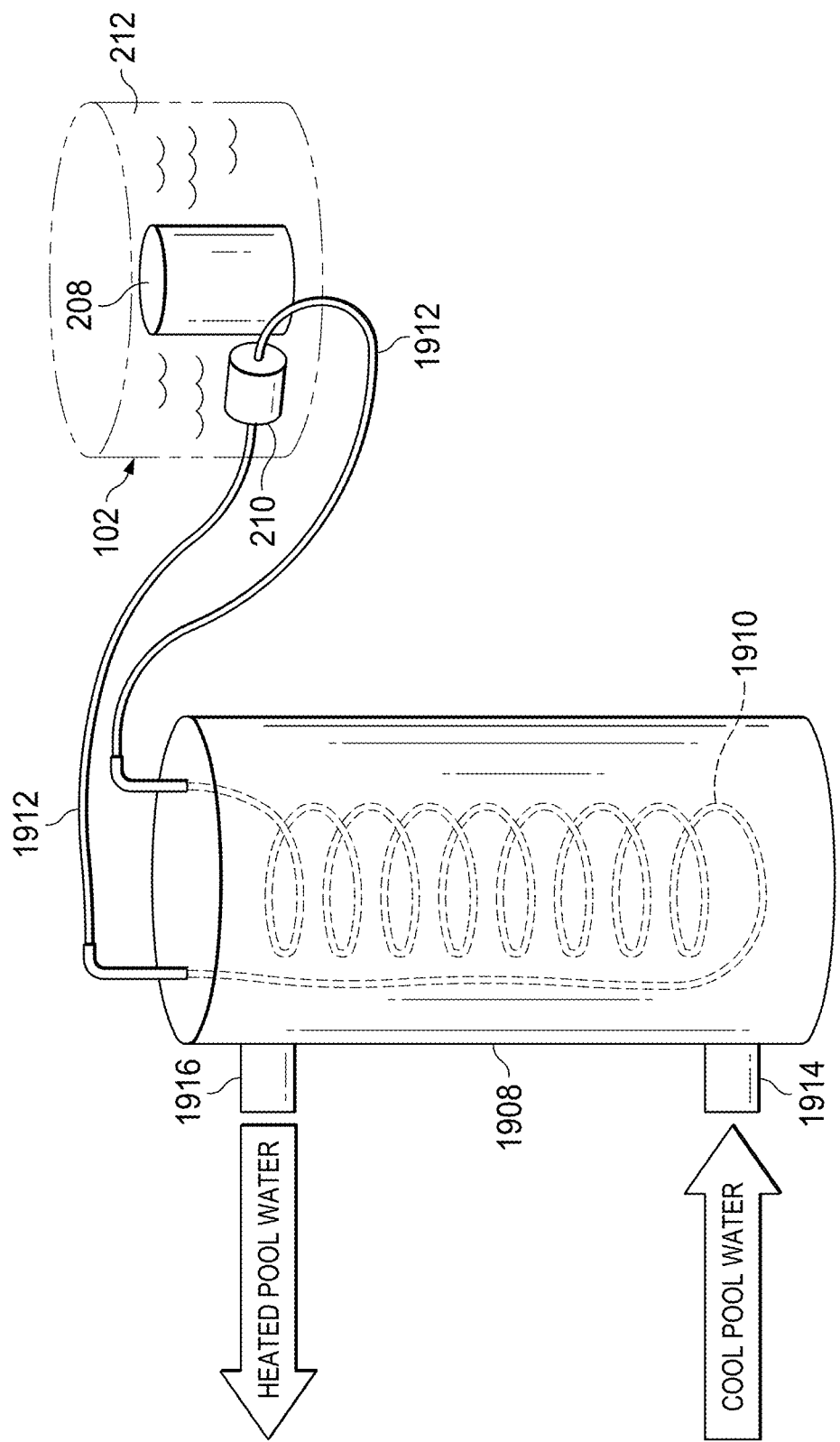

With additional reference to FIG. 19E, one embodiment of the processing module 102 of FIG. 19C is illustrated. The water tank 1908 (which may represent the tank 104 of FIG. 19C) may be part of a heater system already present at the swimming pool or may be installed for use specifically with the processing module 102. For example, the water tank 1908 may be part of a preinstalled heat pump system designed to provide hot water to the swimming pool. In the present example, dielectric fluid 212 from the processing module 102 may be circulated through a heating element/heat exchanger 1910 in the tank 1908 via a pump 210 and fluid conduit(s) 1912. Cool pool water enters the tank 1908 via a cold water inlet 1914, gains thermal energy from the heating element/heat exchanger 1910, and returns to the pool via a hot water outlet 1916.

Figure 20A:
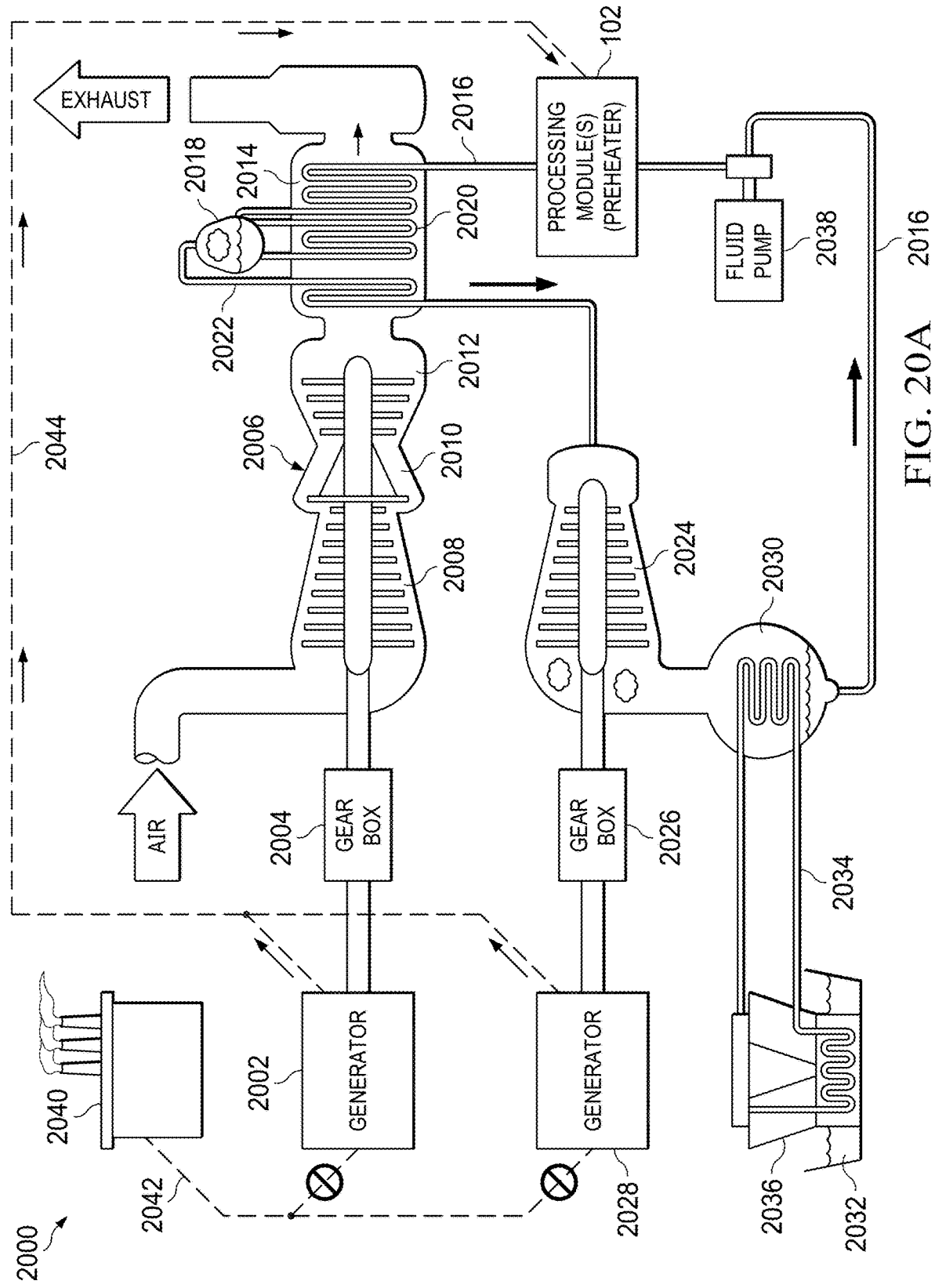
FIGS. 20A-20C illustrate embodiments of an environment within which processing modules may be coupled to a power generation system.
Figure 20B:
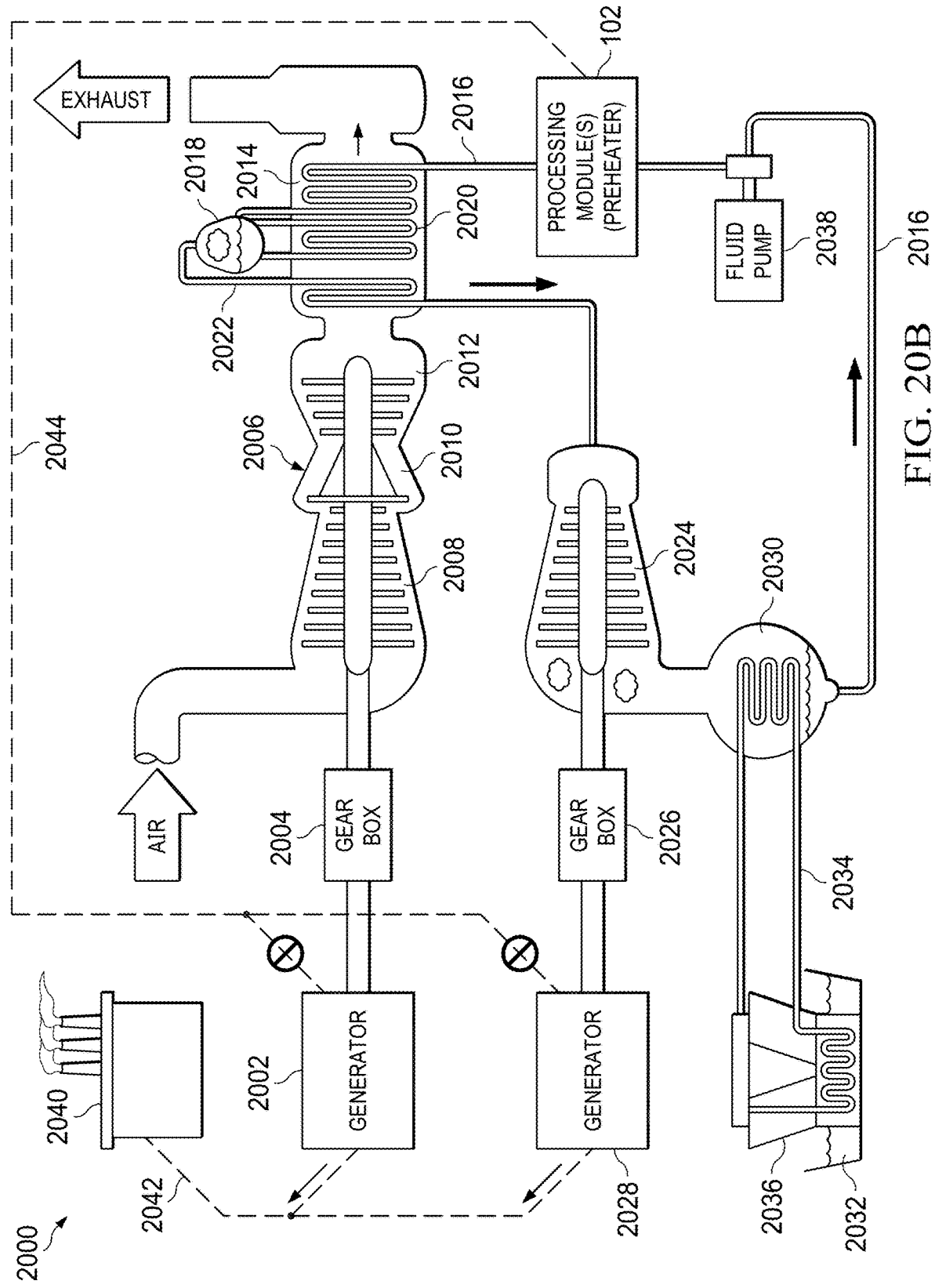
Figure 20C:
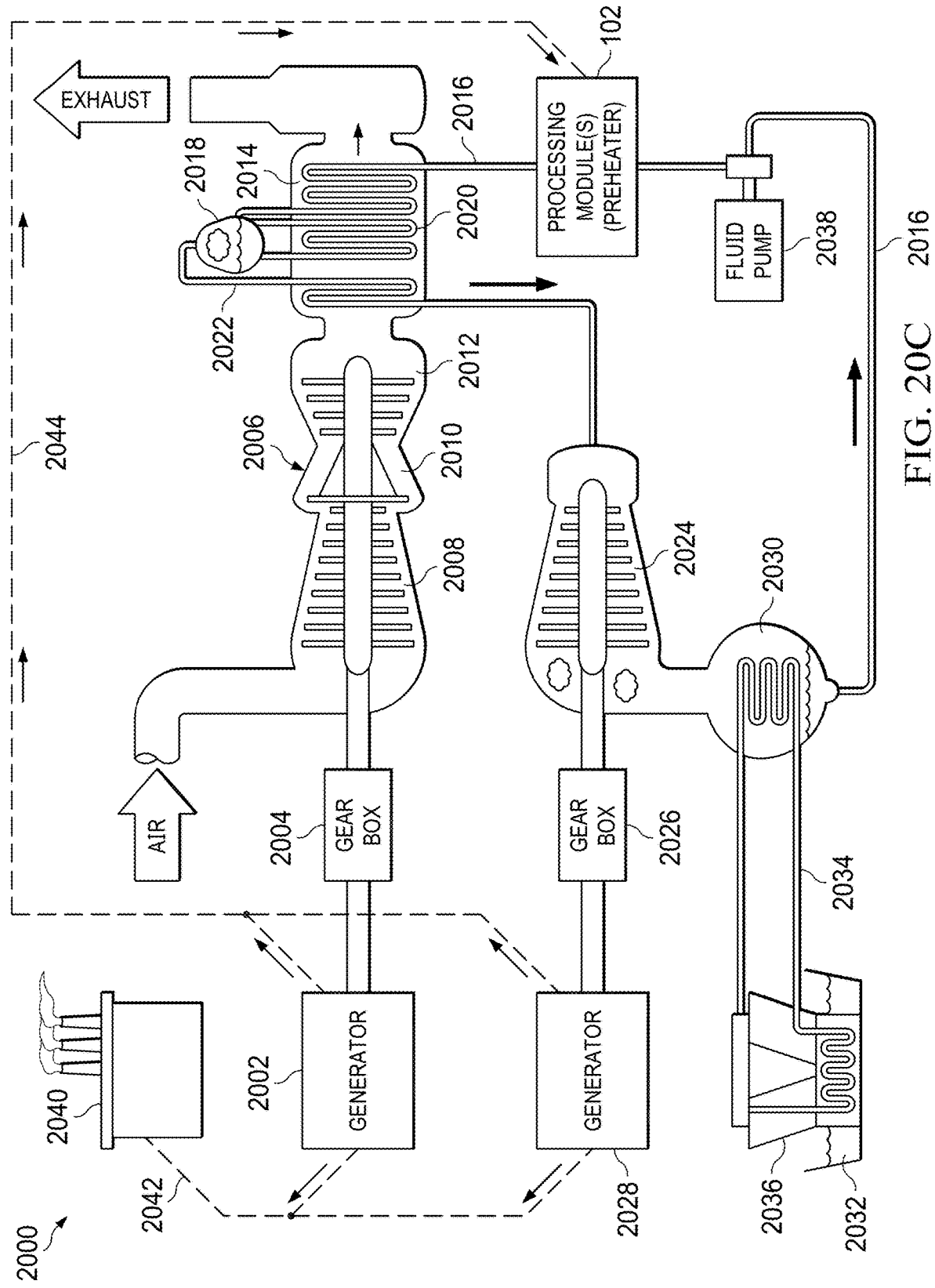

Referring to FIGS. 20A-20C, one embodiment of an environment 2000 illustrates processing module(s) 102 coupled to a power generation system, which is a combined cycle power plant in the present example. As is known, combined cycle power plants may use a gas turbine 2006 that is powered by burning fuel. The gas turbine 2006 produces heated gases as an exhaust and thermal energy from the heated gases is used to produce steam for powering a steam turbine 2024. The steam is then cooled and the cooled fluid is passed through the system to be heated and turned back into steam. Accordingly, the processing module(s) 102 may be coupled to the power generation system to provide one or more benefits, such as access to a direct low-cost power structure for mining or general compute, high utilization of generators that can be reallocated for grid support at a premium when needed, and/or additive free pre-heat for steam turbine fluids.

In operation, the power generation system includes a generator 2002 coupled to a gear box 2004. The gear box 2004 is coupled to a gas turbine 2006. The gas turbine 2006 includes a compressor portion 2008, a combustor portion 2010, and a turbine 2012 coupled to the gear box 2004. Fuel is injected into the combustor portion 2010, which rotates the turbine 2012. The turbine 2012, via the gear box 2004, transfers mechanical power to the generator 2002, which may convert the mechanical power to electricity. The generated power may be sent to a transmission station/substation 2040 for use by the grid via transmission lines 2042.

In addition, hot exhaust from the turbine 2012 is forced into a heat recovery steam generator 2014. Cool fluid enters the steam generator 2014 via a fluid conduit 2016, being heated before it enters a boiler 2018. The boiler 2018 may include a circulation loop 2020 for further heating. Steam leaves the boiler 2018 via a fluid conduit 2022 and enters a steam turbine 2024.

The steam from the fluid conduit 2022 rotates the steam turbine 2024, which in turn transfers mechanical power to a generator 2028 via a gearbox 2026, which may convert the mechanical power to electricity. The generated power may be sent to the transmission station/substation 2040 for use by the grid via transmission lines 2042. The steam passes into a steam condenser 2030, which uses cool water 2032 (e.g., from a river, lake, or sea) passed through a circulation conduit 2034 from a cooling tower 2036 to cool the steam back to a fluid state. A fluid pump 2038 then pumps the fluid back in the steam generator 2014 via fluid conduit 2016 to repeat the process.

The processing module(s) 102 may be positioned along the fluid conduit 2016. The processing module(s) 102 may be thermally coupled to the fluid conduit 2016 in many different ways, including using the various methods and components illustrated herein. The processing module 102 may be used to preheat the fluid in the fluid conduit 2016, thereby improving the efficiency of the steam generator 2014 because the fluid entering from the fluid conduit 2016 will contain additional thermal energy. In some embodiments, the cooling tower 2036 may be used to capture additional heat rather than simply providing a cooling effect. The preheating provided by the processing module 102 may be transferred in different ways, including using a heat exchanger and/or directly sending heated dielectric fluid through the steam generator 2014 and/or turbine 2012.

It is understood that the various system components illustrated with respect to FIGS. 20A-20C may vary depending on the particular configuration and implementation of the power generation system. For example, gearboxes may or may not be present, different components and/or component couplings may be used for steam generation and/or cooling, components may be combined or further separated, and other modifications may be made. Accordingly, the implementation of the processing module(s) 102 may vary based on the particular configuration and/or implementation of the power generation system.

Referring specifically to FIG. 20A, the processing module(s) 102 may be placed in a "compute value" mode, which may use the overall power generation system as follows. In compute value mode, in order to generate a meaningful amount of heat contribution, the power generation system may be configured to send a majority of the generated power to the processing module 102 via transmission lines 2044. In this instance, the power may net a relatively small amount of electricity if sent to the grid. In other words, if the compute value is greater than the electricity value, some or all of the power generated by the power generation system may be routed to the processing module 102. This may provide a relatively inexpensive power source for the processing module 102, as the power is not passing through any middlemen and has the additive benefit of getting a "free" preheat of the working fluids in the fluid conduit 2016 by extracting the waste heat from the processing module(s) 102.

Referring specifically to FIG. 20B, the processing module 102 may be placed in a "grid value" mode. The grid value mode may be used when the grid has lucrative power needs and the provision of power to the grid is economically more valuable than using the power for computing. Referring specifically to FIG. 20C, it is understood that such power allocation may be partial, with some power being sent to the grid and some power used for the processing module(s) 102. A control system, such as may be provided by the management control system 802 of FIG. 8, may be used to determine the allocation of power between the grid and the processing module(s) 102.

The flow charts described herein illustrate various exemplary functions and operations that may occur within various environments. Accordingly, these flow charts are not exhaustive and that various steps may be excluded to clarify the aspect being described. For example, it is understood that some actions, such as network authentication processes, notifications, and handshakes, may have been performed prior to the first step of a flow chart. Such actions may depend on the particular type and configuration of communications engaged in by the system(s) used. Furthermore, other communication actions may occur between illustrated steps or simultaneously with illustrated steps.

Figure 21:
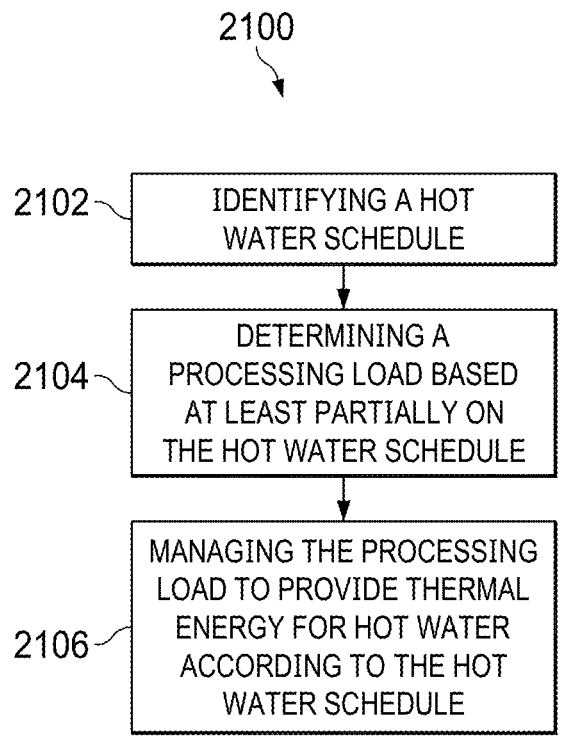
FIGS. 21-24 are flow charts illustrating embodiments of various processes that may be used by, or may be used to control, a processing module.

Referring to FIG. 21, one embodiment of a method 2100 is illustrated that may be executed by the management control system 802 using a controller such as the local controller 310 (FIGS. 3A-4D), local controller 642 (FIGS. 6D-6H), the compute system 502 of FIGS. 5A and 5B, and/or the remote monitor/controllers 1102 (FIG. 11A) and 1112 (FIG. 11B). Although the present example is directed to hot water, it is understood that FIG. 21 may be applied to any thermal energy use environment.

In step 2102, a hot water schedule is identified. The schedule may take many different factors into account and may be for a single processing module 102 or for multiple processing modules. In step 2104, a processing load may be determined based at least partially on the hot water schedule. In step 2106, the processing load is managed to provide thermal energy for the water by increasing and decreasing the processing load as needed.

Figure 22:
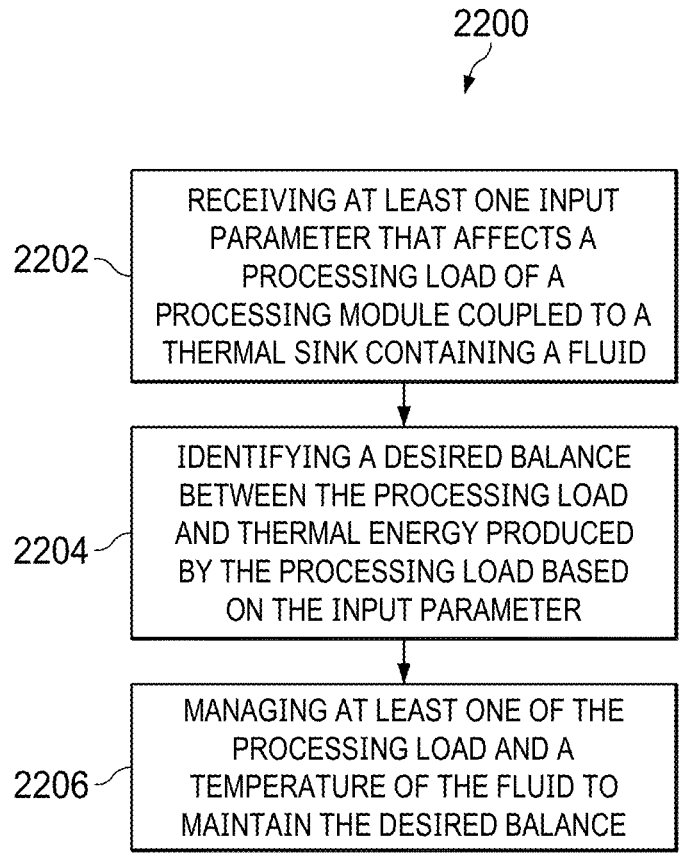

Referring to FIG. 22, one embodiment of a method 2200 is illustrated that may be executed by the management control system 802 using a controller such as the local controller 310 (FIGS. 3A-4D), local controller 642 (FIGS. 6D-6H), the compute system 502 of FIGS. 5A and 5B, and/or the remote monitor/controllers 1102 (FIG. 11A) and 1112 (FIG. 11B). In step 2202, at least one input parameter is received that affects a processing load of a processing module coupled to a thermal sink containing a fluid. In step 2204, a desired balance is identified between the processing load and thermal energy produced by the processing load based on the input parameter. In step 2206, at least one of the processing load and a temperature of the fluid is managed to maintain the desired balance.

Figure 23:
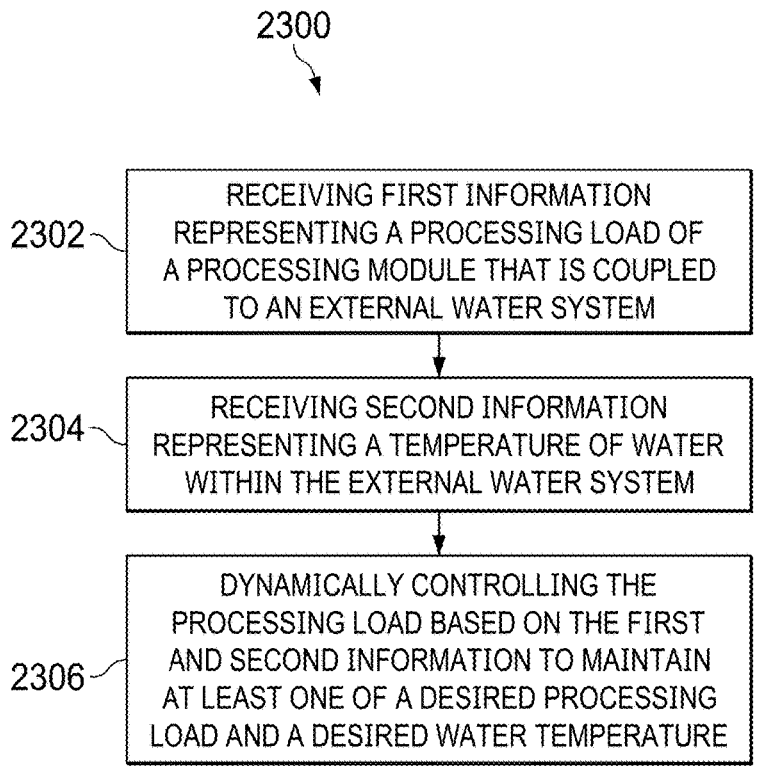

Referring to FIG. 23, one embodiment of a method 2300 is illustrated that may be executed by the management control system 802 using a controller such as the local controller 310 (FIGS. 3A-4D), local controller 642 (FIGS. 6D-6H), the compute system 502 of FIGS. 5A and 5B, and/or the remote monitor/controllers 1102 (FIG. 11A) and 1112 (FIG. 11B). In step 2302, first information representing a processing load of a processing module that is coupled to an external water system is received. In step 2304, second information representing a temperature of water within the external water system is received. In step 2306, the processing load is dynamically controlled based on the first and second information to maintain at least one of a desired processing load and a desired water temperature.

Figure 24:
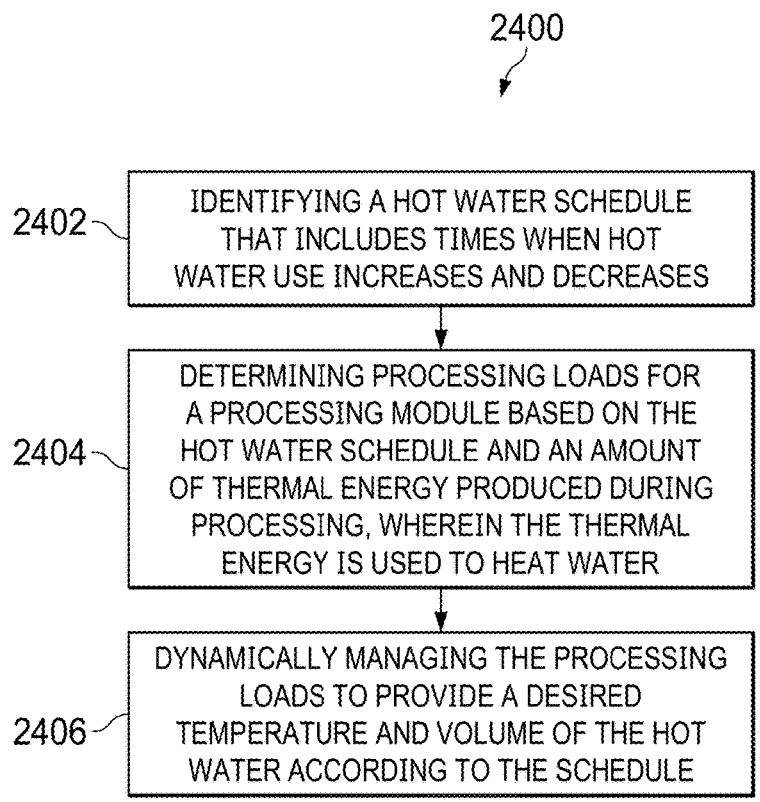

Referring to FIG. 24, one embodiment of a method 2400 is illustrated that may be executed by the management control system 802 using a controller such as the local controller 310 (FIGS. 3A-4D), local controller 642 (FIGS. 6D-6H), the compute system 502 of FIGS. 5A and 5B, and/or the remote monitor/controllers 1102 (FIG. 11A) and 1112 (FIG. 11B). In step 2402, a hot water schedule is identified that includes times when hot water use increases and decreases. In step 2404, processing loads are determined for a processing module based on the hot water schedule and an amount of thermal energy produced during processing, wherein the thermal energy is used to heat water. In step 2406, the processing loads are dynamically managed to provide a desired temperature and volume of the hot water according to the schedule.

Figure 25:
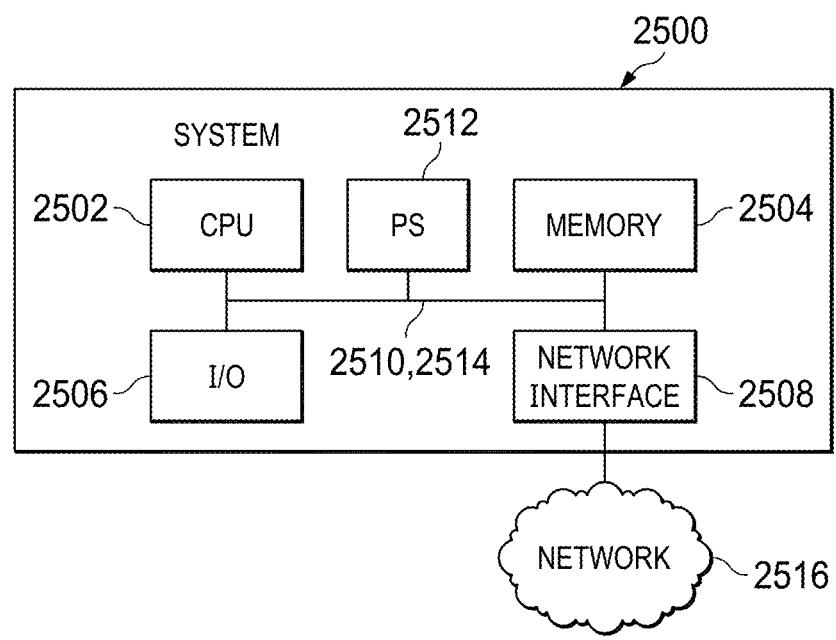
FIG. 25 is a simplified diagram of one embodiment of a computer system that may be used in embodiments of the present disclosure.

Referring to FIG. 25, one embodiment of a computer system 2500 is illustrated. The computer system 2500 is one possible example of a system component or computing device that may be used as part of the processing module 102 of FIGS. 1A-1C (e.g., the local controller 310/642 of FIGS. 3A-4D and FIGS. 6D-6H, respectively), the compute system 502 of FIGS. 5A and 5B, and/or the remote monitor/ controller 1102 and 1112 of FIGS. 11A and 11B, respectively. The computer system 2500 may include a controller (e.g., a central processing unit ("CPU")) 2502, a memory unit 2504, an input/output ("I/O") device 2506, and a network interface 2508. The components 2502, 2504, 2506, and 2508 are interconnected by a transport system (e.g., a bus) 2510. A power supply (PS) 2512 may provide power to components of the computer system 2500, such as the CPU 2502 and memory unit 2504, via a power line 2514 that may be combined with, or be separate from, the transport system 2510.

It is understood that the computer system 2500 may be differently configured and that each of the listed components may actually represent several different components. For example, the CPU 2502 may actually represent a multi-processor or a distributed processing system; the memory unit 2504 may include different levels of cache memory, main memory, hard disks, and remote storage locations; the I/O device 2506 may include monitors, keyboards, and the like; and the network interface 2508 may include one or more network cards providing one or more wired and/or wireless connections to a network 2516. Therefore, a wide range of flexibility is anticipated in the configuration of the computer system 2500.

The computer system 2500 may use any operating system (or multiple operating systems), including various versions of operating systems provided by Microsoft (such as WINDOWS), Apple (such as Mac OS X), UNIX, and LINUX, and may include operating systems specifically developed for handheld devices, personal computers, and servers depending on the use of the computer system 2500. The operating system, as well as other instructions (e.g., for the processes and message sequences described herein), may be stored in the memory unit 2504 and executed by the processor 2502. For example, if the computer system 2500 is the compute system 502 of FIGS. 5A and 5B, or the controller 310, 642, 1102, or 1112, the memory unit 2504 may include instructions for performing some or all of the methods described in the present disclosure, including those described with respect to the management control system 802 of FIG. 8.

The network 2516 may be a single network or may represent multiple networks, including networks of different types. For example, components within the active geothermal system 102 may be coupled to a network that includes a cellular link coupled to a data packet network, or data packet link such as a wide local area network (WLAN) coupled to a data packet network. Accordingly, many different network types and configurations may be used to establish communications between components within the processing module 102 and with other device and systems.

Exemplary network, system, and connection types include the internet, WiMax, local area networks (LANs) (e.g., IEEE 802.11a and 802.11g wi-fi networks), digital audio broadcasting systems (e.g., HD Radio, T-DMB and ISDB-TSB), terrestrial digital television systems (e.g., DVB-T, DVB-H, T-DMB and ISDB-T), WiMax wireless metropolitan area networks (MANs) (e.g., IEEE 802.16 networks), Mobile Broadband Wireless Access (MBWA) networks (e.g., IEEE 802.20 networks), Ultra Mobile Broadband (UMB) systems, Flash-OFDM cellular systems, and Ultra wideband (UWB) systems. Furthermore, the present disclosure may be used with communications systems such as Global System for Mobile communications (GSM) and/or code division multiple access (CDMA) communications systems. Connections to such networks may be wireless or may use a conduit (e.g., digital subscriber conduits (DSL), cable conduits, and fiber optic conduits).

Communication may be accomplished using predefined and publicly available (i.e., non-proprietary) communication standards or protocols (e.g., those defined by the Internet Engineering Task Force (IETF) or the International Telecommunications Union-Telecommunications Standard Sector (ITU-T)), and/or proprietary protocols. For example, signaling communications (e.g., session setup, management, and teardown) may use a protocol such as the Session Initiation Protocol (SIP), while data traffic may be communicated using a protocol such as the Real-time Transport Protocol (RTP), File Transfer Protocol (FTP), and/or Hyper-Text Transfer Protocol (HTTP). Communications may be connection-based (e.g., using a protocol such as the transmission control protocol/internet protocol (TCP/IP)) or connection-less (e.g., using a protocol such as the user datagram protocol (UDP)). It is understood that various types of communications may occur simultaneously.

While the preceding description shows and describes one or more embodiments, it will be understood by those skilled in the art that various changes in form and detail may be made therein without departing from the spirit and scope of the present disclosure. For example, various steps illustrated within a particular sequence diagram or flow chart may be combined or further divided. In addition, steps described in one diagram or flow chart may be incorporated into another diagram or flow chart. Furthermore, the described functionality may be provided by hardware and/or software, and may be distributed or combined into a single platform. Additionally, functionality described in a particular example may be achieved in a manner different than that illustrated, but is still encompassed within the present disclosure. Therefore, the claims should be interpreted in a broad manner, consistent with the present disclosure.

The invention claimed is:

1. A method for managing a processing load of a processing module and thermal energy produced by the processing load, the method comprising;
   identifying, by the processing module, a hot water profile, wherein the hot water profile includes information regarding usage of hot water from a hot water tank that serves as a sole heat sink for the thermal energy;
   determining, by the processing module, that it is economically desirable to increase the processing load based on at least one of an economic value generated by the processing load, a cost of energy needed to support the processing load, and an economic value of the thermal energy transferred to the hot water tank based on the hot water profile;

determining, by the processing module, whether a temperature differential between the processing module and the hot water tank is large enough to ensure that the hot water tank is able to absorb thermal energy that will be produced by increasing the processing load without overheating the processing module;

increasing, by the processing module, the processing load in response to the economic desirability only if the temperature differential is large enough to prevent the processing module from overheating;

monitoring whether a current temperature of the hot water in the hot water tank is approaching a maximum temperature threshold that defines a safe temperature for end use of the hot water; and dynamically modulating the processing load to prevent the current temperature from exceeding the maximum temperature threshold even if the temperature differential is sufficient to support increased processing.

2. The method of claim 1 wherein the processing load includes data received by the processing module from a distributed data processing system, and wherein the economic value generated by the processing load is based on the processing load's contribution to the distributed data processing system.

3. The method of claim 2 further comprising registering with the distributed data processing system for only specified types of data to exclude data that a user of the processing module does not desire to be processed by the processing module.

4. The method of claim 1 further comprising:
receiving an input from a remote controller that is configured to provide power grid management over a geographic area where the processing module is located, wherein the input instructs the processing module to limit the amount of energy used to support the processing load; and
reducing the processing load as needed to conform to the input.

5. The method of claim 1 further comprising controlling a circulation rate of a fluid used by a heat transfer system of the processing module to transfer the thermal energy to the hot water tank.

6. The method of claim 1 further comprising receiving an input parameter instructing the processing module to prioritize the processing load in order to maximize the economic value generated by the processing load.

7. The method of claim 1 further comprising:
determining from the hot water profile that hot water will be needed at a particular time; and
increasing the processing load to provide thermal energy to preheat water in the hot water tank when the cost of energy is lower.

8. A processing module configured to be coupled to a hot water tank that serves as a sole heat sink for thermal energy generated by a processing load managed by the processing module, the processing module comprising;
at least one processor;
at least one memory coupled to the processor;
a heat transfer system thermally coupled to the processor and configured to transfer the thermal energy generated by the processor to the hot water tank; and a controller configured to execute a plurality of instructions stored in the memory for managing the processing load, the plurality of instructions including instructions for:
identifying that it is economically desirable to increase the processing load based on at least one of an economic value generated by the processing load, a cost of energy needed to support the processing load, and an economic value of the thermal energy transferred to the hot water tank;
determining whether a temperature differential between the processing module and the hot water tank is large enough to ensure that the hot water tank is able to absorb thermal energy that will be produced by increasing the processing load without overheating the processing module;
increasing the processing load in response to the economic desirability only if the temperature differential is large enough to prevent the processing module from overheating, wherein the processing load is increased even if hot water in the hot water tank will be heated beyond the desired temperature;
monitoring whether a current temperature of the hot water in the hot water tank is approaching a maximum temperature threshold that defines a safe temperature for end use of the hot water; and
dynamically modulating the processing load to prevent the current temperature from exceeding the maximum temperature threshold even if the temperature differential is sufficient to support increased processing.

9. The processing module of claim 8 wherein the processor is submerged in a dielectric fluid and wherein the heat transfer system circulates the dielectric fluid to transfer the thermal energy from the dielectric fluid to the hot water tank.

10. The processing module of claim 8 wherein the heat transfer system uses a heat exchanger to transfer the thermal energy from the processor to the hot water tank.

11. The processing module of claim 8 wherein the heat transfer system uses a heat pump to transfer the thermal energy from the processor to the hot water tank.

12. The processing module of claim 8 wherein the heat transfer system circulates a fluid through a fluid conduit that is in contact with the hot water tank to transfer the thermal energy from the processor to the hot water tank.

13. The processing module of claim 8 further comprising a pump, wherein the instructions further include instructions for controlling the pump to modify a circulation rate of a fluid used by the heat transfer system to transfer the thermal energy to the hot water tank.

14. The processing module of claim 8 wherein the instructions further include instructions for controlling a valve to mix cooler water with water heated by the thermal energy to increase the temperature differential.

15. The processing module of claim 8 wherein the instructions further include instructions for identifying a hot water profile, wherein the hot water profile includes information regarding usage of hot water from the hot water tank and affects the economic value of the thermal energy transferred to the hot water tank.

16. The processing module of claim 8 wherein the processor is the controller and executes the plurality of instructions.

17. The processing module of claim 8 wherein the controller is a local controller that is coupled to a remote controller that is configured to provide power grid management over a geographic area where the processing module is located, and wherein the controller is configured to comply with control instructions received from the remote controller.

\* \* \* \* \*